(12) United States Patent
Yanagisawa et al.

(10) Patent No.: US 12,300,484 B2
(45) Date of Patent: May 13, 2025

(54) SEMICONDUCTOR DEVICE AND METHOD FOR MANUFACTURING SEMICONDUCTOR DEVICE

(71) Applicant: Semiconductor Energy Laboratory Co., Ltd., Atsugi (JP)

(72) Inventors: Yuichi Yanagisawa, Atsugi (JP); Hiromi Sawai, Atsugi (JP); Daisuke Matsubayashi, Yokohama (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 570 days.

(21) Appl. No.: 17/436,752

(22) PCT Filed: Mar. 30, 2020

(86) PCT No.: PCT/IB2020/052986
§ 371 (c)(1),
(2) Date: Sep. 7, 2021

(87) PCT Pub. No.: WO2020/208457
PCT Pub. Date: Oct. 15, 2020

(65) Prior Publication Data
US 2022/0189766 A1    Jun. 16, 2022

(30) Foreign Application Priority Data

Apr. 10, 2019  (JP) ................. 2019-074781

(51) Int. Cl.
*H10B 43/27* (2023.01)
*H01L 21/02* (2006.01)
*H01L 21/3213* (2006.01)

(52) U.S. Cl.
CPC .. *H01L 21/02129* (2013.01); *H01L 21/32133* (2013.01); *H10B 43/27* (2023.02)

(58) Field of Classification Search
CPC .......... H01L 29/78648; H01L 29/7869; H01L 21/02129; H01L 21/02323;
(Continued)

(56) References Cited

U.S. PATENT DOCUMENTS 11,056,491 B2  7/2021  Yamazaki et al.
11,101,300 B2  8/2021  Onuki et al.
(Continued)

FOREIGN PATENT DOCUMENTS

JP  2012-257187 A  12/2012
JP  2017-050530 A  3/2017
(Continued)

OTHER PUBLICATIONS

International Search Report (Application No. PCT/IB2020/052986) Dated Jul. 14, 2020.
(Continued)

*Primary Examiner* — Didarul A Mazumder
(74) *Attorney, Agent, or Firm* — Eric J. Robinson; Robinson Intellectual Property Law Office, P.C.

(57) ABSTRACT

A semiconductor device that can be miniaturized or highly integrated is provided. The semiconductor device includes a first oxide, an insulator over the first oxide, a first conductor over the insulator, a second conductor electrically connected to the first oxide, and a second oxide provided between the first oxide and the second conductor, and the contact area between the second oxide and the second conductor is larger than the contact area between the second oxide and the first oxide.

12 Claims, 32 Drawing Sheets

(58) Field of Classification Search
CPC ........... H01L 21/02337; H01L 21/0234; H01L 21/32133; H01L 21/8258; H01L 27/0688; H01L 27/088; H01L 29/42324; H01L 29/0649; H01L 29/42356; H01L 29/42364; H01L 29/4236; H01L 29/78; H01L 29/0847; H01L 29/41725; H01L 29/41791; H01L 29/7839; H01L 29/806; H01L 29/66; H01L 27/1225; H01L 29/51; H01L 29/78696; H01L 29/66969; H01L 29/78618; H01L 21/0228; H01L 29/786; H01L 29/517; H01L 29/7781; H01L 29/24; H01L 29/7782; H10B 43/27; H10B 12/05; H10B 12/315; H10B 12/50
See application file for complete search history.

(56) References Cited

U.S. PATENT DOCUMENTS

| | | | |
|---|---|---|---|
| 11,101,386 | B2 | 8/2021 | Yamazaki et al. |
| 2016/0240684 | A1* | 8/2016 | Yamazaki ........... H01L 27/1225 |
| 2016/0260822 | A1* | 9/2016 | Okamoto ................ H01L 29/24 |
| 2017/0012139 | A1* | 1/2017 | Sasagawa ......... H01L 29/78618 |
| 2017/0309732 | A1* | 10/2017 | Yamazaki ........... H01L 27/1207 |
| 2018/0166392 | A1* | 6/2018 | Yamazaki ........... H01L 27/0688 |
| 2018/0166578 | A1* | 6/2018 | Yamazaki ........... H01L 29/7869 |
| 2019/0348537 | A1* | 11/2019 | Yamazaki ......... H01L 29/78648 |
| 2020/0185386 | A1 | 6/2020 | Yamazaki et al. |
| 2020/0227561 | A1* | 7/2020 | Yamazaki ............... H01L 29/24 |

FOREIGN PATENT DOCUMENTS

| | | | |
|---|---|---|---|
| JP | 2018-195814 A | 12/2018 | |
| JP | 2018-206841 A | 12/2018 | |
| JP | 2019-029666 A | 2/2019 | |
| JP | 2019-033253 A | 2/2019 | |
| KR | 2020-0018504 A | 2/2020 | |
| TW | 201901971 | 1/2019 | |
| TW | 201911478 | 3/2019 | |
| TW | 201911584 | 3/2019 | |
| WO | WO-2018122659 A1 * | 7/2018 | ......... H01L 27/1052 |
| WO | WO-2018/207048 | 11/2018 | |
| WO | WO-2018207048 A1 * | 11/2018 | ......... H01L 27/1225 |
| WO | WO-2019/003047 | 1/2019 | |
| WO | WO-2019/021098 | 1/2019 | |
| WO | WO-2019/025912 | 2/2019 | |

OTHER PUBLICATIONS

Written Opinion (Application No. PCT/IB2020/052986) Dated Jul. 14, 2020.

* cited by examiner

SEMICONDUCTOR DEVICE AND METHOD FOR MANUFACTURING SEMICONDUCTOR DEVICE

TECHNICAL FIELD

One embodiment of the present invention relates to a semiconductor device and a method for manufacturing the semiconductor device. Alternatively, one embodiment of the present invention relates to a semiconductor wafer, a module, and an electronic device.

In this specification and the like, a semiconductor device generally means a device that can function by utilizing semiconductor characteristics. A semiconductor element such as a transistor, a semiconductor circuit, an arithmetic device, and a memory device are each an embodiment of a semiconductor device. It can be sometimes said that a display device (a liquid crystal display device, a light-emitting display device, and the like), a projection device, a lighting device, an electro-optical device, a power storage device, a memory device, a semiconductor circuit, an imaging device, an electronic device, and the like include a semiconductor device.

Note that one embodiment of the present invention is not limited to the above technical field. One embodiment of the invention disclosed in this specification and the like relates to an object, a method, or a manufacturing method. One embodiment of the present invention relates to a process, a machine, manufacture, or a composition of matter.

BACKGROUND ART

In recent years, semiconductor devices have been developed to be used for an LSI, a CPU, a memory, and the like. A CPU is an aggregation of semiconductor elements in which an electrode which is a connection terminal is formed, which includes a semiconductor integrated circuit (including at least a transistor and a memory) separated from a semiconductor wafer.

A semiconductor circuit (IC chip) of an LSI, a CPU, a memory, or the like is mounted on a circuit board, for example, a printed wiring board, to be used as one of components of a variety of electronic devices.

A technique by which a transistor is formed using a semiconductor thin film formed over a substrate having an insulating surface has been attracting attention. The transistor is applied to a wide range of electronic devices such as an integrated circuit (IC) or an image display device (also simply referred to as a display device). A silicon-based semiconductor material is widely known as a semiconductor thin film applicable to the transistor; in addition, an oxide semiconductor has been attracting attention as another material.

It is known that a transistor using an oxide semiconductor has an extremely low leakage current in a non-conduction state. For example, a low-power-consumption CPU utilizing a characteristic of a low leakage current of the transistor using an oxide semiconductor is disclosed (see Patent Document 1).

Furthermore, a method for manufacturing a transistor using an oxide semiconductor in which a gate electrode is formed to be embedded in an opening portion is disclosed (see Patent Document 2).

In recent years, demand for an integrated circuit in which transistors and the like are integrated with high density has risen with reductions in the size and weight of an electronic device. Furthermore, the productivity of a semiconductor device including an integrated circuit is required to be improved.

REFERENCE

Patent Document

[Patent Document 1] Japanese Published Patent Application No. 2012-257187
[Patent Document 2] Japanese Published Patent Application No. 2017-050530

SUMMARY OF THE INVENTION

Problems to be Solved by the Invention

An object of one embodiment of the present invention is to provide a semiconductor device that can be miniaturized or highly integrated. An object of one embodiment of the present invention is to provide a semiconductor device having favorable electrical characteristics. An object of one embodiment of the present invention is to provide a semiconductor device having favorable frequency characteristics. An object of one embodiment of the present invention is to provide a semiconductor device with high reliability. An object of one embodiment of the present invention is to provide a semiconductor device with high productivity.

An object of one embodiment of the present invention is to provide a semiconductor device capable of retaining data for a long time. An object of one embodiment of the present invention is to provide a semiconductor device capable of high-speed data writing. An object of one embodiment of the present invention is to provide a semiconductor device with high design flexibility. An object of one embodiment of the present invention is to provide a semiconductor device in which power consumption can be reduced. An object of one embodiment of the present invention is to provide a novel semiconductor device.

Note that the description of these objects does not preclude the existence of other objects. One embodiment of the present invention does not have to achieve all these objects. Other objects are apparent from and can be derived from the description of the specification, the drawings, the claims, and the like.

Means for Solving the Problems

One embodiment of the present invention is a semiconductor device including a first oxide, an insulator over the first oxide, a first conductor over the insulator, a second conductor electrically connected to the first oxide, and a second oxide provided between the first oxide and the second conductor, in which a contact area between the second oxide and the second conductor is larger than a contact area between the second oxide and the first oxide.

One embodiment of the present invention is a semiconductor device including a first oxide including a concave portion, a first insulator over the first oxide, a first conductor over the first insulator, a second insulator over the first insulator and the first conductor, a second conductor electrically connected to the first oxide, and a second oxide provided between the first insulator and the second conductor, in which the first insulator, the first conductor, and the second insulator are provided in the concave portion, and the second oxide includes a region overlapping with the second insulator.

In the above, the first oxide preferably contains indium, an element M (M is aluminum, gallium, yttrium, or tin), and zinc.

In the above, the second oxide preferably contains indium, an element M (M is aluminum, gallium, yttrium, or tin), and zinc.

In the above, the second oxide preferably contains the same material as the first oxide.

In the above, the second oxide is preferably in contact with a bottom surface and a side surface of the second conductor.

In the above, the second conductor is preferably provided above the first conductor.

In the above, the semiconductor device may include an interlayer film over the first oxide, in which case it is preferable that the interlayer film include an opening, the second oxide and the second conductor be provided in the opening, and a contact area between the second oxide and the second conductor be larger than an area of the opening.

In the above, the semiconductor device may include a capacitor, in which case it is preferable that the capacitor be electrically connected to the second conductor.

Effect of the Invention

According to one embodiment of the present invention, a semiconductor device that can be miniaturized or highly integrated can be provided. According to one embodiment of the present invention, a semiconductor device with favorable electrical characteristics can be provided. According to one embodiment of the present invention, a semiconductor device having favorable frequency characteristics can be provided. According to one embodiment of the present invention, a semiconductor device having favorable reliability can be provided. According to one embodiment of the present invention, a semiconductor device with high productivity can be provided.

A semiconductor device capable of retaining data for a long time can be provided. A semiconductor device capable of high-speed data writing can be provided. A semiconductor device having high design flexibility can be provided. A semiconductor device in which power consumption can be reduced can be provided. A novel semiconductor device can be provided.

Note that the description of these effects does not preclude the existence of other effects. One embodiment of the present invention does not have to have all these effects. Note that effects other than these will be apparent from the description of the specification, the drawings, the claims, and the like and effects other than these can be derived from the description of the specification, the drawings, the claims, and the like.

MODE FOR CARRYING OUT THE INVENTION

Figure 1A:
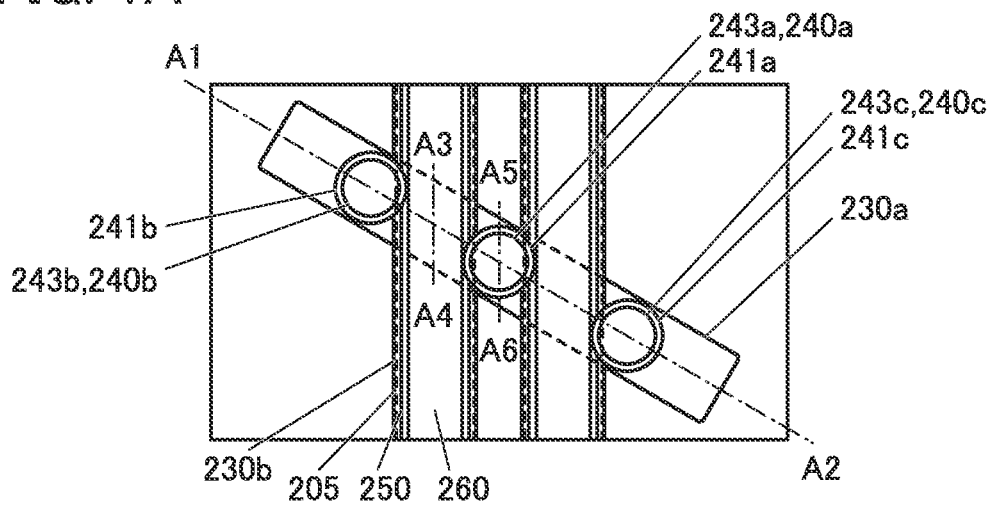
FIG. 1A is a top view of a semiconductor device of one embodiment of the present invention.

Hereinafter, embodiments will be described with reference to the drawings. Note that the embodiments can be implemented with many different modes, and it is readily understood by those skilled in the art that modes and details thereof can be changed in various ways without departing from the spirit and scope thereof. Thus, the present invention should not be interpreted as being limited to the description of the embodiments below.

In the drawings, the size, the layer thickness, or the region is exaggerated for clarity in some cases. Therefore, they are not limited to the illustrated scale. Note that the drawings schematically illustrate ideal examples, and embodiments of the present invention are not limited to shapes, values, and the like shown in the drawings. For example, in an actual manufacturing process, a layer, a resist mask, or the like might be unintentionally reduced in size by treatment such as etching, which might not be reflected in the drawings for easy understanding. Furthermore, in the drawings, the same reference numerals are used in common for the same portions or portions having similar functions in different drawings, and repeated description thereof is omitted in some cases. Furthermore, the same hatch pattern is used for the portions having similar functions, and the portions are not especially denoted by reference numerals in some cases.

Furthermore, especially in a top view (also referred to as a "plan view"), a perspective view, or the like, the description of some components might be omitted for easy understanding of the invention. In addition, some hidden lines and the like might not be shown.

The ordinal numbers such as "first" and "second" in this specification and the like are used for convenience and do not denote the order of steps or the stacking order of layers. Therefore, for example, the term "first" can be replaced with the term "second", "third", or the like as appropriate. In addition, the ordinal numbers in this specification and the like do not sometimes correspond to the ordinal numbers that are used to specify one embodiment of the present invention.

In this specification and the like, terms for describing arrangement, such as "over" and "below", are used for convenience to describe the positional relation between components with reference to drawings. The positional relation between components is changed as appropriate in accordance with a direction in which the components are described. Thus, without limitation to terms described in this specification, the description can be changed appropriately depending on the situation.

When this specification and the like explicitly state that X and Y are connected, for example, the case where X and Y are electrically connected, the case where X and Y are functionally connected, and the case where X and Y are directly connected are regarded as being disclosed in this specification and the like. Accordingly, without being limited to a predetermined connection relation, for example, a connection relation shown in drawings or text, a connection relation other than one shown in drawings or text is regarded as being disclosed in the drawings or the text.

Here, X and Y each denote an object (e.g., a device, an element, a circuit, a wiring, an electrode, a terminal, a conductive film, or a layer).

Furthermore, functions of a source and a drain might be switched when a transistor of opposite polarity is employed or a direction of current flow is changed in circuit operation, for example. Therefore, the terms "source" and "drain" can sometimes be interchanged with each other in this specification and the like.

Note that in this specification and the like, depending on transistor structures, a channel length in a region where a channel is actually formed (hereinafter also referred to as an "effective channel length") is different from a channel length shown in a top view of a transistor (hereinafter also referred to as an "apparent channel length") in some cases. In the case where a semiconductor includes a concave portion and a gate electrode is provided to be embedded in the concave portion, for example, the effective channel length may be larger than the apparent channel length, and its influence cannot be ignored in some cases. For example, in a miniaturized transistor in which a semiconductor covers a side surface of a gate electrode, the proportion of a channel formation region formed on the side surface of the gate electrode is high in some cases. In that case, the effective channel length is larger than the apparent channel length.

In such a case, an effective channel length is sometimes difficult to estimate by actual measurement. For example, estimation of an effective channel length from a design value requires assumption that the shape of a semiconductor is known. Accordingly, in the case where the shape of a semiconductor is not known accurately, it is difficult to measure an effective channel length accurately.

Note that in this specification and the like, depending on transistor structures, a channel width in a region where a channel is actually formed (hereinafter, referred to as an "effective channel width") is different from a channel width shown in a top view of a transistor (hereinafter, referred to as an "apparent channel width") in some cases. For example, in a transistor whose gate electrode covers a side surface of a semiconductor, the effective channel width is larger than the apparent channel width, and its influence cannot be ignored in some cases. For example, in a miniaturized transistor whose gate electrode covers a side surface of a semiconductor, the proportion of a channel formation region formed in the side surface of the semiconductor is increased in some cases. In that case, the effective channel width is larger than the apparent channel width.

In such a case, the effective channel width is sometimes difficult to estimate by actual measurement. For example, estimation of an effective channel width from a design value requires assumption that the shape of a semiconductor is known. Accordingly, in the case where the shape of a semiconductor is not known accurately, it is difficult to measure the effective channel width accurately.

Furthermore, in this specification, the simple term "channel width" refers to an apparent channel width in some cases. Alternatively, in this specification, the simple term "channel width" refers to an effective channel width in some cases. Note that the values of a channel length, a channel width, an effective channel width, an apparent channel width, and the like can be determined, for example, by analyzing a cross-sectional TEM image and the like.

Note that impurities in a semiconductor refer to, for example, elements other than the main components of a semiconductor. For example, an element with a concentration lower than 0.1 atomic % can be regarded as an impurity. When an impurity is contained, for example, DOS (Density of States) in a semiconductor may be increased or the crystallinity may be decreased. In the case where the semiconductor is an oxide semiconductor, examples of an impurity that changes characteristics of the semiconductor include Group 1 elements, Group 2 elements, Group 13 elements, Group 14 elements, Group 15 elements, and transition metals other than the main components of the oxide semiconductor; hydrogen, lithium, sodium, silicon, boron, phosphorus, carbon, and nitrogen are given as examples. In the case of an oxide semiconductor, water also serves as an impurity in some cases. Also in the case of an oxide semiconductor, oxygen vacancies are formed in some cases by entry of impurities, for example. Furthermore, when the semiconductor is silicon, examples of an impurity that changes characteristics of the semiconductor include oxygen, Group 1 elements except hydrogen, Group 2 elements, Group 13 elements, and Group 15 elements.

Note that in this specification and the like, silicon oxynitride is a material that contains more oxygen than nitrogen in its composition. Moreover, silicon nitride oxide is a material that contains more nitrogen than oxygen in its composition.

In this specification and the like, "parallel" indicates a state where two straight lines are placed at an angle greater than or equal to −10° and less than or equal to 10°. Accordingly, the case where the angle is greater than or equal to −5° and less than or equal to 5° is also included. Furthermore, "substantially parallel" indicates a state where two straight lines are placed at an angle greater than or equal to −30° and less than or equal to 30°. Moreover, "perpendicular" or "orthogonal" indicates a state where two straight lines are placed at an angle greater than or equal to 80° and less than or equal to 100°. Accordingly, the case where the angle is greater than or equal to 85° and less than or equal to 95° is also included. Moreover, "substantially perpendicular" or "substantially orthogonal" indicates a state where two straight lines are placed at an angle greater than or equal to 60° and less than or equal to 120°.

Note that in this specification, "having a barrier property" means having a function of inhibiting passage of oxygen and impurities such as hydrogen, and an insulating film having a barrier property is referred to as an insulating barrier film, a barrier insulating film, or a barrier insulator in some cases. A conductive film having a barrier property is referred to as a conductive barrier film in some cases.

In this specification and the like, a metal oxide is an oxide of metal in a broad sense. Metal oxides are classified into an oxide insulator, an oxide conductor (including a transparent oxide conductor), an oxide semiconductor (also simply referred to as an OS), and the like. For example, in the case where a metal oxide is used in a semiconductor layer of a transistor, the metal oxide is referred to as an oxide semiconductor in some cases. That is, an OS FET or an OS transistor can also be referred to as a transistor including an oxide or an oxide semiconductor.

In this specification and the like, "normally off" means that a current per micrometer of channel width that flows through a transistor when no potential or a ground potential is supplied to its gate is lower than or equal to $1\times10^{-20}$ A at room temperature, lower than or equal to $1\times10^{-18}$ A at 85° C., or lower than or equal to $1\times10^{-16}$ A at 125° C.

Embodiment 1

Examples of semiconductor devices each including a transistor 200 of one embodiment of the present invention are described below.

<Structure Example of Semiconductor Device>

FIG. 1A to FIG. 1D are a top view and cross-sectional views of a semiconductor device of one embodiment of the present invention and the periphery of the semiconductor device.

Figure 1B:
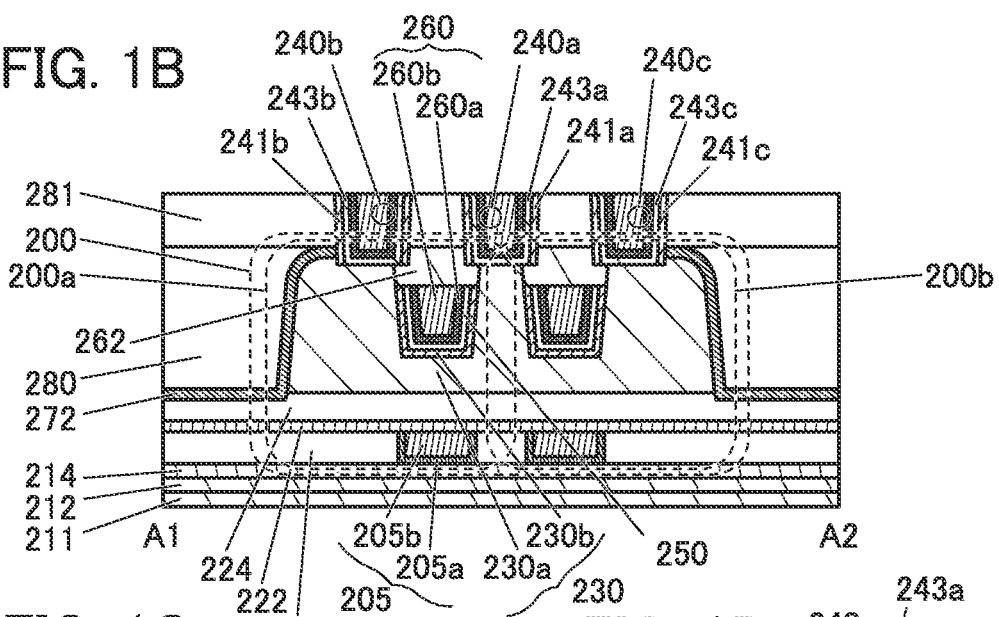
FIG. 1B to FIG. 1D are cross-sectional views of the semiconductor device of one embodiment of the present invention.
Figure 1C:
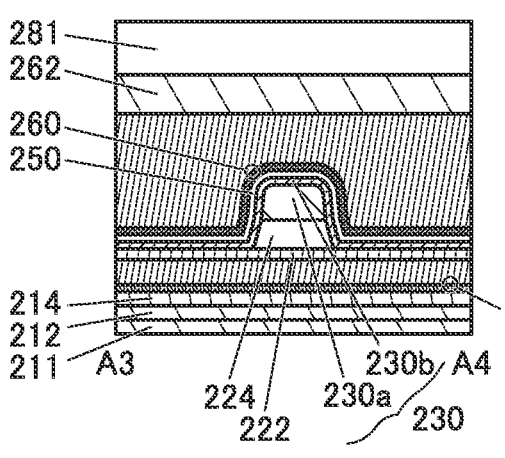
Figure 1D:
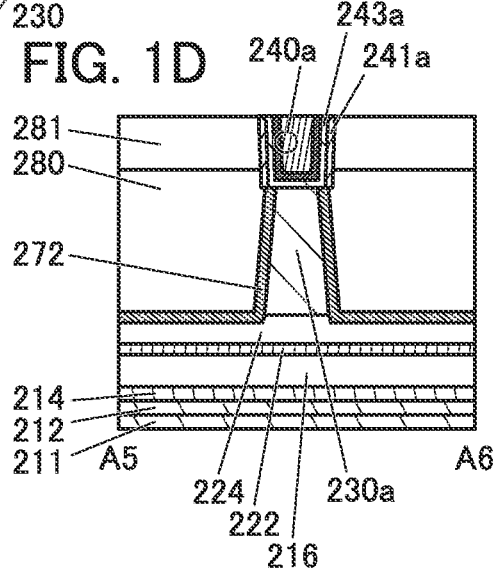
Figure 2A:
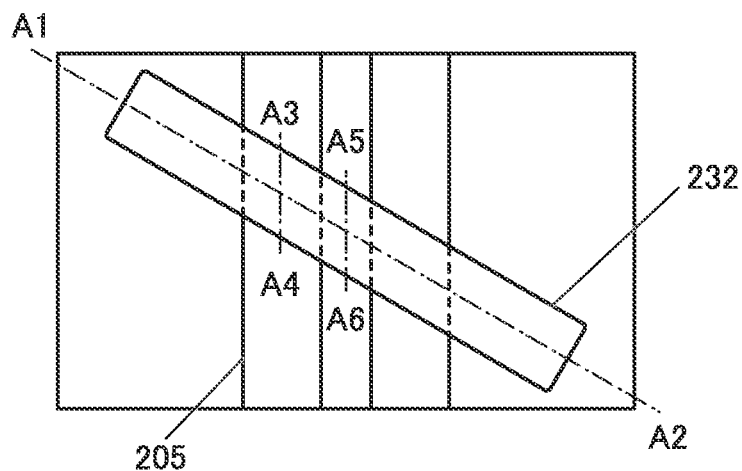
FIG. 2A is a top view showing a method for manufacturing a semiconductor device of one embodiment of the present invention.
Figure 2B:
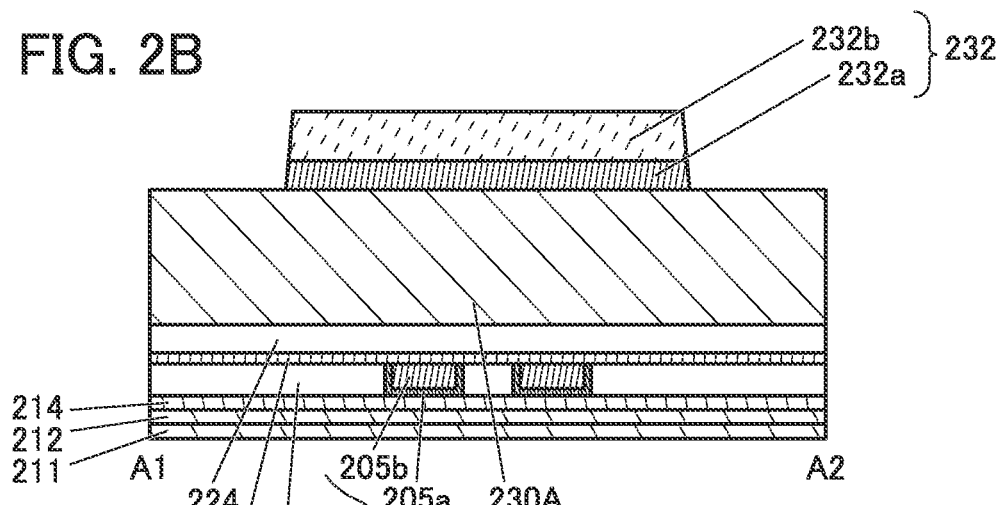
FIG. 2B to FIG. 2D are cross-sectional views showing a method for manufacturing the semiconductor device of one embodiment of the present invention.
Figure 2C:
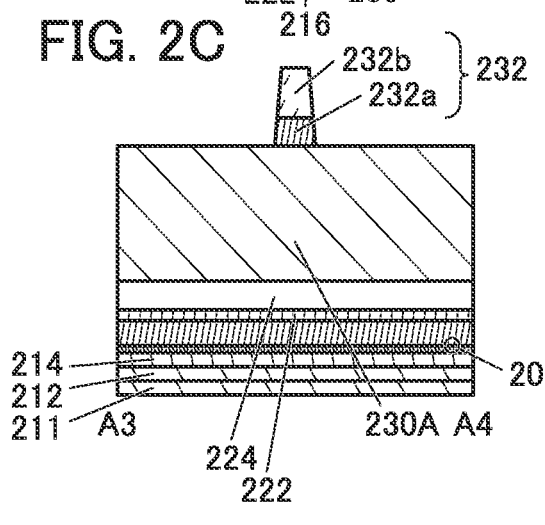
Figure 2D:
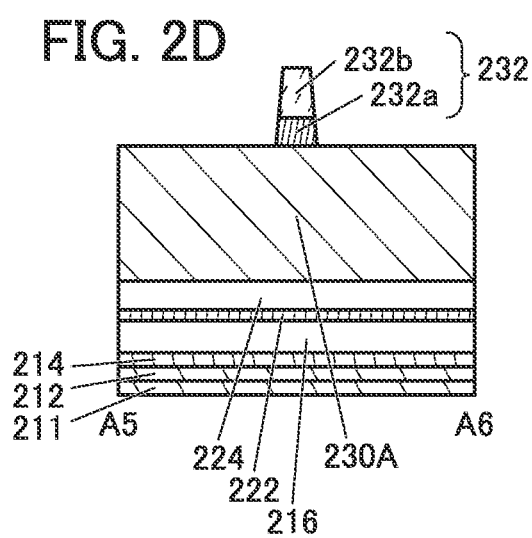
Figure 3A:
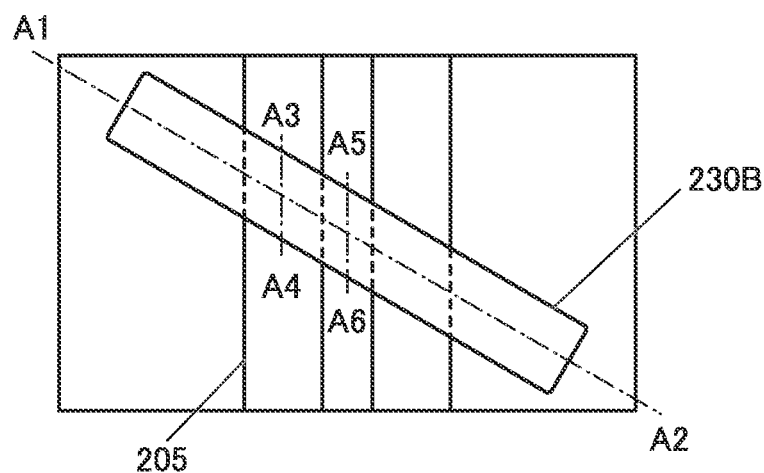
FIG. 3A is a top view showing a method for manufacturing a semiconductor device of one embodiment of the present invention.
Figure 3B:
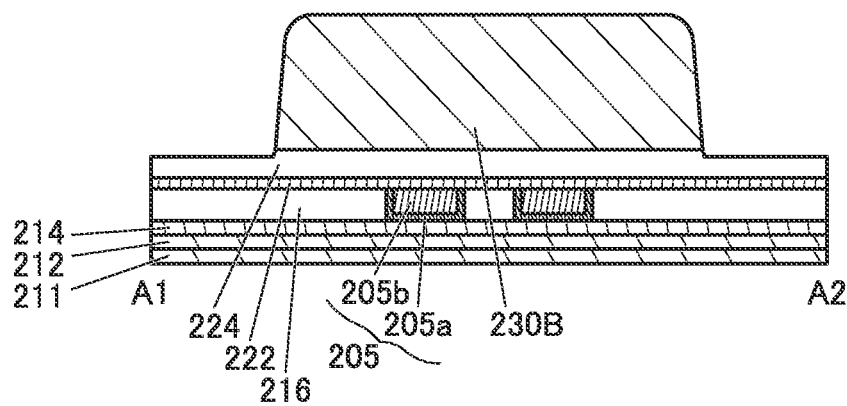
FIG. 3B to FIG. 3D are cross-sectional views showing a method for manufacturing the semiconductor device of one embodiment of the present invention.
Figure 3C:
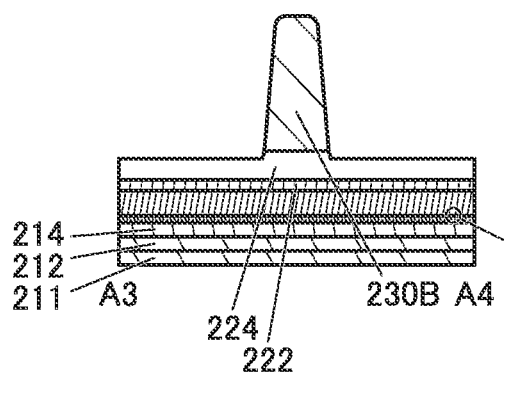
Figure 3D:
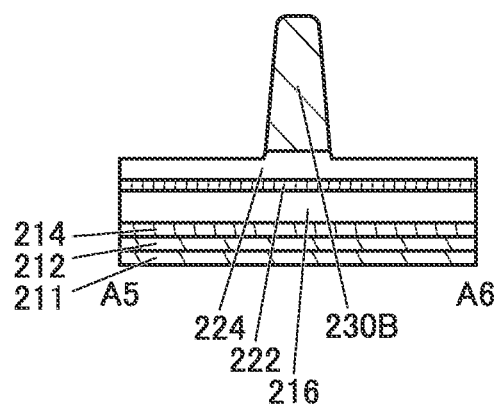
Figure 4A:
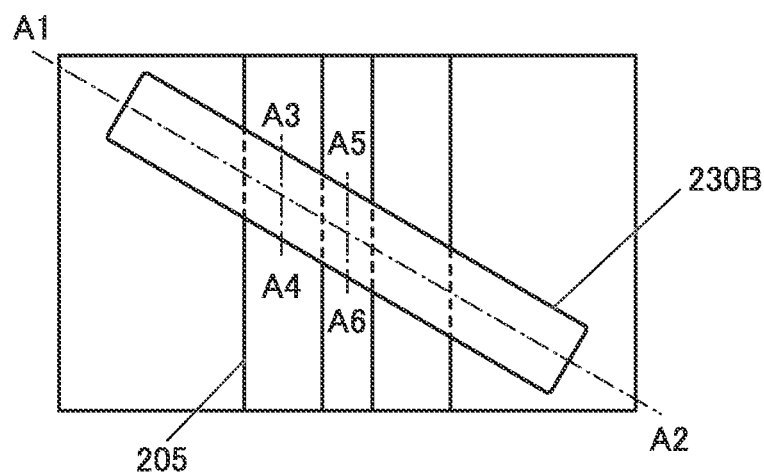
FIG. 4A is a top view showing a method for manufacturing a semiconductor device of one embodiment of the present invention.
Figure 4B:
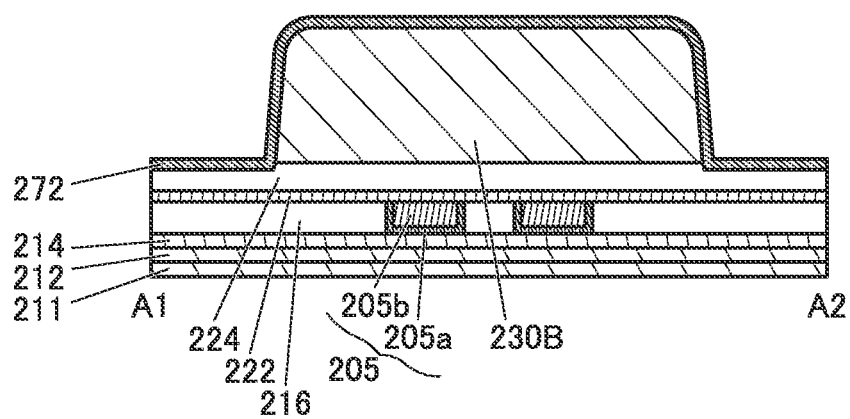
FIG. 4B to FIG. 4D are cross-sectional views showing a method for manufacturing the semiconductor device of one embodiment of the present invention.
Figure 4C:
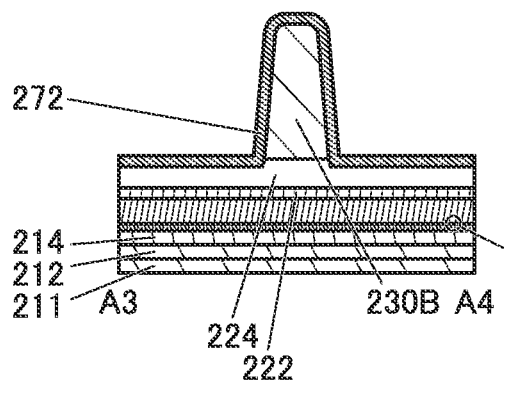
Figure 4D:
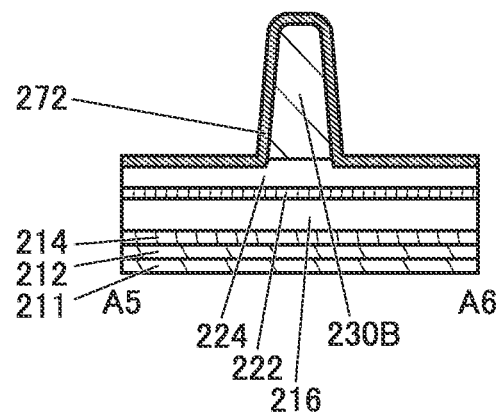
Figure 5A:
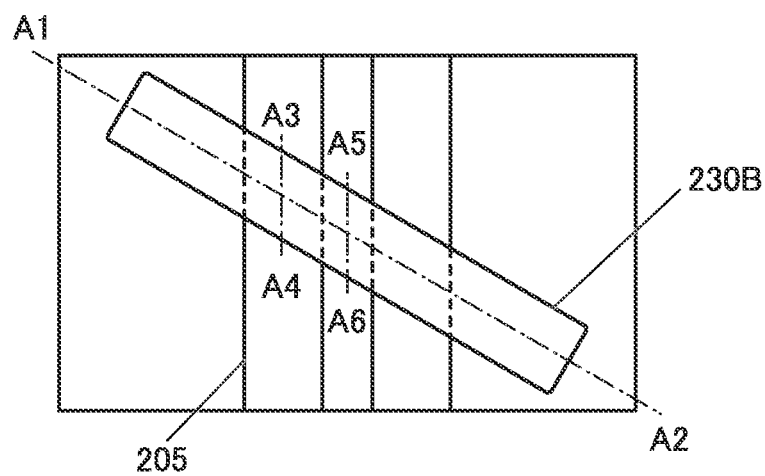
FIG. 5A is a top view showing a method for manufacturing a semiconductor device of one embodiment of the present invention.
Figure 5B:
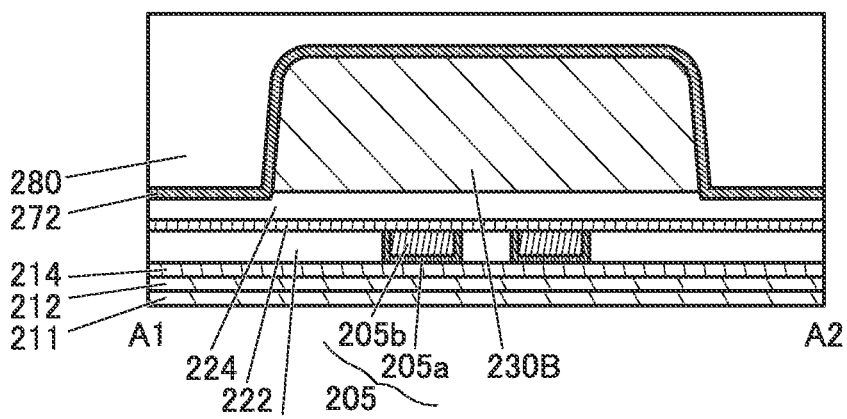
FIG. 5B to FIG. 5D are cross-sectional views showing a method for manufacturing the semiconductor device of one embodiment of the present invention.
Figure 5C:
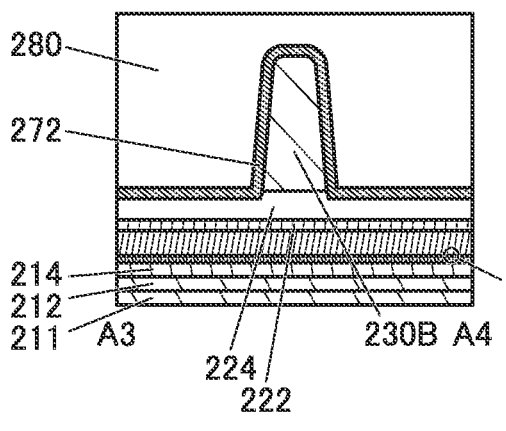
Figure 5D:
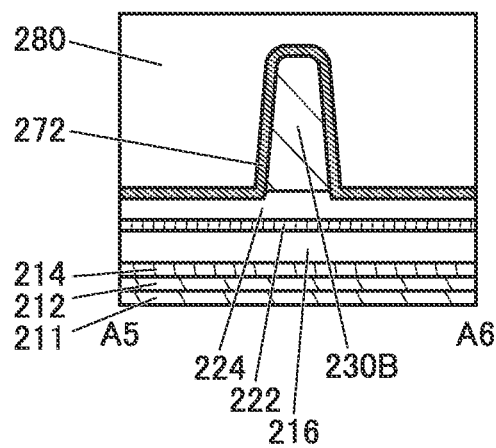
Figure 6A:
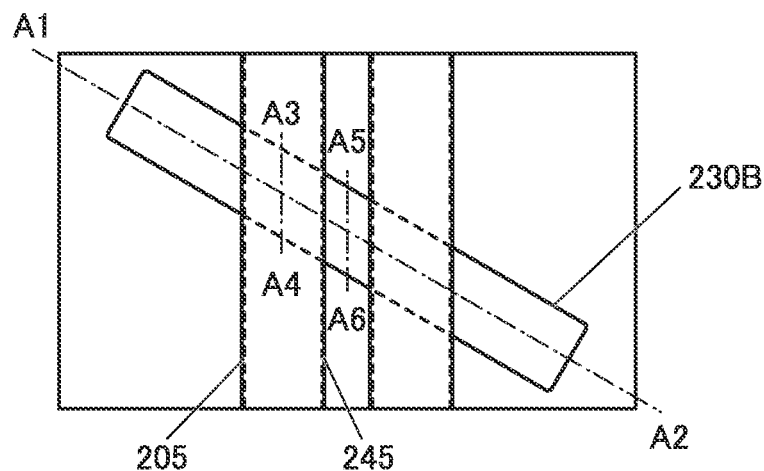
FIG. 6A is a top view showing a method for manufacturing a semiconductor device of one embodiment of the present invention.
Figure 6B:
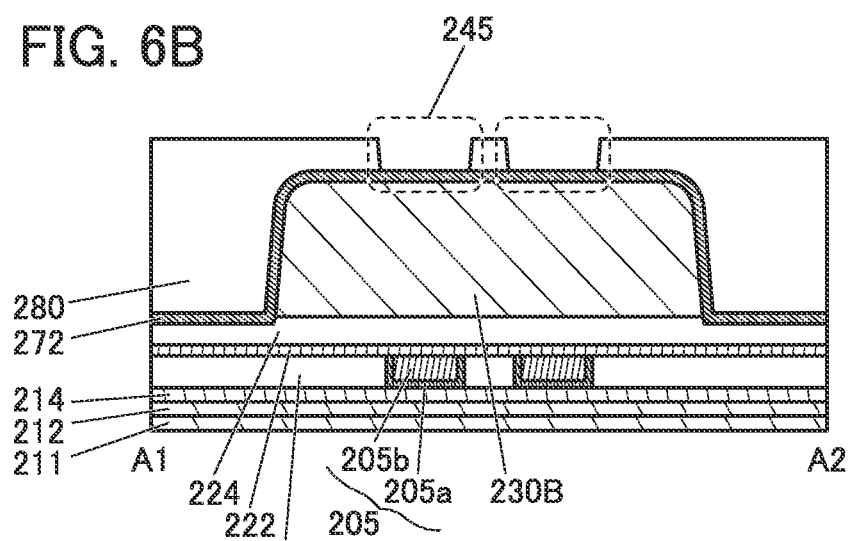
FIG. 6B to FIG. 6D are cross-sectional views showing a method for manufacturing the semiconductor device of one embodiment of the present invention.
Figure 6C:
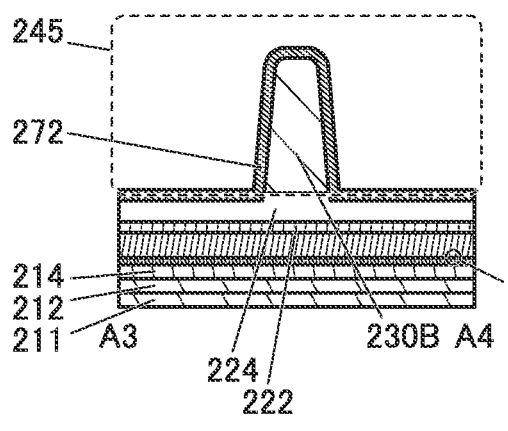
Figure 6D:
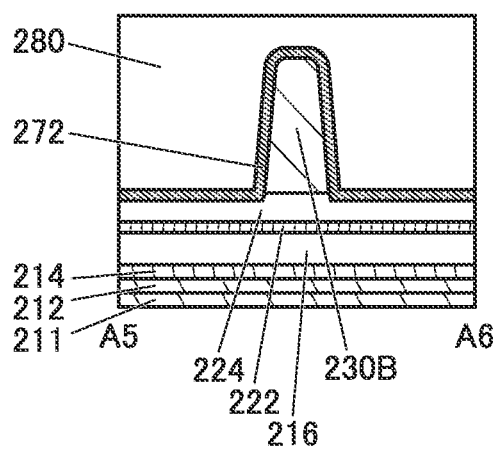
Figure 7A:
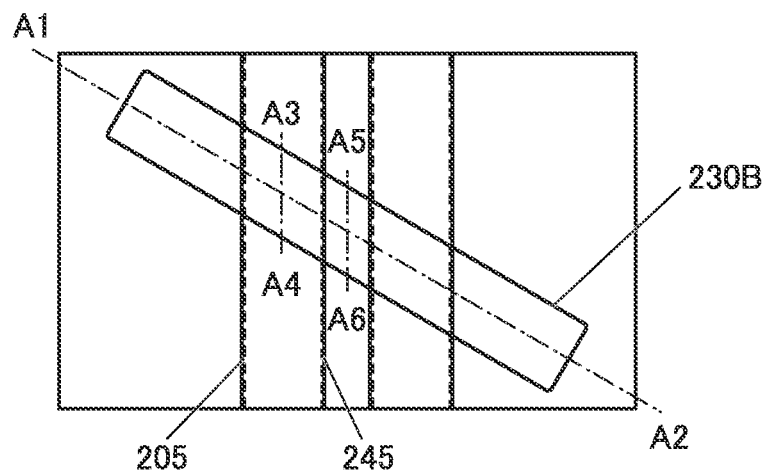
FIG. 7A is a top view showing a method for manufacturing a semiconductor device of one embodiment of the present invention.
Figure 7B:
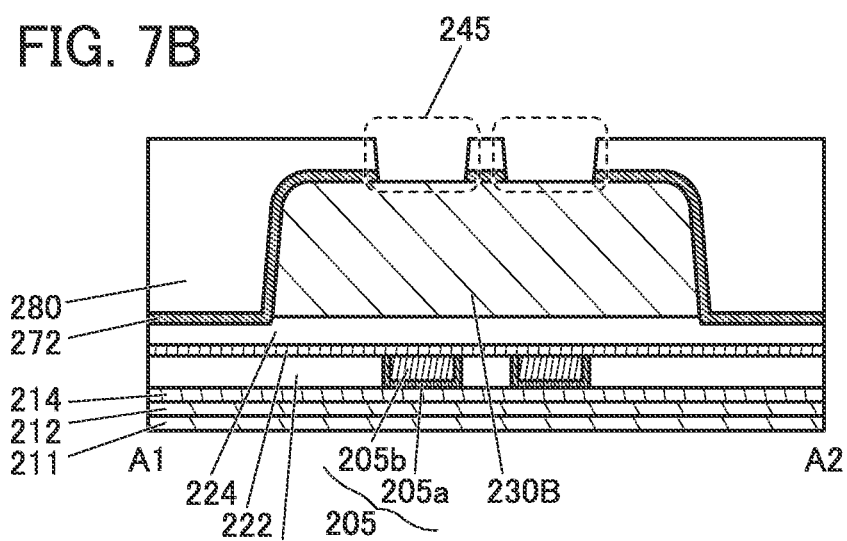
FIG. 7B to FIG. 7D are cross-sectional views showing a method for manufacturing the semiconductor device of one embodiment of the present invention.
Figure 7C:
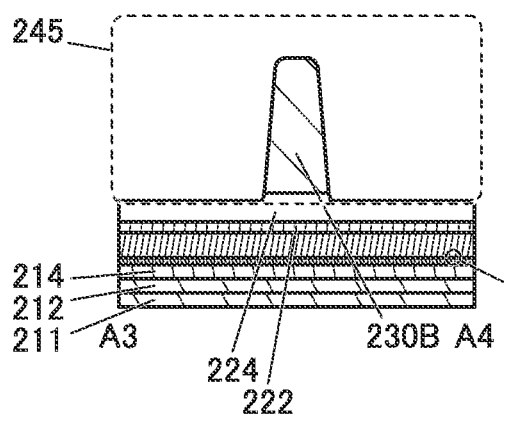
Figure 7D:
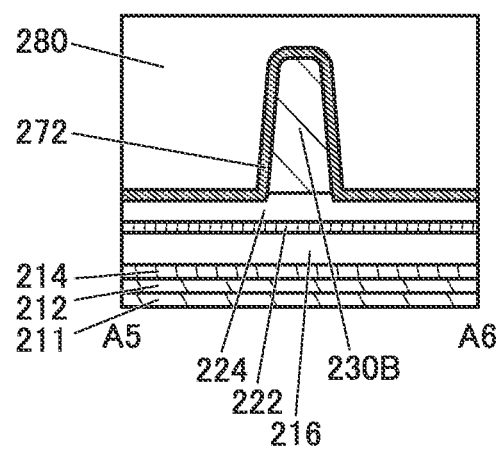

FIG. 1A is a top view of the semiconductor device. FIG. 1B, FIG. 1C, and FIG. 1D are cross-sectional views of the semiconductor device. Here, FIG. 1B is a cross-sectional view of a portion indicated by a dashed-dotted line A1-A2 in FIG. 1A, and is a cross-sectional view in the channel length direction of the transistor 200. Moreover, FIG. 1C is a cross-sectional view of a portion indicated by a dashed-dotted line A3-A4 in FIG. 1A, and is a cross-sectional view of a channel formation region in the direction in which a conductor 260 extends. Note that FIG. 1C illustrates a cross section in the channel width direction of the transistor 200. FIG. 1D is a cross-sectional view of a portion indicated by a dashed-dotted line A5-A6 in FIG. 1A. Note that for clarity of the drawing, some components are not illustrated in the top view of FIG. 1A.

The semiconductor device of one embodiment of the present invention includes the transistor 200, and an insulator 211, an insulator 212, an insulator 214, an insulator 280, and an insulator 281 that function as interlayer films. In addition, an oxide 243 (an oxide 243a, an oxide 243b, and an oxide 243c) and a conductor 240 (a conductor 240a, a conductor 240b, and a conductor 240c) that are electrically connected to the transistor 200 and function as plugs are included.

Note that the transistor 200 includes the two conductors 260 functioning as gate electrodes in one semiconductor layer. In other words, the transistor 200 has a structure including a transistor 200a and a transistor 200b in one semiconductor layer. One of a source and a drain of the transistor 200a is shared with one of a source and a drain of the transistor 200b. Thus, as compared with the case where the transistor 200a and the transistor 200b are separately formed, the number of plugs connected to the transistor 200 can be reduced and the area of the transistor 200 can be small. The one of the source and the drain of the transistor 200a and the one of the source and the drain of the transistor 200b are electrically connected to the conductor 240a through the oxide 243a. The other of the source and the drain of the transistor 200a is electrically connected to the conductor 240b through the oxide 243b, and the other of the source and the drain of the transistor 200b is electrically connected to the conductor 240c through the oxide 243c.

Here, in this embodiment, the description of one of the transistor 200a and the transistor 200b is mainly made as the detailed description of the transistor 200 in some cases, and as long as there is no particular description, the description of the other of the transistor 200a and the transistor 200b is omitted because the transistor 200a and the transistor 200b have similar structures. Furthermore, in this specification, the transistor 200 refers to one or both of the transistor 200a and the transistor 200b in some cases.

The conductor 260 (a conductor 260a and a conductor 260b) that functions as a gate electrode of the transistor 200 or a word line is formed to be embedded in a concave portion provided in the oxide 230a that functions as a semiconductor layer of the transistor 200. The conductor 260 is formed so that the level of a top surface thereof is lower than that of a top surface of the oxide 230a, and an insulator 262 is provided over the conductor 260 at least in the concave portion. The insulator 262 has a function of preventing electrical connection between the conductor 260 and the oxide 243 and between the conductor 260 and the conductor 240.

In that case, an insulator 250 is preferably formed so that the level of a top surface thereof is also lower than that of the top surface of the oxide 230a, and the insulator 262 is preferably provided also over the insulator 250 at least in the concave portion. Furthermore, the oxide 230b is preferably formed so that the level of a top surface thereof is also lower than that of the top surface of the oxide 230a, and the insulator 262 is preferably provided also over the oxide 230b at least in the concave portion.

The oxide 243 is provided in contact with the top surface of the oxide 230a, and the conductor 240 is electrically connected to the oxide 230a through the oxide 243; therefore, the oxide 243 and the conductor 240 are provided above the oxide 230a. The oxide 243 and the conductor 240 are provided above the conductor 260.

An insulator 272 is preferably provided to cover a side surface and part of the top surface of the oxide 230a. An insulator 241 (an insulator 241a, an insulator 241b, and an insulator 241c) may be provided in contact with an inner wall of an opening in the insulator 272, the insulator 280, and the insulator 281. At this time, the oxide 243 is provided in contact with an inner wall of the opening in the insulator 272, the insulator 280, and the insulator 281 with the insulator 241 therebetween. The oxide 243 is formed in contact with the insulator 241, a first conductor of the conductor 240 is formed on the inner side of the oxide 243, and a second conductor of the conductor 240 is formed on the inner side thereof.

By provision of the insulator 241, absorption of oxygen contained in the insulator 280 and the insulator 281 by at least one of the oxide 243 and the conductor 240 can be expected to be inhibited. As a result, the characteristics and reliability of the semiconductor device can be expected to be improved; however, the insulator 241 does not always need to be provided. That is, the oxide 243 may be provided in contact with the inner wall of the opening in the insulator 272, the insulator 280, and the insulator 281. Note that although the transistor 200 has a structure in which the first conductor of the conductor 240 and the second conductor of the conductor 240 are stacked, the present invention is not limited thereto. For example, the conductor 240 may be provided as a single layer or to have a stacked-layer structure of three or more layers. In the case where a structure body has a stacked-layer structure, layers may be distinguished by ordinal numbers corresponding to the formation order.

Here, a case in which misalignment of the oxide 230a from a desired position occurs in a lithography process for forming the opening in the insulator 272, the insulator 280, and the insulator 281 is considered. When the misalignment occurs, the opening might include a region overlapping with the conductor 260. However, according to one embodiment of the present invention, the insulator 262 is provided over the conductor 260 in the concave portion of the oxide 230a, and thus electrical connection between the conductor 260 and the oxide 243 or the conductor 240 to be formed in a later step, that is, a short circuit can be prevented. Furthermore, the opening can be designed to be larger than a desired region of the oxide 230a. The opening is formed to be larger than the desired region of the oxide 230a, whereby connection between the desired region of the oxide 230a and the oxide 243 becomes possible even in the case where misalignment of the opening with respect to the desired position of the oxide 230a occurs.

In the case where the misalignment occurs in formation of the opening or in the case where the opening is designed to be larger than the width of the oxide 230a in the A5-A6 direction shown in FIG. 1D, a bottom surface of the oxide 243 or a bottom surface of the conductor 240 may be provided at a position lower than the top surface of the oxide 230a.

With the use of the semiconductor device of one embodiment of the present invention and the manufacturing method thereof, a margin for alignment in forming the opening can be increased, and even when miniaturization of the semiconductor device is progressed, the semiconductor device can have favorable characteristics.

The conductor 240 is electrically connected to a source region and a drain region of the oxide 230a included in the transistor 200 in the opening in the insulator 272, the insulator 280, and the insulator 281. In the case where the conductor 240 is formed using a metal and directly connected to the oxide 230a functioning as a semiconductor, there is a concern that the contact resistance between the metal and the semiconductor is increased. A contact area between the conductor 240 and the oxide 230a only inside the contact is small, and thus the contact resistance might be higher. A semiconductor device manufactured in this manner is less likely to have favorable electrical characteristics in some cases.

In one embodiment of the present invention, the oxide 243 is provided on the bottom surface and a side surface of the conductor 240, and the conductor 240 is electrically connected to the oxide 230a through the oxide 243. In the case where the oxide 243 is in direct contact with not only the bottom surface of the conductor 240 but also the side surface of the conductor 240, the contact area is more increased than in the case where the oxide 243 is in contact with only the bottom surface of the conductor 240. Even in the case where the conductor 240 is a material formed of a metal, the contact area between the conductor 240 and the oxide 243 is sufficiently large; thus, an increase in the contact resistance due to different materials can be inhibited. In addition, there is no concern of an increase in the resistance due to materials because the oxide 230a is connected to the oxide 243 in the opening. Accordingly, the conductor 240 can have favorable electrical connection to the oxide 230a through the oxide 243.

In the case where the oxide 230a and the conductor 240 are electrically connected to each other with the structure described above, the contact area between the oxide 243 and the conductor 240 is larger than the contact area between the oxide 243 and the oxide 230a. Furthermore, the contact area between the oxide 243 and the conductor 240 is larger than the area of the opening formed in the insulator 272, the insulator 280, and the insulator 281. In addition, a deeper opening is formed in the insulator 272, the insulator 280, and the insulator 281, whereby the heights of the oxide 243 and the conductor 240 become larger and thus an increase in the contact resistance can be inhibited. The depth of the opening can be controlled by the thickness of the insulator 281, for example. The insulator 281 can have a thickness greater than or equal to 50 nm and less than or equal to 400 nm, preferably greater than or equal to 100 nm and less than or equal to 250 nm.

Each of the conductor 240a, the conductor 240b, and the conductor 240c can be electrically connected to a wiring or an element such as a transistor or a capacitor. For example, the conductor 240a is electrically connected to a wiring functioning as a bit line and the conductor 240b and the conductor 240c are electrically connected to different capacitors, whereby the semiconductor device functioning as a memory device may be formed.

[Transistor 200]

As shown in FIG. 1A to FIG. 1D, the transistor 200 includes the insulator 211 provided over a substrate (not illustrated); the insulator 212 provided over the insulator 211; the insulator 214 provided over the insulator 212; an insulator 216 provided over the insulator 214; a conductor 205 (a conductor 205a and a conductor 205b) provided to be embedded in the insulator 216; an insulator 222 provided over the insulator 216 and the conductor 205; an insulator 224 provided over the insulator 222; the oxide 230a including the concave portion and provided over the insulator 224; the oxide 230b provided in contact with a bottom surface and a side surface of the oxide 230a in the concave portion of the oxide 230a; the insulator 250 provided on the inner side of the oxide 230b; the conductor 260a provided on the inner side of the insulator 250; the conductor 260b provided to be embedded on the inner side of the conductor 260a; the insulator 262 over the oxide 230b, the insulator 250, the conductor 260a, and the conductor 260b in the concave portion; and the insulator 272 over the insulator 224 and the oxide 230a.

Note that the insulator 280 is provided over the insulator 272; the insulator 281 is provided over the insulator 262, the insulator 272, and the insulator 280; an opening is provided in the insulator 281, the insulator 280, and the insulator 272; the insulator 241 is provided on a side surface of the opening; the oxide 243 is provided inside the opening provided with the insulator 241; and the conductor 240 is provided on the inner side of the oxide 243.

Note that although the transistor 200 has a structure in which the oxide 230a is provided over and in contact with the insulator 224 and the top surface of the oxide 230a is in contact with the oxide 243, the present invention is not limited thereto. For example, the oxide 230a may have a stacked-layer structure of two or more layers. In the case where the oxide 230a has a stacked-layer structure, a layer in contact with the oxide 243 (an upper layer) is preferably formed using a material that has lower resistance or is likely to have lower resistance than a layer in contact with the insulator 224 (a lower layer). The lower layer of the oxide 230a is preferably formed using a material into which oxygen is diffused more easily than into the upper layer. By the diffusion of oxygen, oxygen vacancies in the oxide 230a can be compensated for and reduced. The oxide 230a with reduced oxygen vacancies is used in a channel formation region, whereby a transistor with an extremely low leakage current in an non-conduction state can be achieved. Moreover, the conductor 260 in the transistor 200 is shown to have a two-layer structure of the conductor 260a and the conductor 260b; however, the present invention is not limited thereto. For example, the conductor 260 may have a single-layer structure or a stacked-layer structure of three or more layers.

Here, the conductor 260 functions as a gate electrode of the transistor. As described above, the conductor 260 is formed to be embedded in the concave portion of the oxide 230a with the oxide 230b, the insulator 250, and the like therebetween. Here, the arrangement of the conductor 260 is selected in a self-aligned manner with respect to the concave portion of the oxide 230a. Therefore, the conductor 260 can be formed without an alignment margin, resulting in a reduction in the area occupied by the transistor 200. Accordingly, miniaturization and high integration of the semiconductor device can be achieved.

Furthermore, since the insulator 262 is provided over the conductor 260 in the concave portion of the oxide 230a, even in the case where the conductor 260 and the oxide 243 or the conductor 240 include a region overlapping with each other, the conductor 260 and the oxide 243 or the conductor 240 can be prevented from being short-circuited.

In the transistor 200, a metal oxide functioning as an oxide semiconductor (hereinafter, also referred to as an oxide semiconductor) is preferably used as the oxide 230 (the oxide 230a and the oxide 230b) including a channel formation region.

The transistor 200 including an oxide semiconductor in the channel formation region has an extremely low leakage current in a non-conduction state; hence, a semiconductor device with low power consumption can be provided. An oxide semiconductor can be deposited by a sputtering method, an ALD (Atomic Layer Deposition) method, or the like, and thus can be used for the transistor 200 included in a highly integrated semiconductor device.

For example, as the oxide 230, a metal oxide such as an In-M-Zn oxide (the element M is one or more kinds selected from aluminum, gallium, yttrium, tin, copper, vanadium, beryllium, boron, titanium, iron, nickel, germanium, zirconium, molybdenum, lanthanum, cerium, neodymium, hafnium, tantalum, tungsten, magnesium, and the like) is preferably used. It is particularly preferable that aluminum, gallium, yttrium, tin, or the like be contained in addition to indium and zinc. An In—Ga oxide or an In—Zn oxide may be used for the oxide 230.

The oxide 230a preferably has a crystal structure. Although details are described later, the oxide 230a a preferably includes a CAAC-OS (c-axis aligned crystalline oxide semiconductor) or an nc-OS (nanocrystalline oxide semiconductor), for example. The oxide 230a having a crystal structure allows the transistor 200 to have high field-effect mobility. In addition, the transistor can have high reliability.

In particular, in the case where the oxide 230a includes a CAAC-OS, in the CAAC-OS, a reduction in electron mobility due to a grain boundary is less likely to occur because it is difficult to observe a clear grain boundary. Thus, the transistor 200 with high field-effect mobility can be achieved. Entry of impurities or generation of defects is less likely to occur in the CAAC-OS because of its high crystallinity, and the CAAC-OS is physically stable; therefore, the transistor 200 can have high reliability.

In contrast, in the case where the oxide 230a includes an nc-OS, the crystal orientation in the whole oxide 230a is not observed. That is, the oxide 230a has uniform film characteristics regardless of the direction of carriers flowing in the oxide 230a, and thus the transistor 200 has stable electrical characteristics. In the case where the transistor 200 includes a U-shaped channel formation region as described in this embodiment, carriers flows in two or more directions, i.e., a direction perpendicular or substantially perpendicular to and a direction parallel or substantially parallel to the normal direction of a formation surface of the oxide 230a. Thus, an nc-OS indicating no crystal orientation in the whole film is preferably used as the oxide 230a.

Note that the use of a CAAC-OS or an nc-OS as the oxide 230b allows the transistor 200 having high field-effect mobility and the transistor 200 having high reliability to be achieved.

Here, the oxide 230 might have increased carrier density to have reduced resistance when impurities such as hydrogen, nitrogen, and a metal element exist therein. Furthermore, the oxide 230 might have increased carrier density to have reduced resistance when the oxygen concentration thereof decreases.

A metal oxide similar to the oxide 230 can be used as the oxide 243 functioning as part of a plug.

In the case where the conductor provided in contact with the oxide has a function of absorbing oxygen in the oxide or in the case where the conductor has a function of supplying impurities such as hydrogen, nitrogen, and a metal element to the oxide, a low-resistance region may be formed in the oxide or in at least part of the oxide.

As shown in FIG. 1B and FIG. 1D, the oxide 243 is provided in contact with the bottom surface and the side surface of the conductor 240, thereby functioning as a low-resistance region. Part of the oxide 230a in contact with the oxide 243 also functions as a low-resistance region in some cases. The channel formation region of the transistor 200 is formed in the oxide 230a along the concave portion provided in the oxide 230a and electrically connected to the conductor 240 through the oxide 243. Accordingly, the transistor 200 can also be referred to as a transistor including a U-shaped channel formation region. In this case, the oxide 230b or at least part of the oxide 230b also functions as the channel formation region of the transistor 200 in some cases. In this manner, in the transistor including the U-shaped channel formation region, carriers flows in the direction perpendicular or substantially perpendicular and the direction parallel or substantially parallel to the normal direction of a top surface of the insulator 222.

It can be said that the conductor 240a functions as one of a source electrode and a drain electrode which are electrically connected to the transistor 200a, and the conductor 240b functions as the other of the source electrode and the drain electrode which are electrically connected to the transistor 200a. In this case, the conductor 240a functions as one of a source electrode and a drain electrode which are electrically connected to the transistor 200b, and the conductor 240c functions as the other of the source electrode and the drain electrode which are electrically connected to the transistor 200b. Note that the source electrode or the drain electrode may include not only the conductor 240 but also the oxide 243.

The oxide 243 whose resistance is reduced by the conductor 240, and part of the oxide 230a can be referred to as a source region or a drain region. The source region and the drain region have an increased carrier concentration and a lower resistance because they have a lower oxygen concentration or contain more impurities such as hydrogen, nitrogen, and a metal element than the channel formation region. In other words, the source region and the drain region have a higher carrier density and a lower resistance than the channel formation region. The channel formation region is a high-resistance region with a low carrier density because it has a higher oxygen concentration or a lower impurity concentration than the source region and the drain region.

Note that in the case where the low-resistance region contains a metal element, the region preferably contains any one or more metal elements selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, lanthanum, and the like in addition to the metal element contained in the oxide 243 or the oxide 230.

In the oxide 230a, the boundary between the low-resistance region and the channel formation region is difficult to detect clearly in some cases. The concentration of a metal element and an impurity element such as hydrogen and nitrogen, which is detected in each region, may be gradually changed (such a change is also referred to as gradation) not only between the regions but also in each region. That is, the region closer to the channel formation region preferably has a lower concentration of a metal element and an impurity element such as hydrogen and nitrogen.

To reduce the resistances of the oxide 243 and at least the part of the oxide 230, as the conductor 240, for example, a material that contains at least one of an impurity and metal elements that increase conductivity such as aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum is preferably used. Alternatively, a conductive film 240A to be the conductor 240 is formed using a material, a deposition method, or the like that injects impurities such as an element that forms oxygen vacancies or an element trapped by oxygen vacancies into the oxide 243 and the oxide 230. Examples of the element contain hydrogen, boron, carbon, nitrogen, fluorine, phosphorus, sulfur, chlorine, and a rare gas. Typical examples of the rare gas are helium, neon, argon, krypton, and xenon.

Here, a transistor using an oxide semiconductor is likely to have its electrical characteristics changed by impurities and oxygen vacancies in the region of the oxide semiconductor where a channel is formed, which may affect the reliability. Moreover, if the region of the oxide semiconductor where a channel is formed contains oxygen vacancies, the transistor tends to have normally-on characteristics. Thus, oxygen vacancies in the region of the oxide 230 where a channel is formed are preferably reduced as much as possible.

To inhibit the transistor from becoming normally on, the insulator 224 near the oxide 230 preferably contains oxygen more than oxygen in the stoichiometric composition (also referred to as excess oxygen). Oxygen in the insulator 224 is diffused into the oxide 230 to reduce oxygen vacancies in the oxide 230 and can inhibit the transistor from becoming normally on.

That is, oxygen contained in the insulator 224 is diffused into the oxide 230, whereby oxygen vacancies in the channel formation region of the oxide 230 can be reduced.

It is preferable to provide the insulator 211, the insulator 212, the insulator 214, the insulator 222, the insulator 272, the insulator 262, and the like to inhibit diffusion of oxygen contained in the oxide 230 and the insulator 224 to the outside of the transistor 200. For those insulators, a material that does not easily pass oxygen is preferably used. For example, an oxide containing one of aluminum and hafnium or a nitride of silicon can be used. Moreover, a metal oxide such as an indium-gallium-zinc oxide in which the concentration of In is reduced or a metal oxide not containing In can be used. Furthermore, those insulating films are preferably a material that does not easily pass impurities such as hydrogen, water, nitrogen, and a metal element. The use of such a material can inhibit entry of impurities from the outside of the transistor 200 into the transistor 200.

An oxide semiconductor can be deposited by a sputtering method, an ALD method, or the like, and thus can be used for a transistor included in a highly integrated semiconductor device. The transistor using an oxide semiconductor in a channel formation region has an extremely low leakage current (off-state current) in a non-conduction state; thus, a semiconductor device with low power consumption can be provided.

Accordingly, a semiconductor device that includes a transistor having a high on-state current can be provided. A semiconductor device that includes a transistor having a low off-state current can be provided. Alternatively, a semiconductor device that has stable electrical characteristics with a small variation in electrical characteristics and improved reliability can be provided.

The detailed structure of the semiconductor device including the transistor 200 of one embodiment of the present invention is described below.

As shown in FIG. 1A and FIG. 1C, the conductor 205 extends in the channel width direction, and is positioned to overlap with the oxide 230 and the conductor 260. Furthermore, the conductor 205 is preferably embedded in the insulator 216.

The conductor 260 sometimes functions as a first gate (also referred to as top gate) electrode. The conductor 205 sometimes functions as a second gate (also referred to as bottom gate) electrode. By providing the second gate electrode, an electric field can be applied from the conductor 205 to the oxide 230a at least in a region that overlaps with the conductor 205 and the conductor 260. In that case, Vth of the transistor 200 can be controlled by changing a potential applied to the conductor 205 independently of a potential applied to the conductor 260. In particular, by applying a negative potential to the conductor 205, Vth of the transistor 200 can be higher than 0 V, and the off-state current can be reduced. Thus, a drain current at the time when a potential applied to the conductor 260 is 0 V can be lower in the case where a negative potential is applied to the conductor 205 than in the case where the negative potential is not applied to the conductor 205.

Note that as shown in FIG. 1A to FIG. 1C, the conductor 205 is provided to overlap with the oxide 230 and the conductor 260. As shown in FIG. 1C, it is particularly preferable that the conductor 205 extend to a region outside an end portion of the oxide 230 that intersects with the channel width direction. That is, the conductor 205 and the conductor 260 preferably overlap with each other with the insulators therebetween outside a side surface of the oxide 230 in the channel width direction.

With the above structure, in the case where potentials are applied to the conductor 260 and the conductor 205, an electric field generated from the conductor 260 and an electric field generated from the conductor 205 are connected and can cover at least part of the channel formation region formed in the oxide 230.

That is, at least the part of the channel formation region can be electrically surrounded by the electric field of the conductor 260 having a function of a first gate electrode and the electric field of the conductor 205 having a function of the second gate electrode. In this specification, the transistor structure in which the channel formation region is electrically surrounded by the electric fields of the first gate electrode and the second gate electrode is referred to as a surrounded channel (S-channel) structure.

Although details are described later, in the conductor 205, the conductor 205a is formed in contact with an inner wall of an opening in the insulator 216, and the conductor 205b is formed on the inner side of the conductor 205a. Here, the top surfaces of the conductor 205a and the conductor 205b and the top surface of the insulator 216 can be substantially level with each other. Although the transistor 200 having a structure in which the conductor 205a and the conductor 205b are stacked is shown, the present invention is not limited thereto. For example, the conductor 205 may have a single-layer structure or a stacked-layer structure of three or more layers. In the case where a structure body has a stacked-layer structure, layers may be distinguished by ordinal numbers corresponding to the formation order.

Here, a conductive barrier film is preferably used as the conductor 205a. For example, for the conductor 205a, a conductive material having a function of inhibiting diffusion of impurities such as a hydrogen atom, a hydrogen molecule, a water molecule, a nitrogen atom, a nitrogen molecule, a nitrogen oxide molecule ($N_2O$, NO, $NO_2$, and the like), and a copper atom (a conductive material through which the above impurities are less likely to pass) is preferably used. Alternatively, it is preferable to use a conductive material that has a function of inhibiting diffusion of oxygen (e.g., at least one of an oxygen atom, an oxygen molecule, and the like) (through which oxygen is unlikely to pass). Note that in this specification, a function of inhibiting diffusion of impurities or oxygen means a function of inhibiting diffusion of any one or all of the above impurities and oxygen.

When the conductor 205a has a function of inhibiting diffusion of oxygen, the conductor 205b can be inhibited from being oxidized and having reduced conductivity. As a conductive material having a function of inhibiting diffusion of oxygen, for example, tantalum, tantalum nitride, titanium, titanium nitride, ruthenium, ruthenium oxide, or the like is preferably used. Thus, the conductor 205a is formed using a conductive material selected from the above. Accordingly, impurities such as hydrogen and water can be inhibited from diffusing to the transistor 200 side through the conductor 205. Furthermore, the conductor 205a may have a stacked-layer structure of two or more layers using a material selected from the above materials. For example, a conductor having a stacked-layer structure including tantalum nitride and titanium nitride over the tantalum nitride can be used as the conductor 205a.

For the conductor 205b, a material having higher conductivity than the conductor 205a is preferably used, and a conductive material whose main component is tungsten, copper, or aluminum is preferably used.

Each of the insulator 211, the insulator 212, and the insulator 214 preferably functions as a barrier insulating film that inhibits impurities such as water and hydrogen from entering the transistor 200 from the substrate side. Thus, the insulator 211, the insulator 212, and the insulator 214 are preferably formed using an insulating material having a function of inhibiting diffusion of impurities (through which the impurities are less likely to pass) such as a hydrogen atom, a hydrogen molecule, a water molecule, a nitrogen atom, a nitrogen molecule, a nitrogen oxide molecule (e.g., $N_2O$, NO, or $NO_2$), or a copper atom. Alternatively, it is preferable to use an insulating material having a function of inhibiting diffusion of oxygen (e.g., at least one of an oxygen atom, an oxygen molecule, and the like) (through which the above oxygen is less likely to pass).

For the insulator 211, the insulator 212, and the insulator 214, aluminum oxide, hafnium oxide, silicon nitride, or the like can be used. Moreover, a metal oxide such as an indium-gallium-zinc oxide in which the concentration of In is reduced or a metal oxide not containing In can be used. For example, it is preferable that the insulator 211 and the insulator 212 be formed using silicon nitride or the like, and the insulator 214 be formed using aluminum oxide or the like. Accordingly, impurities such as hydrogen and water can be inhibited from diffusing to the transistor 200 side from the substrate side through the insulator 211, the insulator 212, and the insulator 214. Alternatively, oxygen contained in the insulator 216, the insulator 224, or the like can be inhibited from diffusing to the substrate side through the insulator 211, the insulator 212, and the insulator 214.

The insulator 216, the insulator 280, and the insulator 281 that function as interlayer films preferably have lower permittivity than the insulator 211, the insulator 212, and the insulator 214. When a material with low permittivity is used for an interlayer film, parasitic capacitance generated between wirings can be reduced.

For example, a single layer or a stacked layer of an insulator such as silicon oxide, silicon oxynitride, silicon nitride oxide, aluminum oxide, hafnium oxide, tantalum oxide, zirconium oxide, lead zirconate titanate (PZT), strontium titanate ($SrTiO_3$), or $(Ba,Sr)TiO_3$ (BST) can be used as the insulator 216, the insulator 280, and the insulator 281. Alternatively, aluminum oxide, bismuth oxide, germanium oxide, niobium oxide, silicon oxide, titanium oxide, tungsten oxide, yttrium oxide, or zirconium oxide may be added to these insulators, for example. Alternatively, these insulators may be subjected to nitriding treatment. Silicon oxide, silicon oxynitride, or silicon nitride may be stacked over the insulator.

The insulator 222, the insulator 224, and the insulator 250 each have a function of a gate insulator.

Here, as the insulator 224, an insulator that contains oxygen more than oxygen in the stoichiometric composition is preferably used. That is, an excess-oxygen region is preferably formed in the insulator 224. When such an insulator containing excess oxygen is provided in contact with the oxide 230a, oxygen vacancies in the oxide 230a can be reduced and the reliability of the transistor 200 can be improved.

As the insulator including an excess-oxygen region, specifically, an insulator that releases part of oxygen by heating is preferably used. An insulator that releases oxygen by heating is an oxide film in which the amount of released oxygen converted into oxygen molecules is greater than or equal to $1.0\times10^{18}$ molecules/cm$^3$, preferably greater than or equal to $1.0\times10^{19}$ molecules/cm$^3$, further preferably greater than or equal to $2.0\times10^{19}$ molecules/cm$^3$ or greater than or equal to $3.0\times10^{20}$ molecules/cm$^3$ in TDS (Thermal Desorption Spectroscopy) analysis. Note that the temperature of the film surface in the TDS analysis is preferably within the range of 100° C. to 700° C., or 100° C. to 400° C.

For example, a single layer or a stacked layer of an insulator such as silicon oxide, silicon oxynitride, silicon nitride oxide, aluminum oxide, hafnium oxide, tantalum oxide, zirconium oxide, lead zirconate titanate (PZT), strontium titanate ($SrTiO_3$), or $(Ba,Sr)TiO_3$ (BST) can be used as the insulator 224. Alternatively, aluminum oxide, bismuth oxide, germanium oxide, niobium oxide, silicon oxide, titanium oxide, tungsten oxide, yttrium oxide, or zirconium oxide may be added to these insulators, for example. Alternatively, these insulators may be subjected to nitriding treatment. Silicon oxide, silicon oxynitride, or silicon nitride may be stacked over the insulator.

In the case where the insulator 224 includes an excess-oxygen region, it is preferable that the insulator 222 have a function of inhibiting diffusion of oxygen (e.g., at least one of an oxygen atom, an oxygen molecule, and the like) (through which the oxygen is less likely to pass).

When the insulator 222 has a function of inhibiting diffusion of oxygen or impurities, oxygen contained in the oxide 230 is not diffused to the insulator 216 side, which is preferable. Moreover, the conductor 205 can be inhibited from reacting with oxygen contained in the insulator 224 and the oxide 230.

For example, a single layer or a stacked layer of an insulator containing a what is called high-k material such as aluminum oxide, hafnium oxide, tantalum oxide, zirconium oxide, lead zirconate titanate (PZT), strontium titanate ($SrTiO_3$), or $(Ba,Sr)TiO_3$ (BST) is preferably used as the insulator 222. With miniaturization and high integration of transistors, a problem such as leakage current may arise because of a thinner gate insulator. When a high-k material is used for the insulator functioning as a gate insulator, a gate potential during operation of the transistor can be reduced while the physical thickness of the gate insulator is maintained.

It is particularly preferable to use an insulator containing an oxide of one or both of aluminum and hafnium, which is an insulating material having a function of inhibiting diffusion of impurities, oxygen, and the like (through which the oxygen is less likely to pass). For the insulator containing an oxide of one or both of aluminum and hafnium, aluminum oxide, hafnium oxide, an oxide containing aluminum and hafnium (hafnium aluminate), or the like is preferably used. The insulator 222 formed of such a material functions as a layer that inhibits release of oxygen from the oxide 230a and entry of impurities such as hydrogen from the periphery of the transistor 200 into the oxide 230a.

Alternatively, aluminum oxide, bismuth oxide, germanium oxide, niobium oxide, silicon oxide, titanium oxide, tungsten oxide, yttrium oxide, or zirconium oxide may be added to these insulators, for example. Alternatively, these insulators may be subjected to nitriding treatment. The insulator over which silicon oxide, silicon oxynitride, or silicon nitride is stacked may be used.

Note that the insulator 222 and the insulator 224 may have a stacked-layer structure of two or more layers. In such cases, without limitation to a stacked-layer structure formed of the same material, a stacked-layer structure formed of different materials may be employed.

The oxide 230 includes the oxide 230a and the oxide 230b over the oxide 230a. The oxide 230a is in contact with the insulator 224, whereby oxygen contained in the insulator 224 is supplied to the oxide 230a. In the case where the oxide 230a includes oxygen vacancies, oxygen vacancies in the oxide 230a can be compensated for and reduced by supply of oxygen. When the oxide 230a with reduced oxygen vacancies is used in a channel formation region, a transistor with an extremely low leakage current in an non-conduction state can be achieved.

Note that the oxide 230a may have a stacked-layer structure of a plurality of oxide layers that differ in the atomic ratio of metal atoms. Specifically, in the case where the oxide 230a has a stacked-layer structure, the atomic proportion of the element M in constituent elements in the metal oxide used for an upper layer of the oxide 230a is preferably lower than the atomic proportion of the element M in constituent elements in the metal oxide used for a lower layer of the oxide 230a. Moreover, the atomic ratio of the element M to In in the metal oxide used for the upper layer of the oxide 230a is preferably smaller than the atomic ratio of the element M to In in the metal oxide used for the lower layer of the oxide 230a. Furthermore, the atomic ratio of In to the element M in the metal oxide used for the upper layer of the oxide 230a is preferably greater than the atomic ratio of In to the element M in the metal oxide used for the lower layer of the oxide 230a. A conductive metal oxide may be used for the upper layer of the oxide 230a. With such a structure, the lower layer of the oxide 230a has a higher resistance than the upper layer, and the upper layer of the oxide 230a has a lower resistance than the lower layer. Thus, the lower layer of the oxide 230a can be used as a channel formation region, and the upper layer of the oxide 230a can be used as a source region and a drain region. Note that in the case where the oxide 230a has a stacked-layer structure, it is preferable that a top surface of the lower layer of the oxide 230a be provided at a position higher than a bottom surface of the oxide 230b and be provided at position lower than a bottom surface of the oxide 243. It is preferable that the top surface of the lower layer of the oxide 230a be substantially level with a top surface of the conductor 260.

Specifically, as the oxide 230a, a metal oxide having In:Ga:Zn=4:2:3 [atomic ratio] or in the vicinity thereof, a metal oxide having In:Ga:Zn=5:1:6 [atomic ratio] or in the vicinity thereof, a metal oxide having In:Ga:Zn=5:1:3 [atomic ratio] or in the vicinity thereof, a metal oxide having In:Ga:Zn=10:1:3 [atomic ratio] or in the vicinity thereof, a metal oxide having In:Ga:Zn=1:1:1 [atomic ratio] or in the vicinity thereof, or a metal oxide such as In—Zn oxide or indium oxide can be used. Here, in the case where the oxide 230a has a stacked-layer structure and a conductive metal oxide is used for the upper layer of the oxide 230a, indium tin oxide, zinc oxide, indium oxide, or the like can be used as the conductive metal oxide. As the oxide 230b, a metal oxide having In:Ga:Zn=1:3:4 [atomic ratio], In:Ga:Zn=4:2:3 [atomic ratio], Ga:Zn=2:1 [atomic ratio], or Ga:Zn=2:5 [atomic ratio] can be used. The oxide 230b may have a stacked-layer structure, and specific examples of the oxide 230b having a stacked-layer structure include a stacked-layer structure of In:Ga:Zn=4:2:3 [atomic ratio] and In:Ga:Zn=1:3:4 [atomic ratio], a stacked-layer structure of In:Ga:Zn=4:2:3 [atomic ratio] and Ga:Zn=2:1 [atomic ratio], a stacked-layer structure of In:Ga:Zn=4:2:3 [atomic ratio] and Ga:Zn=2:5 [atomic ratio], and a stacked-layer structure of In:Ga:Zn=4:2:3 [atomic ratio] and gallium oxide.

In this case, a region of the oxide 230a in the vicinity of the oxide 230b serves as a main carrier path. When the oxide 230b has the above structure, the density of defect states at the interface between the oxide 230a and the oxide 230b can be made low. Thus, the influence of interface scattering on carrier conduction is small, and the transistor 200 can have high on-state current and excellent frequency characteristics. Note that in the case where the oxide 230b has a stacked-layer structure, not only the above effect of reducing the density of defect states at the interface between the oxide 230a and the oxide 230b but also the effect of inhibiting diffusion of a constituent element contained in the oxide 230b to the insulator 250 side should be obtained. More specifically, the oxide 230b has a stacked-layer structure and an oxide containing no In or having a reduced In concentration is positioned in an upper portion of the stacked-layer structure, so that possible diffusion of In to the insulator 250 side can be inhibited. Since the insulator 250 functions as the gate insulator, the transistor has defects in characteristics when In diffuses. Thus, when the oxide 230b has a stacked-layer structure, a highly reliable semiconductor device can be provided.

When the oxide 230b has a stacked-layer structure, the interface between the oxide 230a and a lower layer of the oxide 230b and its vicinity may serve as a main carrier path.

The oxide 230b is in contact with the insulator 224 as shown in FIG. 1C, and thus oxygen contained in the insulator 224 can be supplied to the channel formation region of the transistor 200 through the oxide 230b. In the case where the oxide 230b has a stacked-layer structure, it is preferable that a material through which oxygen is likely to pass be used for the lower layer of the oxide 230b, and a material through which oxygen is less likely to pass be used for an upper layer of the oxide 230b. With the use of the above material, oxygen contained in the insulator 224 can be inhibited from passing through the oxide 230b and being absorbed by the insulator 250 or the conductor 260, and oxygen can be supplied to the channel formation region efficiently.

As described above, there are a case where oxygen contained in the insulator 224 is supplied to the channel formation region by passing through an interface between the insulator 224 and the oxide 230a and a case where oxygen contained in the insulator 224 is supplied to the channel formation region through the oxide 230b.

That is, through appropriate selection of the areas of the regions, a transistor having electrical characteristics necessary for a circuit design can be easily provided.

As the oxide 230, a metal oxide functioning as an oxide semiconductor (hereinafter also referred to as an oxide semiconductor) is preferably used. For example, as the oxide functioning as the channel formation region, it is preferable to use a metal oxide having a band gap of 2 eV or more, preferably 2.5 eV or more. With the use of a metal oxide having such a wide bandgap, the off-state current of the transistor 200 can be reduced.

A transistor using an oxide semiconductor has an extremely low off-state leakage current in a non-conduction state; thus, a semiconductor device with low power consumption can be provided. An oxide semiconductor can be deposited by a sputtering method or the like, and thus can be used for a transistor included in a highly integrated semiconductor device.

The insulator 272 is provided to cover the oxide 230a and be in contact with the insulator 224. By provision of the insulator 272, oxygen contained in the insulator 224 can be inhibited from being diffused into the insulator 280. Furthermore, oxygen contained in the insulator 280 and the insulator 281 can be inhibited from being supplied to the oxide 230a. By provision of the insulator 272, oxygen contained in the insulator 224 can be supplied to the oxide 230a efficiently, and the resistance of the upper layer of the oxide 230a, in particular, the resistance of a region in contact with the oxide 243, can be inhibited from being increased by oxygen contained in the insulator 280 and the insulator 281.

A metal oxide containing one kind or two or more kinds selected from hafnium, aluminum, gallium, yttrium, zirconium, tungsten, titanium, tantalum, nickel, germanium, magnesium, and the like can be used for the insulator 272. For the insulator 272, a metal oxide such as a metal oxide in which the atomic proportion of In in constituent elements of the metal oxide is lower than the atomic proportion of the element M, e.g., indium-gallium-zinc oxide in which the concentration of In is lower than the concentration of Ga, or a metal oxide not containing In may be used.

It is particularly preferable to use an insulator containing an oxide of one or both of aluminum and hafnium, for example, aluminum oxide, hafnium oxide, or an oxide containing aluminum and hafnium (hafnium aluminate). In particular, hafnium aluminate has higher heat resistance than a hafnium oxide film. Therefore, hafnium aluminate is preferable because it is unlikely to be crystallized by heat treatment in a later step.

The insulator 272 may have a stacked-layer structure of two or more layers. In that case, layers included in the insulator 272 may be formed using different materials. The layers included in the insulator 272 can be formed by different methods. For example, aluminum oxide formed by a sputtering method can be used for a lower layer of the insulator 272, and aluminum oxide formed by an ALD method can be used for an upper layer of the insulator 272.

The insulator 280 is provided over the insulator 272. The insulator 280 preferably contains, for example, silicon oxide, silicon oxynitride, silicon nitride oxide, silicon oxide to which fluorine is added, silicon oxide to which carbon is added, silicon oxide to which carbon and nitrogen are added, porous silicon oxide, or the like. In particular, silicon oxide and silicon oxynitride, which have thermal stability, are preferable. As the insulator 280, an insulator having a reduced oxygen concentration is preferably used. For example, the oxygen concentration of the insulator 280 is preferably lower than the oxygen concentration of the insulator 224.

The concentration of impurities such as water and hydrogen in the insulator 280 is preferably reduced. In addition, the insulator 280 may have a stacked-layer structure of two or more layers. In addition, a top surface of the insulator 280 may be planarized. Moreover, the insulator 280 preferably has a low hydrogen concentration and includes an excess-oxygen region or excess oxygen, and may be provided using a material similar to that for the insulator 216, for example.

As shown in FIG. 1B and FIG. 1C, the oxide 230b is provided in contact with the top surface of the oxide 230a, the side surface of the oxide 230a, and a side surface of the insulator 224. Although an example in which the oxide 230b includes a region in contact with the insulator 222 is shown in FIG. 1C, this embodiment is not limited thereto. In the case where the insulator 224 is provided on the top surface of the insulator 222, the oxide 230b is provided in contact with a top surface of the insulator 224.

The insulator 250 functions as a gate insulator. The insulator 250 is preferably positioned in contact with the inner side (the top surface and the side surface) of the oxide 230b.

Specifically, for the insulator 250, silicon oxide, silicon oxynitride, silicon nitride oxide, silicon nitride, silicon oxide to which fluorine is added, silicon oxide to which carbon is added, silicon oxide to which carbon and nitrogen are added, or porous silicon oxide can be used. In particular, silicon oxide and silicon oxynitride are preferable because they are thermally stable.

Furthermore, as in the insulator 224, the concentration of impurities such as water and hydrogen in the insulator 250 is preferably lowered. The thickness of the insulator 250 is preferably greater than or equal to 1 nm and less than or equal to 20 nm.

Although the conductor 260 that functions as the first gate electrode and has a two-layer structure is shown in FIG. 1B and FIG. 1C, a single-layer structure or a stacked-layer structure of three or more layers may be employed. For example, when the conductor 260 has a two-layer structure, the conductor 260a is preferably formed using a conductive material having a function of inhibiting diffusion of impurities such as a hydrogen atom, a hydrogen molecule, a water molecule, a nitrogen atom, a nitrogen molecule, a nitrogen oxide molecule (e.g., $N_2O$, NO, and $NO_2$), and a copper atom, like the conductor 205a. Alternatively, it is preferable to use a conductive material having a function of inhibiting diffusion of oxygen (e.g., at least one of an oxygen atom, an oxygen molecule, and the like).

When the conductor 260a has a function of inhibiting diffusion of oxygen, it is possible to inhibit a reduction in conductivity of the conductor 260b due to oxidation caused by oxygen contained in the insulator 250. As a conductive material having a function of inhibiting diffusion of oxygen, for example, tantalum, tantalum nitride, titanium, titanium nitride, ruthenium, ruthenium oxide, or the like is preferably used.

Furthermore, the conductor 260b is preferably formed using a conductive material including tungsten, copper, or aluminum as its main component. The conductor 260 also functions as a wiring and thus is preferably formed using a conductor having high conductivity. For example, a conductive material containing tungsten, copper, or aluminum as its main component can be used. The conductor 260b may have a stacked-layer structure; for example, a stacked-layer structure of titanium or titanium nitride and the above conductive material may be employed.

In the case where the conductor 205 extends to a region outside the end portion of the oxide 230a that intersects with the channel width direction as shown in FIG. 1C, the conductor 260 preferably overlaps with the conductor 205 in the region with the oxide 230b and the insulator 250 therebetween. That is, a stacked-layer structure of the conductor 205, the oxide 230b, the insulator 250, and the conductor 260 is preferably formed outside the side surface of the oxide 230a.

With the above structure, in the case where potentials are applied to the conductor 260 and the conductor 205, an electric field generated from the conductor 260 and an electric field generated from the conductor 205 are connected, so that the channel formation region formed in the oxide 230 can be covered.

That is, the channel formation region can be electrically surrounded by the electric field of the conductor 260 having a function of the first gate electrode and the electric field of the conductor 205 having a function of the second gate electrode.

The insulator 262 is provided over at least the conductor 260. The insulator 262 is preferably provided also over the insulator 250. Although FIG. 1B shows an example in which the insulator 262 is provided over the conductor 260, the insulator 250, and the oxide 230b and provided in contact with the side surface of the oxide 230a here, this embodiment is not limited thereto. The oxide 230b may be provided so that the top surface of the oxide 230b is substantially level with the top surface of the oxide 230a or atop surface of the insulator 272. In this case, the insulator 262 is provided in contact with the top surface of the conductor 260, the top surface of the insulator 250, and a side surface of the oxide 230b. Here, FIG. 1B shows a state where the insulator 262 is provided in the concave portion provided in the oxide 230a. In contrast, as shown in FIG. 1A and FIG. 1C, the insulator 262 is provided in a concave portion provided in the insulator 280 in a region not overlapping with the oxide 230a.

The insulator 262 is preferably formed using an insulating barrier film. When the insulator 262 has a barrier property against oxygen and impurities such as hydrogen, diffusion of impurities such as hydrogen contained in the insulator 281 or the like into the oxide 230a can be inhibited. Furthermore, diffusion of oxygen contained in the insulator 281 or the like into the oxide 230a can be inhibited, so that the resistance of the oxide 230a can be inhibited from being increased. Furthermore, diffusion of oxygen contained in the insulator 281 or the like into the conductor 260 can be inhibited, so that the resistance of the conductor 260 can be inhibited from being increased.

For the insulator 262, a material with which the insulator 262 is not eliminated in processing of the insulator 272 is preferably used. For the insulator 262, hafnium oxide, silicon nitride, or the like can be used, for example. For the insulator 262, aluminum oxide may be used.

The insulator 281 functioning as an interlayer film is preferably provided over the insulator 272, the insulator 280, and the insulator 262. For the insulator 281, a material similar to that for the insulator 280 can be used. The concentration of impurities such as water and hydrogen in the film of the insulator 281 is preferably reduced.

Furthermore, the oxide 243 and the conductor 240 which are electrically connected to the oxide 230a are positioned in the opening formed in the insulator 281, the insulator 280, and the insulator 272. At that time, the insulator 241 is preferably provided on the side surface of the opening. The insulator 241 preferably has a function of inhibiting passage of oxygen and impurities such as hydrogen. A material similar to that for the insulator 211, the insulator 212, the insulator 214, the insulator 222, the insulator 272, or the like can be used for the insulator 241. When the insulator 241 is provided, absorption of oxygen by the oxide 243 and the conductor 240 can be inhibited. When absorption of oxygen by the oxide 243 is inhibited, a reduction in the carrier density of the oxide 243 can be inhibited, and an increase in the resistivity can be inhibited. Moreover, when absorption of oxygen by the conductor 240 is inhibited, an increase in the resistivity due to oxidation of the conductor 240 can be inhibited. Note that in the case where each of the insulator 280 and the insulator 281 is not an insulator from which oxygen is released at room temperature or by heating, the insulator 241 is not necessarily provided. Moreover, provision of the insulator 241 can inhibit hydrogen contained in the insulator 280 and the insulator 281 from being diffused into the oxide 230 through the conductor 240.

The conductor 240 functions as a plug that electrically connects the transistor 200 to a wiring or electrically connects the transistor 200 to an element such as a transistor different from the transistor 200 or a capacitor. The oxide 243 is provided on the bottom surface and the side surface of the conductor 240 to reduce the contact resistance with the transistor 200, and thus, the oxide 243 and the conductor 240 can be collectively referred to as a plug. The conductor 240 can be referred to as a source electrode or a drain electrode because of the functional feature. The oxide 243 can be referred to as a low-resistance region because of the functional feature. A low-resistance region is a region whose resistance is lower than that of the channel formation region and whose resistance is higher than that of a conductor that can be used as the conductor 205, the conductor 260, the conductor 240, and the like. The low-resistance region is referred to as a source region or a drain region in some cases.

Note that the conductor 240 may have a stacked-layer structure including a first conductor and a second conductor. In this case, the first conductor is provided on the inner side of the oxide 243, and the second conductor is provided over the first conductor. Moreover, the first conductor is preferably provided to cover a side surface of the second conductor.

Here, FIG. 1D shows a cross-sectional view of a portion indicated by a dashed-dotted line A5-A6 in FIG. 1A. As shown in FIG. 1D, the oxide 243a and the conductor 240 are in contact with the top surface of the oxide 230a which is not covered with the insulator 272. A vicinity of a region of the oxide 230a in contact with the oxide 243a has a high carrier density and a low resistance in some cases. In other words, the oxide 230a shown in FIG. 1D sometimes includes a region functioning as a channel formation region and a region that is over the channel formation region and functions as a source region or a drain region.

For the conductor 240, a conductive material containing tungsten, copper, or aluminum as its main component is preferably used. The conductor 240 may have a single-layer structure or a stacked-layer structure of three or more layers.

In the case where the conductor 240 has a stacked-layer structure including the first conductor and the second conductor over the first conductor, a conductive material having a function of inhibiting passage of impurities such as water and hydrogen is preferably used for the first conductor, like the conductor 205a and the like. For example, tantalum, tantalum nitride, titanium, titanium nitride, ruthenium, or ruthenium oxide is preferably used. A single layer or a stacked layer of the conductive material having a function of inhibiting passage of impurities such as water and hydrogen may be used. With use of the conductive material, impurities such as hydrogen and water can be inhibited from entering the oxide 230 through the conductor 240 from a layer above the insulator 281. A conductive material containing tungsten, copper, or aluminum as its main component is preferably used for the second conductor provided over the first conductor.

Since the oxide 243 is provided in contact with the bottom surface and the side surface of the conductor 240, the contact area between them is sufficiently large, and thus, an influence of an increase in the contact resistance due to contact between the metal and the semiconductor can be reduced. Since the conductor 240 is electrically connected to the oxide 230 through the oxide 243, electrically favorable connection is possible.

<Constituent Material of Semiconductor Device>

Constituent materials that can be used for the semiconductor device are described below.

<<Substrate>>

As a substrate where the transistor 200 is formed, an insulator substrate, a semiconductor substrate, or a conductor substrate is used, for example. Examples of the insulator substrate include a glass substrate, a quartz substrate, a sapphire substrate, a stabilized zirconia substrate (an yttria-stabilized zirconia substrate or the like), and a resin substrate. Examples of the semiconductor substrate include a semiconductor substrate using silicon, germanium, or the like as a material and a compound semiconductor substrate including silicon carbide, silicon germanium, gallium arsenide, indium phosphide, zinc oxide, or gallium oxide. Another example is a semiconductor substrate in which an insulator region is included in the semiconductor substrate, e.g., an SOI (Silicon On Insulator) substrate. Examples of the conductor substrate include a graphite substrate, a metal substrate, an alloy substrate, and a conductive resin substrate. Other examples include a substrate including a metal nitride and a substrate including a metal oxide. Other examples include an insulator substrate provided with a conductor or a semiconductor, a semiconductor substrate provided with a conductor or an insulator, and a conductor substrate provided with a semiconductor or an insulator. Alternatively, these substrates provided with elements may be used. Examples of the element provided for the substrate include a capacitor, a resistor, a switching element, a light-emitting element, and a memory element.

Alternatively, a flexible substrate may be used as the substrate. Note that as a method for providing a transistor over a flexible substrate, there is a method in which a transistor is formed over a non-flexible substrate and then the transistor is separated from the non-flexible substrate and transferred to the substrate that is a flexible substrate. In that case, a separation layer is preferably provided between the non-flexible substrate and the transistor. In addition, the substrate may have elasticity. Furthermore, the substrate may have a property of returning to its original shape when bending or pulling is stopped. Alternatively, the substrate may have a property of not returning to its original shape. The substrate has a region with a thickness of, for example, greater than or equal to 5 m and less than or equal to 700 m, preferably greater than or equal to 10 m and less than or equal to 500 m, further preferably greater than or equal to 15 m and less than or equal to 300 m. When the substrate has a small thickness, the weight of the semiconductor device including the transistor can be reduced. Moreover, when the substrate has a small thickness, even in the case of using glass or the like, the substrate may have elasticity or a property of returning to its original shape when bending or pulling is stopped. Thus, an impact applied to a semiconductor device over the substrate, which is caused by dropping or the like, can be reduced, for example. That is, a durable semiconductor device can be provided.

For the substrate that is a flexible substrate, for example, a metal, an alloy, a resin, glass, or fiber thereof can be used. As the substrate, a sheet, a film, a foil or the like that contains a fiber may also be used. The substrate that is a flexible substrate preferably has a lower coefficient of linear expansion because deformation due to an environment is inhibited. For the substrate that is a flexible substrate, for example, a material whose coefficient of linear expansion is lower than or equal to $1\times10^{-3}$/K, lower than or equal to $5\times10^{-5}$/K, or lower than or equal to $1\times10^{-5}$/K may be used. Examples of the resin include polyester, polyolefin, polyamide (e.g., nylon and aramid), polyimide, polycarbonate, and acrylic. In particular, aramid is suitable for the substrate that is a flexible substrate because of its low coefficient of linear expansion.

<<Insulator>>

Examples of an insulator include an insulating oxide, an insulating nitride, an insulating oxynitride, an insulating nitride oxide, an insulating metal oxide, an insulating metal oxynitride, and an insulating metal nitride oxide.

As miniaturization and high integration of transistors progress, for example, a problem such as leakage current may arise because of a thinner gate insulator. When a high-k material is used for the insulator functioning as a gate insulator, the voltage during operation of the transistor can be lowered while the physical thickness of the gate insulator is maintained. In contrast, when a material with a low relative permittivity is used for the insulator functioning as an interlayer film, parasitic capacitance generated between wirings can be reduced. Thus, a material is preferably selected depending on the function of an insulator.

Examples of the insulator with a high relative permittivity include gallium oxide, hafnium oxide, zirconium oxide, an oxide containing aluminum and hafnium, an oxynitride containing aluminum and hafnium, an oxide containing silicon and hafnium, an oxynitride containing silicon and hafnium, and a nitride containing silicon and hafnium.

Examples of the insulator with a low relative permittivity include silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, and a resin.

In particular, silicon oxide and silicon oxynitride are thermally stable. Accordingly, a stacked-layer structure, which is thermally stable and has a low relative permittivity, can be obtained by combination with a resin, for example. Examples of the resin include polyester, polyolefin, polyamide (e.g., nylon and aramid), polyimide, polycarbonate, and acrylic. Furthermore, a stacked-layer structure, which is thermally stable and has a high relative permittivity, can be obtained by combination of silicon oxide and silicon oxynitride with an insulator having a high relative permittivity, for example.

In addition, when a transistor using an oxide semiconductor is surrounded by an insulator having a function of inhibiting passage of oxygen and impurities such as hydrogen and water, the transistor can have stable electrical characteristics.

As the insulator having a function of inhibiting passage of oxygen and impurities such as water and hydrogen, for example, a single layer or a stacked layer of an insulator containing boron, carbon, nitrogen, oxygen, fluorine, phosphorus, chlorine, argon, silicon, aluminum, hafnium, magnesium, gallium, germanium, yttrium, zirconium, lanthanum, neodymium, tungsten, titanium, tantalum, or nickel may be used. Specifically, as the insulator having a function of inhibiting passage of oxygen and impurities such as hydrogen, a metal oxide such as aluminum oxide, hafnium oxide, magnesium oxide, gallium oxide, germanium oxide, yttrium oxide, zirconium oxide, lanthanum oxide, neodymium oxide, tungsten oxide, titanium oxide, tantalum oxide, or nickel oxide; a silicon nitride such as silicon nitride oxide or silicon nitride; or the like can be used.

For example, the insulator 224 functioning as the gate insulator is preferably an insulator including oxygen. When a structure is employed in which silicon oxide or silicon oxynitride including oxygen is in contact with the oxide 230, oxygen vacancies included in the oxide 230 can be compensated for.

For example, an insulator containing an oxide of one or more kinds of aluminum, hafnium, and gallium can be used as the insulator 222, which functions as part of the gate insulator. In particular, as the insulator containing an oxide of one or both of aluminum and hafnium, aluminum oxide, hafnium oxide, an oxide containing aluminum and hafnium (hafnium aluminate), or the like is preferably used.

With the above stacked-layer structure, on-state current can be increased without a reduction in the influence of the electric field from the gate electrode. Since the distance between the gate electrode and the region where a channel is formed is kept by the physical thickness of the gate insulator, leakage current between the gate electrode and the channel formation region can be inhibited. In addition, release of oxygen contained in the insulator 224 to the insulator 216 side can be inhibited.

The insulator 216, the insulator 280, and the insulator 281 preferably include a single layer or a stacked layer of an insulator with a low relative permittivity. For example, the insulator 216, the insulator 280, and the insulator 281 preferably include silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, a resin, or the like. Alternatively, the insulator 216, the insulator 280, and the insulator 281 preferably have a stacked-layer structure of a resin and silicon oxide, silicon oxynitride, silicon nitride oxide, silicon nitride, silicon oxide to which fluorine is added, silicon oxide to which carbon is added, silicon oxide to which carbon and nitrogen are added, or porous silicon oxide. When silicon oxide or silicon oxynitride, which is thermally stable, is combined with a resin, the stacked-layer structure can have thermal stability and a low relative permittivity. Examples of the resin include polyester, polyolefin, polyamide (nylon, aramid, or the like), polyimide, polycarbonate, and acrylic.

As the insulator 211, the insulator 212, the insulator 214, the insulator 272, and the insulator 241, an insulator having a function of inhibiting the passage of oxygen and impurities such as hydrogen and water is used. For the insulator 211, the insulator 212, the insulator 214, the insulator 272, and the insulator 241, for example, a metal oxide such as aluminum oxide, hafnium oxide, magnesium oxide, gallium oxide, germanium oxide, yttrium oxide, zirconium oxide, lanthanum oxide, neodymium oxide, tungsten oxide, titanium oxide, tantalum oxide, or nickel oxide; silicon nitride oxide; silicon nitride; or the like is used. Moreover, for the above insulator, a metal oxide such as an indium-gallium-zinc oxide in which the concentration of In is reduced or a metal oxide not containing In can be used.

<<Conductor>>

For the conductors, a material containing one or more kinds of metal elements selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, lanthanum, and the like can be used. A semiconductor having high electrical conductivity, typified by polycrystalline silicon containing an impurity element such as phosphorus, or silicide such as nickel silicide may be used.

A stack including a plurality of conductive layers formed of the above materials may be used. For example, a stacked-layer structure combining a material containing the above metal element and a conductive material containing oxygen may be employed. A stacked-layer structure combining a material containing the above metal element and a conductive material containing nitrogen may be employed. A stacked-layer structure combining a material containing the above metal element, a conductive material containing oxygen, and a conductive material containing nitrogen may be employed.

For the conductor 260, the conductor 205, and the conductor 240, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum; an alloy containing any of the above metal elements; an alloy containing a combination of the above metal elements; or the like. For example, it is preferable to use tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like. In addition, tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that retain their conductivity even after absorbing oxygen. A semiconductor having high electrical conductivity, typified by polycrystalline silicon containing an impurity element such as phosphorus, or silicide such as nickel silicide may be used.

<<Metal Oxide>>

As the oxide 230 and the oxide 243, a metal oxide functioning as an oxide semiconductor (hereinafter also referred to as an oxide semiconductor) is preferably used. A metal oxide that can be used as the oxide 230 and the oxide 243 of one embodiment of the present invention is described below.

The metal oxide preferably contains at least indium or zinc. In particular, indium and zinc are preferably contained. In addition, aluminum, gallium, yttrium, tin, or the like is preferably contained. Furthermore, one or more kinds selected from copper, vanadium, beryllium, boron, titanium, iron, nickel, germanium, zirconium, molybdenum, lanthanum, cerium, neodymium, hafnium, tantalum, tungsten, magnesium, and the like may be contained.

Here, the case where the metal oxide is an In-M-Zn oxide containing indium, the element M, and zinc is considered. Note that the element M is aluminum, gallium, yttrium, tin, or the like. Examples of other elements that can be used as the element M include copper, vanadium, beryllium, boron, titanium, iron, nickel, germanium, zirconium, molybdenum, lanthanum, cerium, neodymium, hafnium, tantalum, tungsten, and magnesium. Note that two or more of the above elements may be used in combination as the element M.

Note that in this specification and the like, a metal oxide containing nitrogen is also collectively referred to as a metal oxide in some cases. A metal oxide containing nitrogen may be referred to as a metal oxynitride.

[Composition of Metal Oxide]

The composition of a CAC (Cloud-Aligned Composite)-OS that can be used in a transistor disclosed in one embodiment of the present invention is described below.

Note that in this specification and the like, CAAC (c-axis aligned crystal) and CAC (Cloud-Aligned Composite) are sometimes stated. Note that CAAC refers to an example of a crystal structure, and CAC refers to an example of a function or a material composition.

A CAC-OS or a CAC-metal oxide has a conducting function in part of the material and has an insulating function in another part of the material; as a whole, the CAC-OS or the CAC-metal oxide has a function of a semiconductor. Note that in the case where the CAC-OS or the CAC-metal oxide is used in a semiconductor layer of a transistor, the conducting function is a function that allows electrons (or holes) serving as carriers to flow, and the insulating function is a function that does not allow electrons serving as carriers to flow. By the complementary action of the conducting function and the insulating function, a switching function (On/Off function) can be given to the CAC-OS or the CAC-metal oxide. In the CAC-OS or the CAC-metal oxide, separation of the functions can maximize each function.

In addition, the CAC-OS or the CAC-metal oxide includes conductive regions and insulating regions. The conductive regions have the above-described conducting function, and the insulating regions have the above-described insulating function. Furthermore, in some cases, the conductive regions and the insulating regions in the material are separated at the nanoparticle level. Furthermore, in some cases, the conductive regions and the insulating regions are unevenly distributed in the material. Furthermore, in some cases, the conductive regions are observed to be coupled in a cloud-like manner with their boundaries blurred.

Furthermore, in the CAC-OS or the CAC-metal oxide, the conductive regions and the insulating regions each have a size greater than or equal to 0.5 nm and less than or equal to 10 nm, preferably greater than or equal to 0.5 nm and less than or equal to 3 nm, and are dispersed in the material, in some cases.

Furthermore, the CAC-OS or the CAC-metal oxide includes components having different bandgaps. For example, the CAC-OS or the CAC-metal oxide includes a component having a wide gap due to the insulating region and a component having a narrow gap due to the conductive region. In the case of the structure, when carriers flow, carriers mainly flow in the component having a narrow gap. Furthermore, the component having a narrow gap complements the component having a wide gap, and carriers also flow in the component having a wide gap in conjunction with the component having a narrow gap. Therefore, in the case where the above-described CAC-OS or CAC-metal oxide is used for a channel formation region of a transistor, the transistor in the on state can achieve high current driving capability, that is, a high on-state current and high field-effect mobility.

In other words, the CAC-OS or the CAC-metal oxide can also be referred to as a matrix composite or a metal matrix composite.

[Structure of Metal Oxide]

Oxide semiconductors (metal oxides) are classified into a single crystal oxide semiconductor and a non-single-crystal oxide semiconductor. Examples of a non-single-crystal oxide semiconductor include a CAAC-OS (c-axis aligned crystalline oxide semiconductor), a polycrystalline oxide semiconductor, an nc-OS (nanocrystalline oxide semiconductor), an amorphous-like oxide semiconductor (a-like OS), and an amorphous oxide semiconductor.

The CAAC-OS has c-axis alignment, a plurality of nanocrystals are connected in the a-b plane direction, and its crystal structure has distortion. Note that the distortion refers to a portion where the direction of a lattice arrangement changes between a region with a regular lattice arrangement and another region with a regular lattice arrangement in a region where the plurality of nanocrystals are connected.

The nanocrystal is basically a hexagon but is not always a regular hexagon and is a non-regular hexagon in some cases. Furthermore, a pentagonal or heptagonal lattice arrangement, for example, is included in the distortion in some cases. Note that it is difficult to observe a clear crystal grain boundary (also referred to as grain boundary) even in the vicinity of distortion in the CAAC-OS. That is, formation of a crystal grain boundary is found to be inhibited by the distortion of a lattice arrangement. This is because the CAAC-OS can tolerate distortion owing to a low density of arrangement of oxygen atoms in the a-b plane direction, an interatomic bond length changed by substitution of a metal element, and the like.

The CAAC-OS tends to have a layered crystal structure (also referred to as a layered structure) in which a layer containing indium and oxygen (hereinafter, an In layer) and a layer containing the element M, zinc, and oxygen (hereinafter, an (M,Zn) layer) are stacked. Note that indium and the element M can be replaced with each other, and when the element M in the (M,Zn) layer is replaced with indium, the layer can also be referred to as an (In,M,Zn) layer. Furthermore, when indium in the In layer is replaced with the element M, the layer can be referred to as an (In,M) layer.

The CAAC-OS is a metal oxide with high crystallinity. On the other hand, a clear crystal grain boundary is difficult to observe in the CAAC-OS; thus, it can be said that a reduction in electron mobility due to the crystal grain boundary is unlikely to occur. Entry of impurities, formation of defects, or the like might decrease the crystallinity of a metal oxide; thus, it can be said that the CAAC-OS is a metal oxide that has small amounts of impurities and defects (e.g., oxygen vacancies (also referred to as Vo)). Thus, a metal oxide including a CAAC-OS is physically stable. Therefore, the metal oxide including a CAAC-OS is resistant to heat and has high reliability.

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor by some analysis methods.

Note that indium-gallium-zinc oxide (hereinafter referred to as IGZO), which is a kind of metal oxide containing indium, gallium, and zinc, has a stable structure in some cases by being formed of the above-described nanocrystals. In particular, crystals of IGZO tend not to grow in the air and thus, a stable structure is obtained when IGZO is formed of smaller crystals (e.g., the above-described nanocrystals) rather than larger crystals (here, crystals with a size of several millimeters or several centimeters).

An a-like OS is a metal oxide having a structure between those of the nc-OS and an amorphous oxide semiconductor. The a-like OS contains a void or a low-density region. That is, the a-like OS has low crystallinity compared with the nc-OS and the CAAC-OS.

An oxide semiconductor (metal oxide) can have various structures that show different properties. Two or more of the amorphous oxide semiconductor, the polycrystalline oxide semiconductor, the a-like OS, the nc-OS, and the CAAC-OS may be included in an oxide semiconductor of one embodiment of the present invention.

[Transistor Including Metal Oxide]

Next, the case where the above metal oxide is used in a channel formation region of a transistor is described.

Note that when the above metal oxide is used in a channel formation region of a transistor, a transistor having high field-effect mobility can be achieved. In addition, a transistor having high reliability can be achieved.

Furthermore, a metal oxide with low carrier density is preferably used for a channel formation region of the transistor. In the case where the carrier density of a metal oxide film is reduced, the impurity concentration in the metal oxide film is reduced to reduce the density of defect states. In this specification and the like, a state with a low impurity concentration and a low density of defect states is referred to as a highly purified intrinsic or substantially highly purified intrinsic state. For example, a metal oxide has a carrier density lower than $8 \times 10^{11}/cm^3$, preferably lower than $1 \times 10^{11}/cm^3$, and further preferably lower than $1 \times 10^{10}/cm^3$, and higher than or equal to $1 \times 10^{-9}/cm^3$.

Moreover, a highly purified intrinsic or substantially highly purified intrinsic metal oxide film has a low density of defect states and accordingly may have a low density of trap states.

Charges trapped by the trap states in the metal oxide take a long time to be released and may behave like fixed charges. Thus, a transistor whose channel formation region includes a metal oxide having a high density of trap states has unstable electrical characteristics in some cases.

Accordingly, in order to obtain stable electrical characteristics of the transistor, it is effective to reduce the impurity concentration in the metal oxide. In addition, in order to reduce the impurity concentration in the metal oxide, the impurity concentration in an adjacent film is also preferably reduced. Examples of impurities include hydrogen, nitrogen, an alkali metal, an alkaline earth metal, iron, nickel, and silicon.

[Impurities]

Here, the influence of each impurity in the metal oxide is described.

When silicon or carbon that is a Group 14 element is contained in the metal oxide, defect states are formed in the metal oxide. Thus, the concentration of silicon or carbon in the metal oxide and the concentration of silicon or carbon near an interface with the metal oxide (the concentration measured by secondary ion mass spectrometry (SIMS)) are set to lower than or equal to $2 \times 10^{18}$ atoms/cm³, preferably lower than or equal to $2 \times 10^{17}$ atoms/cm³.

When the metal oxide contains an alkali metal or an alkaline earth metal, defect states are formed and carriers are generated in some cases. Thus, a transistor using a metal oxide that contains an alkali metal or an alkaline earth metal for its channel formation region is likely to have normally-on characteristics. Therefore, it is preferable to reduce the concentration of an alkali metal or an alkaline earth metal in the metal oxide. Specifically, the concentration of an alkali metal or an alkaline earth metal in the metal oxide obtained by SIMS is set lower than or equal to $1 \times 10^{18}$ atoms/cm³, preferably lower than or equal to $2 \times 10^{16}$ atoms/cm³.

Furthermore, when containing nitrogen, the metal oxide easily becomes n-type by generation of electrons serving as carriers and an increase in carrier density. As a result, a transistor using a metal oxide containing nitrogen for its channel formation region is likely to have normally-on characteristics. Thus, nitrogen in the channel formation region of the metal oxide is preferably reduced as much as possible. For example, the nitrogen concentration in the metal oxide is set lower than $5 \times 10^{19}$ atoms/cm³, preferably lower than or equal to $5 \times 10^{18}$ atoms/cm³, further preferably lower than or equal to $1 \times 10^{18}$ atoms/cm³, and still further preferably lower than or equal to $5 \times 10^{17}$ atoms/cm³ in SIMS.

Hydrogen contained in a metal oxide reacts with oxygen bonded to a metal atom to be water, and thus forms an oxygen vacancy in some cases. When hydrogen enters the oxygen vacancy, an electron which is a carrier is generated in some cases. Furthermore, bonding of part of hydrogen to oxygen bonded to a metal atom causes generation of an electron serving as a carrier in some cases. Thus, a transistor using the metal oxide that contains hydrogen is likely to have normally-on characteristics.

Hydrogen contained in the metal oxide forms shallow defect states (sDOS: shallow level Density of States) in the metal oxide in some cases. Shallow defect states refer to interface states near the conduction band minimum. Shallow defect states probably exist near the boundary between a high-density region and a low-density region in the metal oxide. Here, the high-density region and the low-density region in the metal oxide are distinguished by the amounts of hydrogen contained in the regions. That is, the high-density region contains more hydrogen than the low-density region. It is probable that near the boundary between the high-density region and the low-density region in the metal oxide, stress distortion between the regions easily causes minute cracks, oxygen vacancies and dangling bonds of indium are generated near the cracks, and impurities such as hydrogen and water are localized there to form shallow defect states.

The high-density region in the metal oxide sometimes has higher crystallinity than the low-density region. Furthermore, the high-density region in the metal oxide sometimes has higher film density than the low-density region. When the metal oxide has a composition containing indium, gallium, and zinc, the high-density region contains indium, gallium, and zinc and the low-density region contains indium and zinc, in some cases. In other words, the proportion of gallium in the low-density region is lower than that in the high-density region in some cases.

Note that the above shallow defect states probably result from oxygen vacancies. When oxygen vacancies in the metal oxide increase, the density of deep defect states (dDOS: deep level Density of States) as well as the density of shallow defect states probably increase. This is because deep defect states also result from oxygen vacancies. Note that deep defect states refer to defect states that are located around the center of the band gap.

Therefore, a reduction in the number of oxygen vacancies in the metal oxide can lead to a reduction in the density of both shallow defect states and deep defect states. Furthermore, shallow defect states can possibly be controlled to some extent by adjusting the temperature at the time of deposition of the metal oxide. Specifically, the temperature at the time of deposition of the metal oxide is set to 170° C. or its vicinity, preferably 130° C. or its vicinity, further preferably room temperature, whereby the density of shallow defect states can be reduced.

Shallow defect states in a metal oxide affect the electrical characteristics of the transistor that uses the metal oxide for a semiconductor layer. That is, owing to shallow defect states, the drain current $I_d$ changes gently with respect to the gate voltage $V_g$ in the drain current-gate voltage ($I_d$-$V_g$) characteristics of the transistor, worsening the S value (also referred to as Subthreshold Swing, or SS), which is a criterion for judging the rising characteristics of a transistor from an off state to an on state. This is probably because of trapping of electrons by shallow defect states.

Accordingly, hydrogen in the metal oxide is preferably reduced as much as possible. Specifically, the hydrogen concentration of the metal oxide obtained by SIMS is set lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$. When a metal oxide in which the impurities are sufficiently reduced is used in a channel formation region of a transistor, stable electrical characteristics can be given.

<Method for Manufacturing Semiconductor Device>

Next, a method for manufacturing a semiconductor device including the transistor 200 of the present invention is described with reference to FIG. 2A to FIG. 18D. In FIG. 2A to FIG. 18D, A of each drawing is a top view. Moreover, B of each drawing is a cross-sectional view corresponding to a portion indicated by the dashed-dotted line A1-A2 in A of each drawing. C of each drawing is a cross-sectional view corresponding to a portion indicated by the dashed-dotted line A3-A4 in A of each drawing. D of each drawing is a cross-sectional view corresponding to a portion indicated by the dashed-dotted line A5-A6 in A of each drawing.

First, a substrate (not illustrated) is prepared, and the insulator 211 and the insulator 212 are deposited over the substrate. The insulator 212 can be deposited by a sputtering method, a chemical vapor deposition (CVD) method, a molecular beam epitaxy (MBE) method, a pulsed laser deposition (PLD) method, an atomic layer deposition (ALD) method, or the like.

Note that the CVD method can be classified into a plasma enhanced CVD (PECVD) method using plasma, a thermal CVD (TCVD) method using heat, a photo CVD method using light, and the like. Moreover, the CVD method can be classified into a metal CVD (MCVD) method and a metal organic CVD (MOCVD) method depending on a source gas to be used.

In particular, an ALD method has excellent step coverage and excellent thickness uniformity and thus is suitable for covering a surface of an opening portion with a high aspect ratio, for example. On the other hand, an ALD method has a relatively low deposition rate, and thus is preferably used in combination with another deposition method with a high deposition rate, such as a CVD method, in some cases.

In this embodiment, for the insulator 211, silicon nitride is deposited by a sputtering method, a CVD method, or an ALD method. For the insulator 212, silicon nitride is deposited by a sputtering method, a CVD method, or an ALD method. The insulator 211 and the insulator 212 are preferably deposited by different methods. For example, silicon nitride is deposited by a CVD method for the insulator 211, and silicon nitride is deposited by a sputtering method for the insulator 212.

Next, the insulator 214 is deposited over the insulator 212. For the insulator 214, aluminum oxide is deposited by a sputtering method. In addition, the insulator 214 may have a multilayer structure. For example, a structure may be employed in which aluminum oxide is deposited by a sputtering method and aluminum oxide is deposited over the aluminum oxide by an ALD method. Alternatively, a structure may be employed in which aluminum oxide is deposited by an ALD method and aluminum oxide is deposited over the aluminum oxide by a sputtering method.

Next, the insulator 216 is deposited over the insulator 214. The insulator 216 can be deposited by a sputtering method, a CVD method, an MBE method, a PLD method, an ALD method, or the like. In this embodiment, for the insulator 216, silicon oxide or silicon oxynitride is deposited by a CVD method.

Then, openings are formed in the insulator 216. A groove and a slit, for example, are included in the category of the opening. A region where an opening is formed is referred to as an opening portion in some cases. A wet etching method may be used for the formation of the opening; however, a dry etching method is preferable for microfabrication. As the insulator 214, it is preferable to select an insulator that functions as an etching stopper used in forming the opening by etching the insulator 216. For example, in the case where silicon oxide is used for the insulator 216 in which the opening is formed, the insulator 214 is preferably formed using aluminum oxide, hafnium oxide, or silicon nitride as the insulator that functions as an etching stopper.

After the formation of the opening, a conductive film to be the conductor 205a is deposited. The conductive film preferably includes a conductive material that has a function of inhibiting passage of oxygen. For example, tantalum nitride, tungsten nitride, or titanium nitride can be used. Alternatively, a stacked-layer film of the conductor and tantalum, tungsten, titanium, molybdenum, aluminum, copper, or a molybdenum-tungsten alloy can be used. The conductive film to be the conductor 205a can be deposited by a sputtering method, a CVD method, an MBE method, a PLD method, an ALD method, or the like.

In this embodiment, as the conductive film to be the conductor 205a, titanium nitride is deposited by a CVD method.

The conductor 205a may have a stacked-layer structure, and as a method for forming the conductor 205a, tantalum nitride may be deposited by a sputtering method and titanium nitride may be successively deposited by a CVD method.

Next, a conductive film to be the conductor 205b is deposited over the conductive film to be the conductor 205a. The conductive film can be deposited by a sputtering method, a CVD method, an MBE method, a PLD method, an ALD method, or the like.

In this embodiment, for the conductive film to be the conductor 205b, tungsten is deposited by a CVD method.

Next, chemical mechanical polishing (CMP) treatment is performed, thereby removing part of the conductive film to be the conductor 205a and part of the conductive film to be the conductor 205b to expose the insulator 216. As a result, the conductive films to be the conductor 205a and the conductor 205b remain only in the opening portion. Accordingly, the conductor 205 including the conductor 205a and the conductor 205b, which has a planar top surface, can be formed (see FIG. 2A to FIG. 2D). Note that the insulator 216 is partly removed by the CMP treatment in some cases.

Next, the insulator 222 is deposited over the insulator 216 and the conductor 205. An insulator containing an oxide of one or both of aluminum and hafnium is preferably deposited as the insulator 222. Note that as the insulator containing an oxide of one or both of aluminum and hafnium, aluminum oxide, hafnium oxide, an oxide containing aluminum and hafnium (hafnium aluminate), or the like is preferably used. The insulator containing an oxide of one or both of aluminum and hafnium has a barrier property against oxygen, hydrogen, and water. When the insulator 222 has a barrier property against hydrogen and water, hydrogen and water contained in components provided around the transistor 200 are inhibited from diffusing into the transistor 200 through the insulator 222, and generation of oxygen vacancies in the oxide 230 can be inhibited.

The insulator 222 can be deposited by a sputtering method, a CVD method, an MBE method, a PLD method, an ALD method, or the like. A film formed by an ALD method has good coverage. In contrast, a film formed by a sputtering method can have lower hydrogen concentration than that formed by other methods, which is preferable. The deposition method may be selected in accordance with characteristics required for the device.

Next, the insulator 224 is deposited over the insulator 222. The insulator 224 can be deposited by a sputtering method, a CVD method, an MBE method, a PLD method, an ALD method, or the like. In this embodiment, for the insulator 224, silicon oxide is deposited by a sputtering method. Furthermore, silicon oxide or silicon oxynitride may be deposited by a CVD method.

Sequentially, heat treatment is preferably performed. The heat treatment is performed at a temperature higher than or equal to 250° C. and lower than or equal to 650° C., preferably higher than or equal to 300° C. and lower than or equal to 500° C., further preferably higher than or equal to 320° C. and lower than or equal to 450° C. The heat treatment is performed in a nitrogen atmosphere, an inert gas atmosphere, or an atmosphere containing an oxidizing gas at higher than or equal to 10 ppm, higher than or equal to 1%, or higher than or equal to 10%. The heat treatment may be performed under reduced pressure. Alternatively, the heat treatment may be performed in such a manner that heat treatment is performed in nitrogen or an inert gas atmosphere, and then another heat treatment is performed in an atmosphere containing an oxidizing gas at higher than or equal to 10 ppm, higher than or equal to 1%, or higher than or equal to 10% in order to compensate for released oxygen.

In this embodiment, as the heat treatment, treatment is performed in a nitrogen atmosphere at 400° C. for one hour after deposition of the insulator 224. By the above heat treatment, impurities such as hydrogen and water contained in the insulator 224 can be removed, for example.

The heat treatment can be performed after deposition of the insulator 222. For the heat treatment, the above heat treatment conditions can be used.

Here, to make the insulator 224 contain a large amount of oxygen, plasma treatment containing oxygen may be performed under reduced pressure. The plasma treatment containing oxygen is preferably performed using an apparatus including a power source for generating high-density plasma using microwaves, for example. Alternatively, a power source for applying an RF (Radio Frequency) to the substrate side may be included. The use of high-density plasma enables high-density oxygen radicals to be produced, and RF application to the substrate side allows the oxygen radicals generated by the high-density plasma to be efficiently introduced into the insulator 224. Alternatively, after plasma treatment containing an inert gas is performed using this apparatus, plasma treatment containing oxygen may be performed to compensate for released oxygen. Note that impurities such as hydrogen and water contained in the insulator 224 can be removed by selecting the conditions for the plasma treatment appropriately. In that case, the heat treatment does not need to be performed.

Next, an oxide film 230A is deposited over the insulator 224 (see FIG. 2A to FIG. 2D).

The oxide film 230A can be deposited by a sputtering method, a CVD method, an MBE method, a PLD method, an ALD method, or the like. The thickness of the oxide film 230A is greater than or equal to 40 nm and less than or equal to 400 nm, preferably less than or equal to 60 nm and less than or equal to 200 nm, further preferably greater than or equal to 75 nm and less than or equal to 160 nm.

In the case where the oxide film 230A is deposited by a sputtering method, for example, oxygen or a mixed gas of oxygen and a rare gas is used as a sputtering gas. Increasing the proportion of oxygen contained in the sputtering gas can increase the amount of excess oxygen in the deposited oxide films. In the case where the oxide film 230A is deposited by a sputtering method, an In-M-Zn oxide target can be used, for example.

In particular, the oxide film 230A preferably contains a large amount of oxygen. Therefore, the proportion of oxygen in the sputtering gas for the oxide film 230A is preferably 70% or higher, further preferably 80% or higher, still further preferably 100%.

In contrast, in the case where the oxide film 230A is an oxygen-deficient oxide semiconductor, the proportion of oxygen contained in the sputtering gas is preferably higher than or equal to 1% and lower than or equal to 30%, preferably higher than or equal to 5% and lower than or equal to 20% for deposition. In a transistor using an oxygen-deficient oxide semiconductor for its channel formation region, relatively high field-effect mobility can be obtained.

In the case where the oxide film 230A is deposited by an ALD method, a precursor containing In, a precursor containing M, and a precursor containing Zn can be used. A precursor containing two or more of In, M, and Zn may be used. The oxide film 230A may be deposited by introducing the above precursors sequentially or simultaneously in a reaction chamber in which the substrate is placed and then performing a step of introducing an oxidizing agent repeatedly; or the oxide film 230A may be deposited by repeating a step of introducing each precursor and introducing the oxidizing agent.

In this embodiment, the oxide film 230A can be deposited by a sputtering method using a target with In:Ga:Zn=4:2:4.1, 5:1:6, 5:1:3, 10:1:3, or 1:1:1 [each of them shows the atomic ratio], or a target such as an In—Zn oxide or an indium oxide. Note that each of the oxide films is formed to have characteristics required for the oxide 230 by selecting the deposition condition and the atomic ratio as appropriate.

Next, heat treatment may be performed. For the heat treatment, the above-described heat treatment conditions can be employed. Through the heat treatment, impurities such as hydrogen and water in the oxide film 230A can be removed, for example. In this embodiment, treatment is performed at 400° C. in a nitrogen atmosphere for one hour, and successively another treatment is performed at 400° C. in an oxygen atmosphere for one hour.

Next, a mask 232 (a mask 232a and a mask 232b) is formed over the oxide film 230A (see FIG. 2A to FIG. 2D). The mask 232a is preferably formed using a material containing a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum; an alloy containing any of the above metal elements; or an alloy containing a combination of the above metal elements. For example, for the mask 232a, it is preferable to use tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like. Note that the mask 232a can be formed by a sputtering method, a CVD method, an MBE method, a PLD method, an ALD method, or the like.

An insulator containing carbon may be used for the mask 232a. The mask 232a may have a stacked-layer structure including a material containing any of the above metal elements and an insulator containing carbon over the material containing any of the above metal elements.

A resist mask can be used as the mask 232b.

The mask 232a and the mask 232b are formed by a lithography method.

In a lithography method, first, a resist is formed over a film containing a material to be the mask 232a and exposed to light through a mask. Next, a region exposed to light is removed or left using a developer to form the mask 232b formed of the resist mask. Next, the film containing a material to be the mask 232a is subjected to etching treatment through the mask 232b, whereby the mask 232a can be formed. A dry etching method or a wet etching method can be used in formation of the mask 232a. Processing by a dry etching method is suitable for microfabrication. The mask 232b is formed by, for example, exposure of the resist to KrF excimer laser light, ArF excimer laser light, EUV (Extreme Ultraviolet) light, or the like. Alternatively, a liquid immersion technique may be employed in which a gap between a substrate and a projection lens is filled with liquid (e.g., water) in light exposure. Alternatively, an electron beam or an ion beam may be used instead of the light. Note that the above mask for the exposure of the resist to light is unnecessary in the case of using an electron beam or an ion beam because direct writing is performed on the resist. Note that the mask 232b mask can be removed by, for example, performing dry etching treatment such as ashing, performing wet etching treatment, performing wet etching treatment after dry etching treatment, or performing dry etching treatment after wet etching treatment.

Next, the oxide film 230A is etched using the mask 232 to form an oxide 230B (see FIG. 3A to FIG. 3D). The oxide 230B may be formed after the mask 232b is removed or formed with the mask 232b left. In the latter case, the mask 232b sometimes disappears during the etching. Moreover, the insulator 224 is partly removed by the processing in some cases. The mask 232a is removed by etching after the etching of the oxide film 230A.

As a dry etching apparatus, a capacitively coupled plasma (CCP) etching apparatus including parallel plate electrodes can be used. The capacitively coupled plasma etching apparatus including the parallel plate electrodes may have a structure in which a high-frequency power is applied to one of the parallel plate electrodes. Alternatively, a structure may be employed in which different high-frequency powers are applied to one of the parallel plate electrodes. Alternatively, a structure may be employed in which high-frequency powers with the same frequency are applied to the parallel plate electrodes. Alternatively, a structure may be employed in which high-frequency powers with different frequencies are applied to the parallel plate electrodes. Alternatively, a dry etching apparatus including a high-density plasma source can be used. As the dry etching apparatus including a high-density plasma source, an inductively coupled plasma (ICP) etching apparatus or the like can be used, for example.

Here, the oxide 230B is formed to at least partly overlap with the conductor 205. It is preferable that the side surface of the oxide 230B be tapered with respect to a top surface of the insulator 222 or a top surface of the substrate. When the side surface of the oxide 230B is tapered with respect to the top surface of the insulator 222 or the top surface of the substrate, forming a film on the side surface of the oxide 230B or removing the film formed on the side surface can be easily performed in a later step.

The oxide 230B has a curved surface between the side surface and the top surface. That is, an end portion of the side surface and an end portion of the top surface are preferably curved (hereinafter such a curved shape is also referred to as a rounded shape). The radius of curvature of the curved surface at an end portion of the oxide 230B is greater than or equal to 3 nm and less than or equal to 10 nm, preferably greater than or equal to 5 nm and less than or equal to 6 nm, for example. When the end portions are not angular, coverage with films in later deposition steps is improved.

Note that for the processing of the oxide film 230A, a dry etching method or a wet etching method using the mask 232 can be used. Processing by a dry etching method is suitable for microfabrication.

In some cases, treatment such as dry etching described above makes impurities due to an etching gas or the like to attach to the side surface or to be diffused into the oxide 230B and the like. Examples of the impurities include fluorine and chlorine.

In order to remove the impurities, cleaning is performed. Examples of the cleaning method include wet cleaning using a cleaning solution, plasma treatment using plasma, and cleaning by heat treatment, and any of these cleanings may be performed in appropriate combination.

As the wet cleaning, cleaning treatment may be performed using an aqueous solution obtained by diluting an oxalic acid, a phosphoric acid, hydrogen peroxide water, a hydrofluoric acid, or the like with pure water or carbonated water. Alternatively, ultrasonic cleaning using the above aqueous solution, pure water, or carbonated water may be performed. In this embodiment, ultrasonic cleaning using an aqueous solution in which hydrofluoric acid is diluted with pure water is performed.

Next, heat treatment may be performed. For the heat treatment, the conditions for the above-described heat treatment can be used.

Next, the insulator 272 is deposited over the insulator 224 and the oxide 230B (see FIG. 4A to FIG. 4D). Note that the insulator 272 preferably has a barrier property, and an insulator including a metal oxide such as aluminum oxide, hafnium oxide, magnesium oxide, gallium oxide, germanium oxide, yttrium oxide, zirconium oxide, lanthanum oxide, neodymium oxide, tungsten oxide, titanium oxide, tantalum oxide, or nickel oxide; silicon nitride oxide; silicon nitride; or the like is preferably deposited for the insulator 272. An oxide containing aluminum and hafnium (hafnium aluminate), or the like can be used for the insulator containing both aluminum and hafnium. Moreover, a metal oxide such as an indium-gallium-zinc oxide in which the concentration of In is reduced or a metal oxide not containing In can be used. The insulator 272 can be deposited by a sputtering method, a CVD method, an MBE method, a PLD method, an ALD method, or the like.

Furthermore, the insulator 272 may have a stacked-layer structure of two or more layers. In that case, the layers in the insulator 272 may be formed using different materials. Furthermore, the layers in the insulator 272 can be formed by different methods. For example, aluminum oxide formed by a sputtering method can be used for a lower layer of the insulator 272, and aluminum oxide formed by an ALD method can be used for an upper layer of the insulator 272.

Then, the insulator 280 is deposited over the insulator 272 (see FIG. 5A to FIG. 5D). The insulator 280 preferably includes an insulator with a low relative permittivity. For example, the insulator 280 preferably includes silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, a resin, or the like. Silicon oxide and silicon oxynitride are preferable because of their thermal stability. The insulator 280 can be deposited by a sputtering method, a CVD method, an MBE method, a PLD method, an ALD method, or the like. Alternatively, the insulator 280 can be deposited by a spin coating method, a dipping method, a droplet discharging method (e.g., an ink-jet method), a printing method (e.g., screen printing or offset printing), a doctor knife method, a roll coater method, a curtain coater method, or the like.

In addition, the insulator 280 may have a stacked-layer structure of two or more layers. In that case, the layers in the insulator 280 may be formed using different materials. Furthermore, the layers in the insulator 280 can be formed by different methods.

In this embodiment, silicon oxide is deposited by a sputtering method as a lower layer of the insulator 280, and silicon oxynitride is deposited by a CVD method as an upper layer of the insulator 280. When the lower layer of the insulator 280 is formed by a sputtering method, the hydrogen concentration in the insulator 280 can be reduced, which is preferable. When the upper layer of the insulator 280 is formed by a CVD method, the insulator 280 can be formed with good coverage, which is preferable.

Note that the insulator 280 is preferably formed to have a flat top surface. For example, the insulator 280 may have a flat top surface right after the deposition. Alternatively, for example, the insulator 280 may have flatness by removing an insulator or the like from the top surface after the deposition so that the top surface becomes parallel to a reference surface such as a rear surface of the substrate. Such treatment is referred to as planarization treatment, and the obtained film is referred to as a planarization film in some cases. Examples of the planarization treatment include CMP treatment and dry etching treatment. In this embodiment, CMP treatment is used as the planarization treatment. Note that the insulator 280 does not necessarily have a flat top surface.

Then, the insulator 280 is processed, whereby an opening 245 is formed to include a region overlapping with at least the conductor 205 (see FIG. 6A to FIG. 6D). To form the opening, a wet etching method or dry etching method using a resist mask or a hard mask can be used. Note that a dry etching method is preferably used because it enables microfabrication and enables the side surface of the insulator 280 to be processed substantially vertically. In the processing of the insulator 280, the insulator 272 preferably functions as an etching stopper.

Next, processing is performed on the insulator 272 in the opening 245 (see FIG. 7A to FIG. 7D). The insulator 272 provided on the side surface of the oxide 230B needs to be removed in the processing; therefore, wet etching capable of isotropic etching or plasma etching is preferably used. By the processing, the top surface and the side surface of the oxide 230B, and part of a surface of the insulator 224 are exposed. Furthermore, part of the insulator 224 is etched by the processing, so that the insulator 224 is reduced in thickness or part of the insulator 222 is exposed in some cases. In the case where a hard mask is used for the processing, it is preferable that the hard mask be also removed by the processing. In contrast, the hard mask may remain over the insulator 280, and in that case, it is removed in a polish step of the conductor 260 and the like, which is a later step.

Figure 8A:
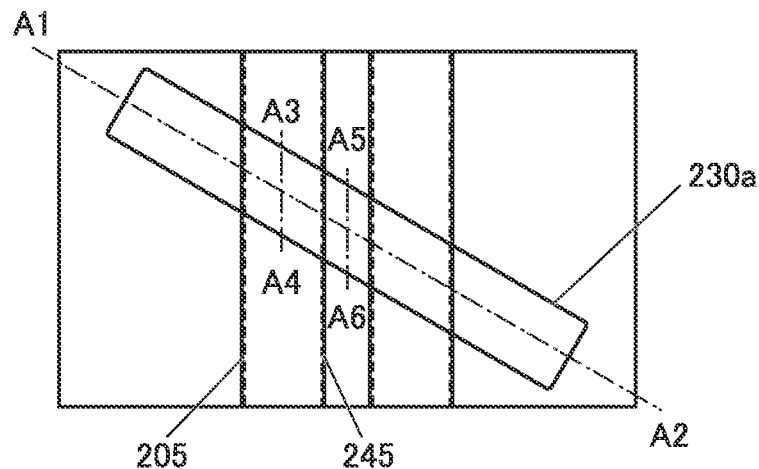
FIG. 8A is a top view showing a method for manufacturing a semiconductor device of one embodiment of the present invention.
Figure 8B:
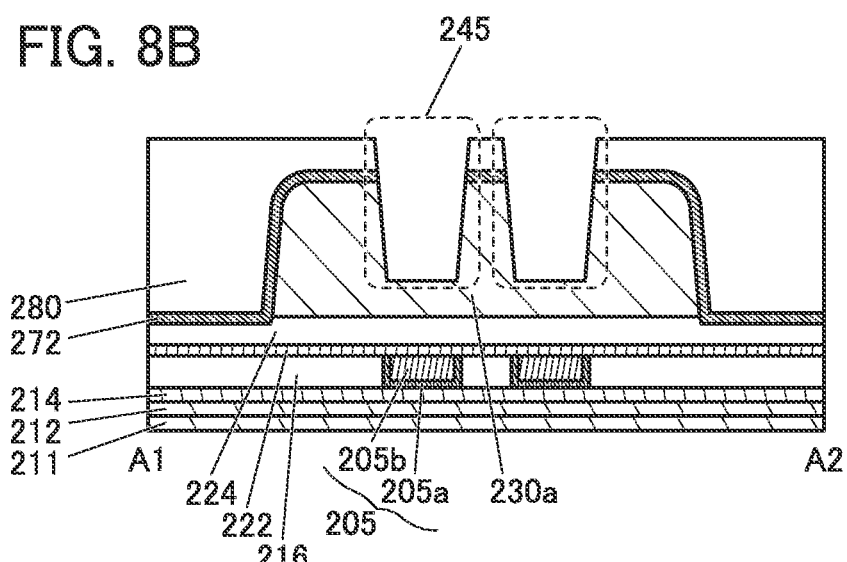
FIG. 8B to FIG. 8D are cross-sectional views showing a method for manufacturing the semiconductor device of one embodiment of the present invention.
Figure 8C:
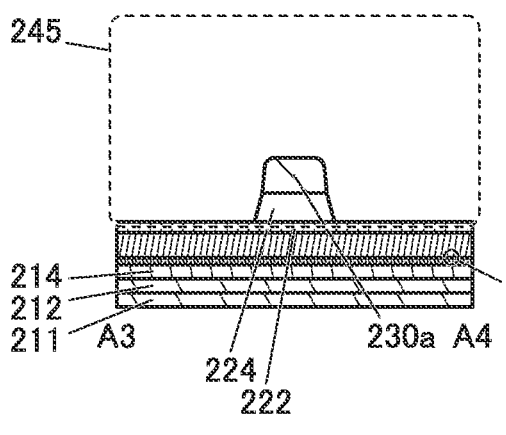
Figure 8D:
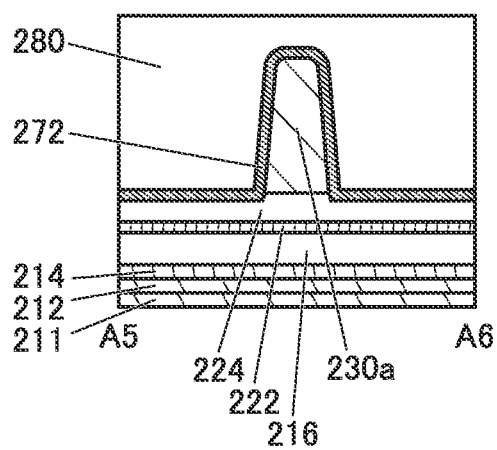

Next, the oxide 230B in the opening 245 is subjected to processing to form the oxide 230a (see FIG. 8A to FIG. 8D). In the processing, a wet etching method or a dry etching method can be used. Note that in the processing, anisotropic etching of the oxide 230B and the thickness control of the oxide 230a after the processing are required, and thus, it is preferable to use a dry etching method that excels in controllability in processing. As shown in FIG. 8B, the oxide 230a having a concave portion is formed by the processing. The thickness of the oxide 230a in the opening 245 is greater than or equal to 5 nm and less than or equal to 100 nm, preferably greater than or equal to 10 nm and less than or equal to 50 nm, further preferably greater than or equal to 15 nm and less than or equal to 30 nm. Furthermore, part of the insulator 224 is etched by the processing, so that the insulator 224 is reduced in thickness or part of the insulator 222 is exposed in some cases.

Note that the conductor 260 formed in a later step is positioned in a self-aligning manner in the opening 245, i.e., in the concave portion of the oxide 230a.

Here, heat treatment is preferably performed. The heat treatment is performed at a temperature higher than or equal to 250° C. and lower than or equal to 650° C., preferably higher than or equal to 300° C. and lower than or equal to 500° C., further preferably higher than or equal to 320° C. and lower than or equal to 450° C. Note that the heat treatment is performed in a nitrogen or inert gas atmosphere. The heat treatment may be performed in an atmosphere containing oxygen. The heat treatment may be performed in an atmosphere containing oxygen in addition to nitrogen or an inert gas, for example. The heat treatment may be performed under reduced pressure. For example, as the heat treatment, treatment is performed at 400° C. in a nitrogen atmosphere for one hour.

Through the heat treatment, impurities such as hydrogen and water contained in the oxide 230a can be removed. Furthermore, damages that have been caused in the oxide 230a by the dry etching in the above processing can be recovered. In the case where the heat treatment is performed in an oxygen-containing atmosphere, oxygen can be added to the oxide 230a. By the heat treatment, oxygen contained in the insulator 224 is diffused into the oxide 230a in some cases. Alternatively, the heat treatment may be performed in such a manner that heat treatment is performed in a nitrogen or inert gas atmosphere, and then another heat treatment is performed in an atmosphere containing an oxidizing gas at 10 ppm or more, 1% or more, or 10% or more. The heat treatment is performed at a temperature higher than or equal to 250° C. and lower than or equal to 650° C., preferably higher than or equal to 300° C. and lower than or equal to 500° C., further preferably higher than or equal to 320° C. and lower than or equal to 450° C.

Figure 9A:
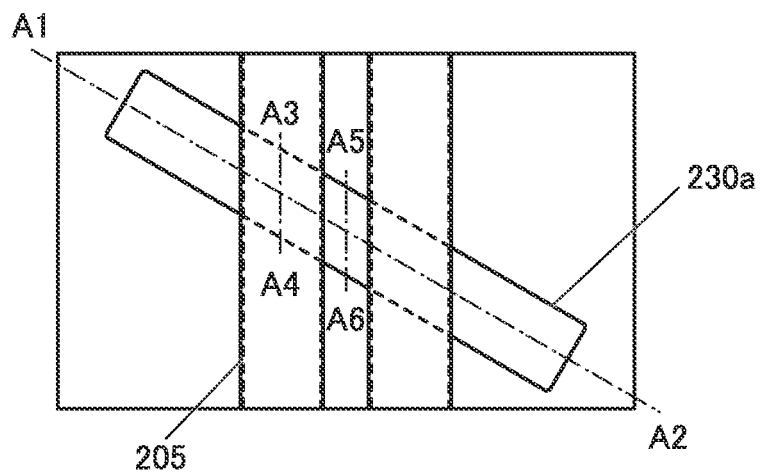
FIG. 9A is a top view showing a method for manufacturing a semiconductor device of one embodiment of the present invention.
Figure 9B:
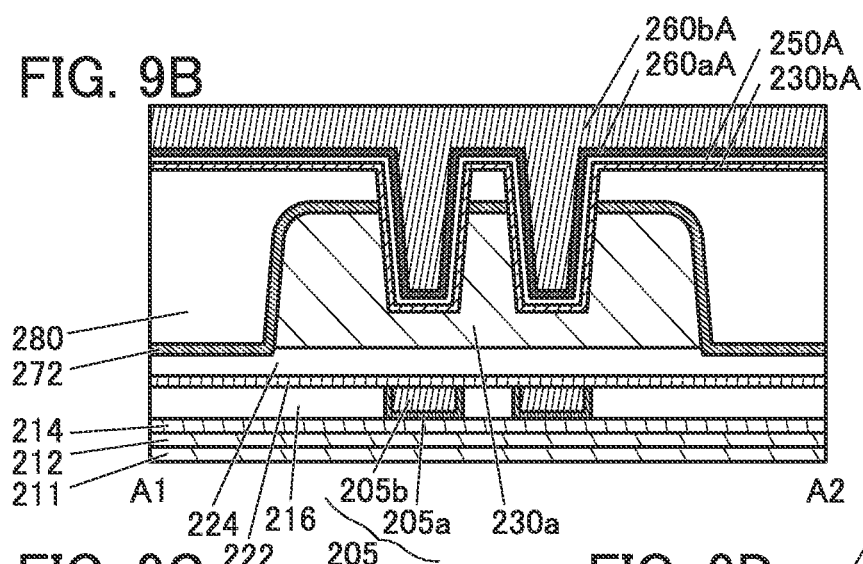
FIG. 9B to FIG. 9D are cross-sectional views showing a method for manufacturing the semiconductor device of one embodiment of the present invention.
Figure 9C:
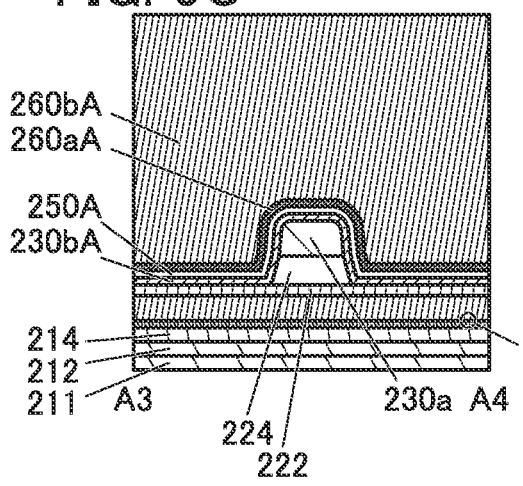
Figure 9D:
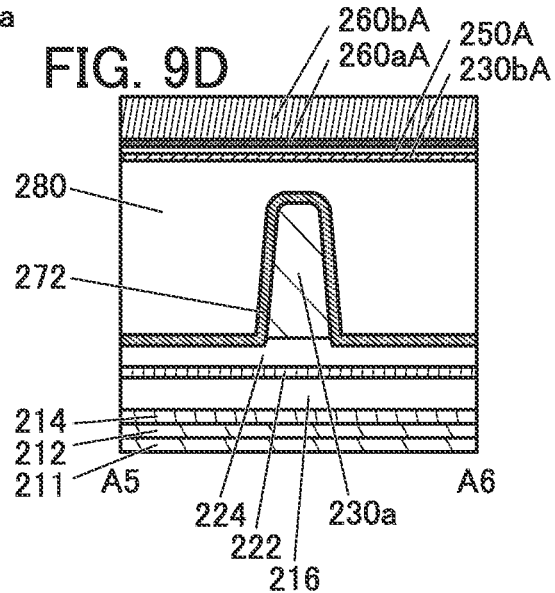
Figure 10A:
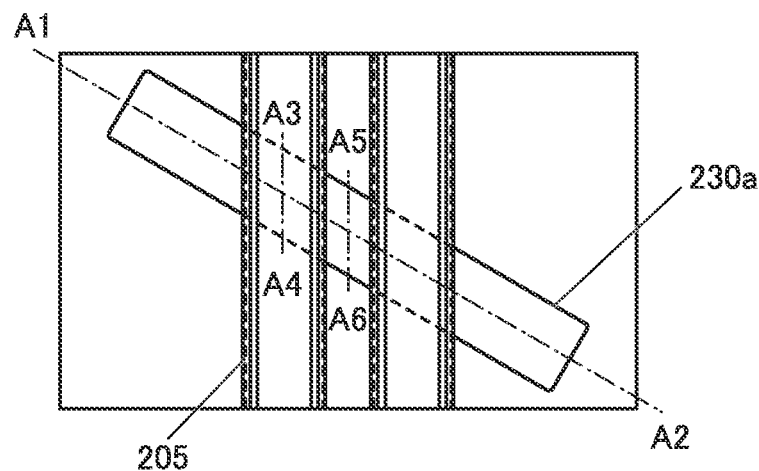
FIG. 10A is a top view showing a method for manufacturing a semiconductor device of one embodiment of the present invention.
Figure 10B:
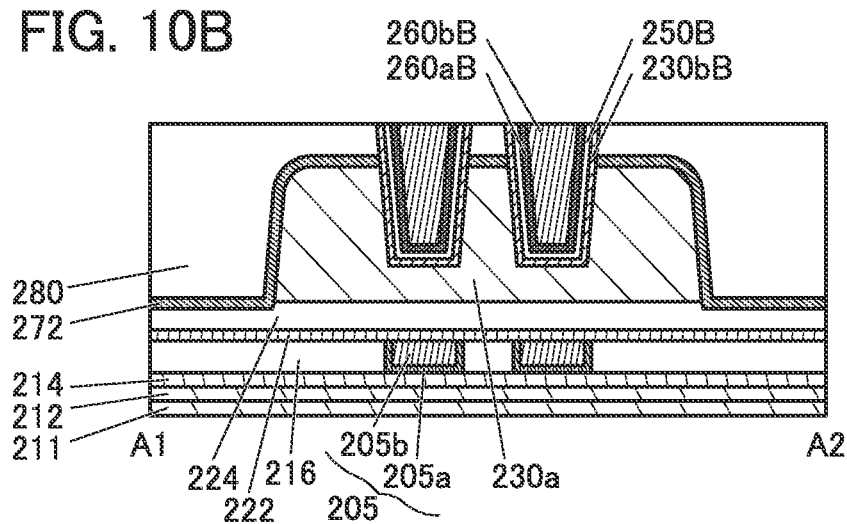
FIG. 10B to FIG. 10D are cross-sectional views showing a method for manufacturing the semiconductor device of one embodiment of the present invention.
Figure 10C:
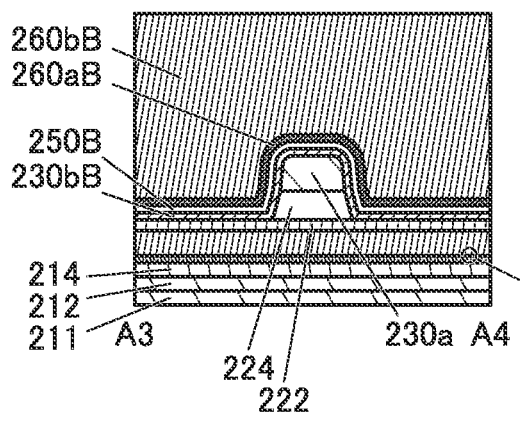
Figure 10D:
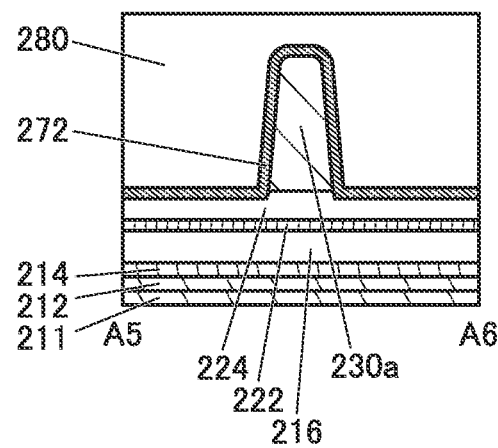
Figure 11A:
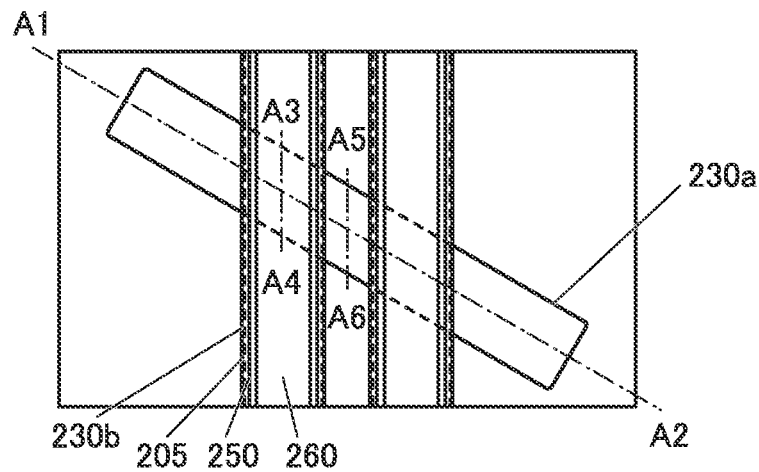
FIG. 11A is a top view showing a method for manufacturing a semiconductor device of one embodiment of the present invention.
Figure 11B:
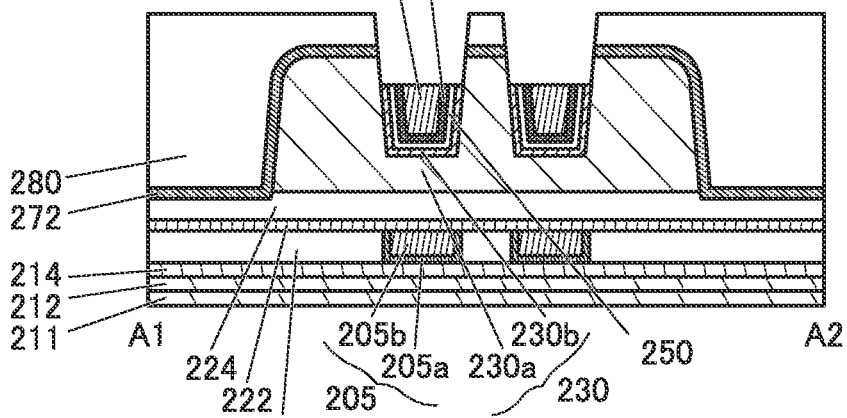
FIG. 11B to FIG. 11D are cross-sectional views showing a method for manufacturing the semiconductor device of one embodiment of the present invention.
Figure 11C:
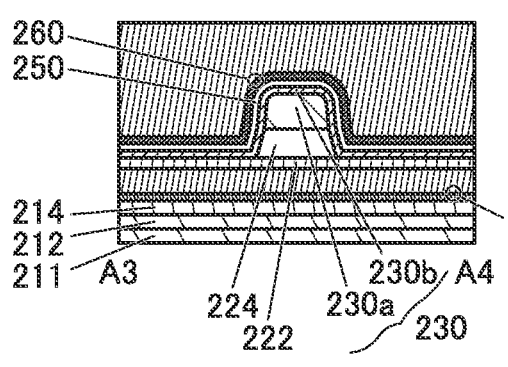
Figure 11D:
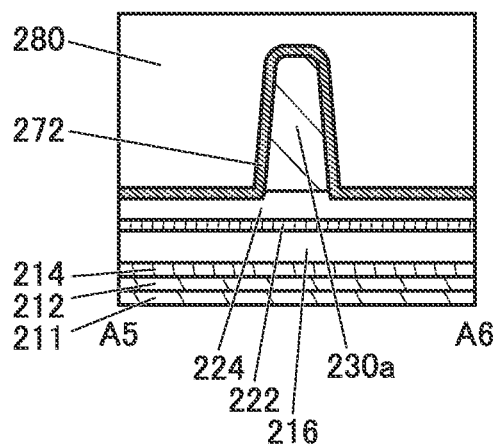
Figure 12A:
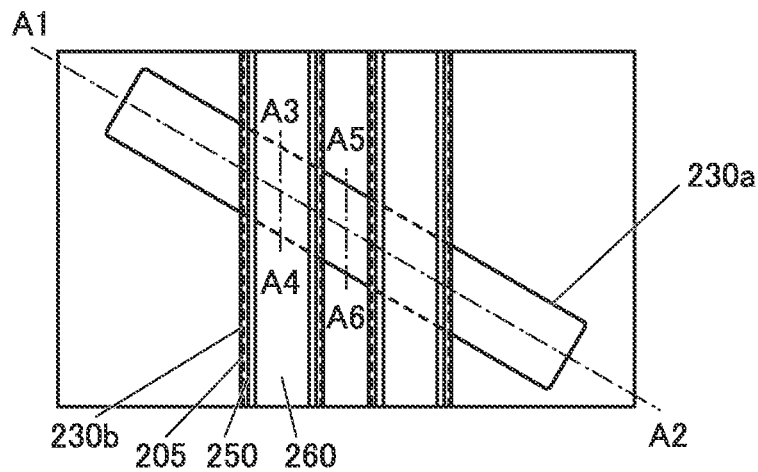
FIG. 12A is a top view showing a method for manufacturing a semiconductor device of one embodiment of the present invention.
Figure 12B:
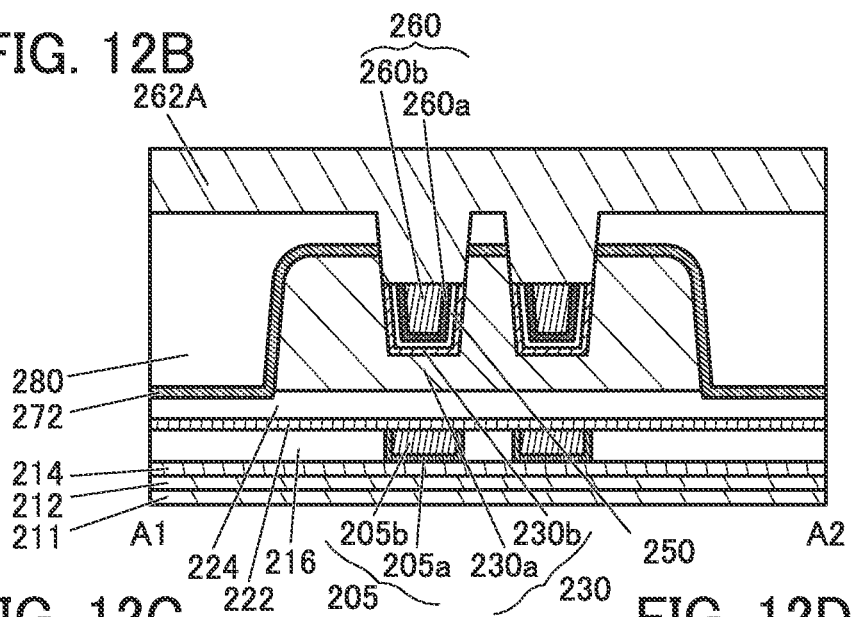
FIG. 12B to FIG. 12D are cross-sectional views showing a method for manufacturing the semiconductor device of one embodiment of the present invention.
Figure 12C:
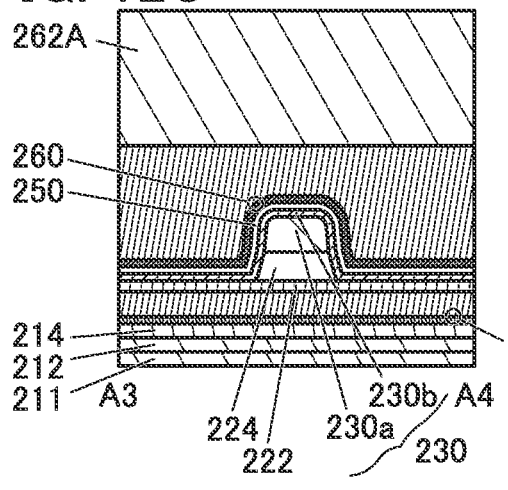
Figure 12D:
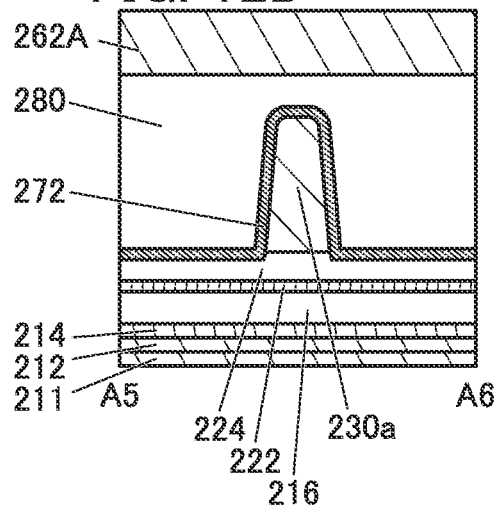
Figure 13A:
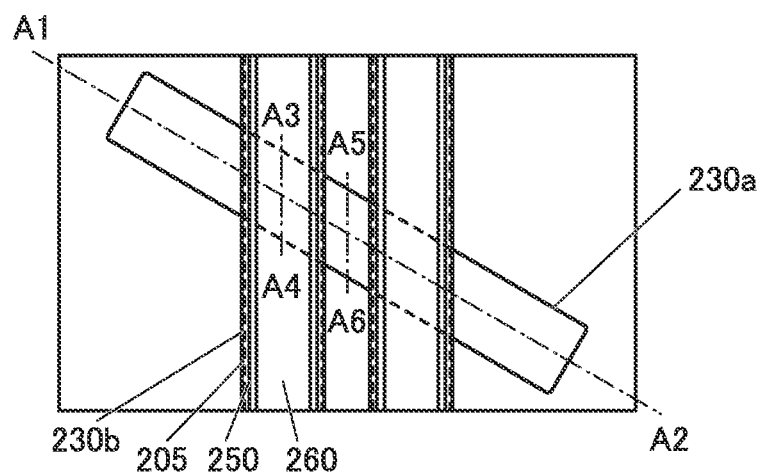
FIG. 13A is a top view showing a method for manufacturing a semiconductor device of one embodiment of the present invention.
Figure 13B:
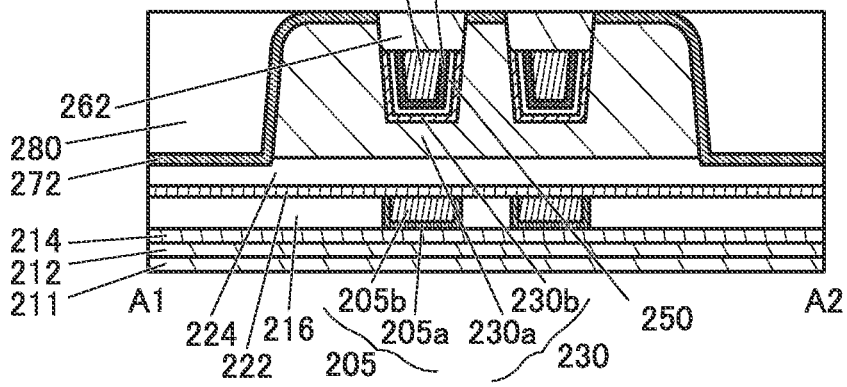
FIG. 13B to FIG. 13D are cross-sectional views showing a method for manufacturing the semiconductor device of one embodiment of the present invention.
Figure 13C:
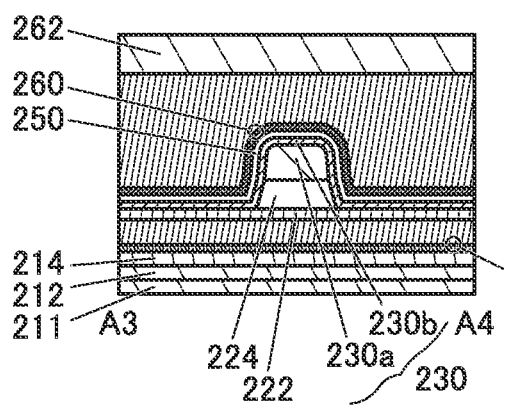
Figure 13D:
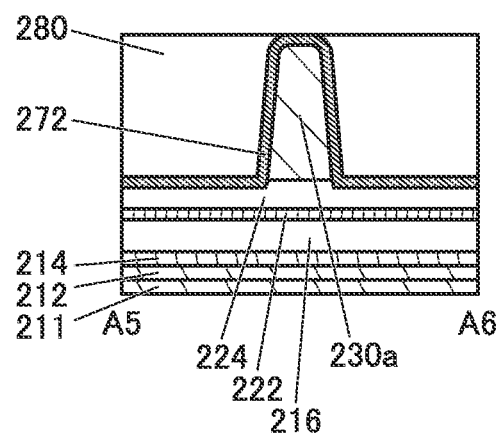
Figure 14A:
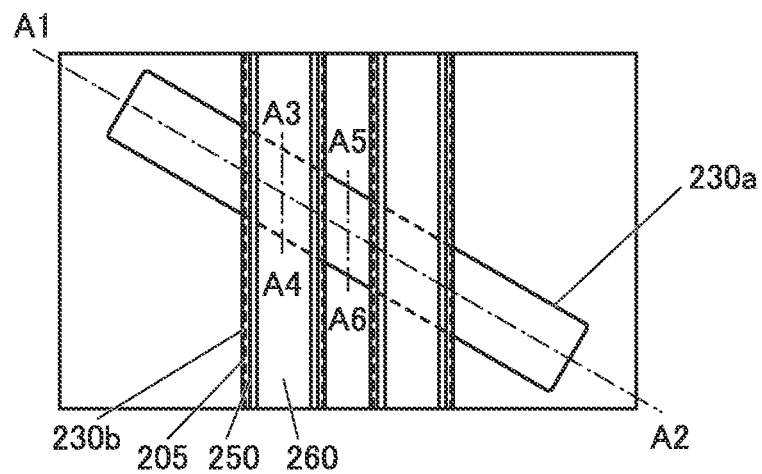
FIG. 14A is a top view showing a method for manufacturing a semiconductor device of one embodiment of the present invention.
Figure 14B:
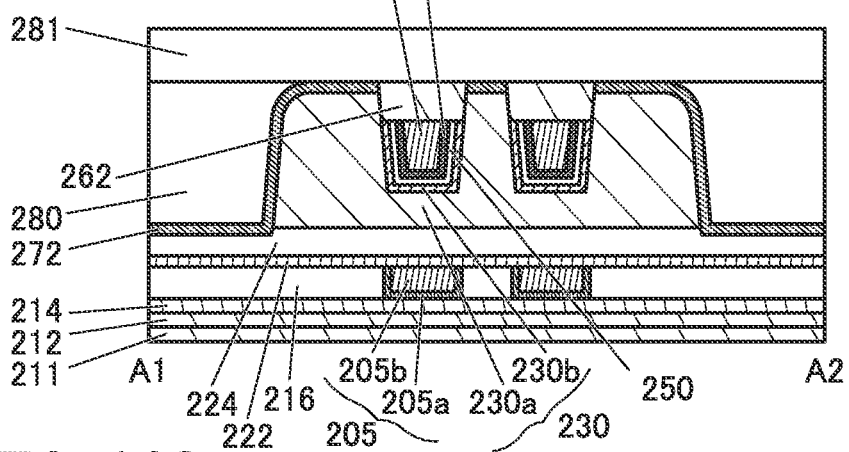
FIG. 14B to FIG. 14D are cross-sectional views showing a method for manufacturing the semiconductor device of one embodiment of the present invention.
Figure 14C:
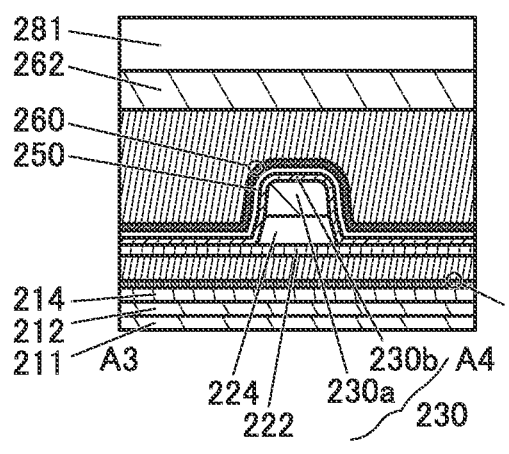
Figure 14D:
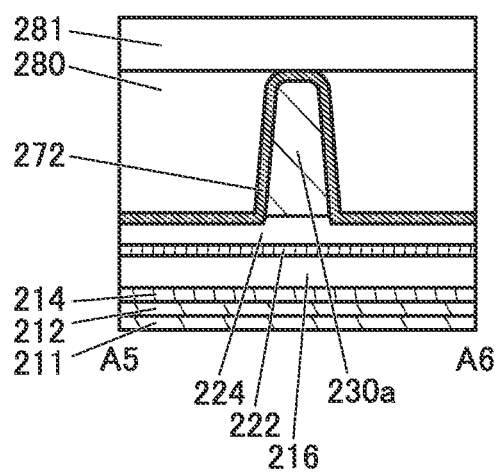
Figure 15A:
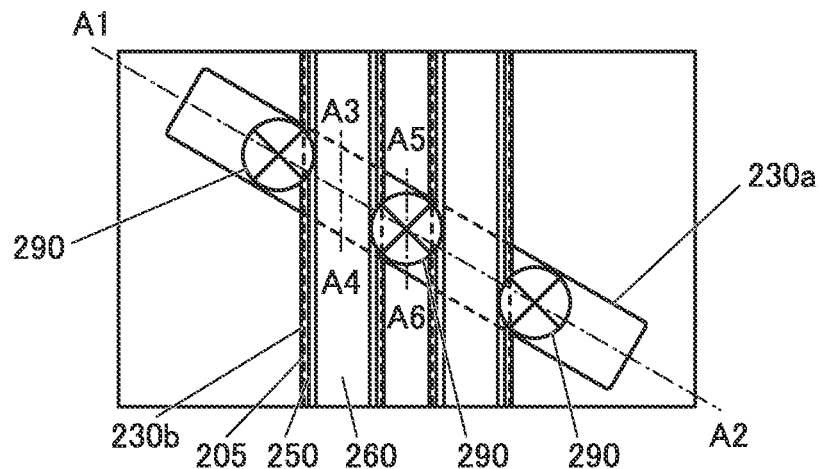
FIG. 15A is a top view showing a method for manufacturing a semiconductor device of one embodiment of the present invention.
Figure 15B:
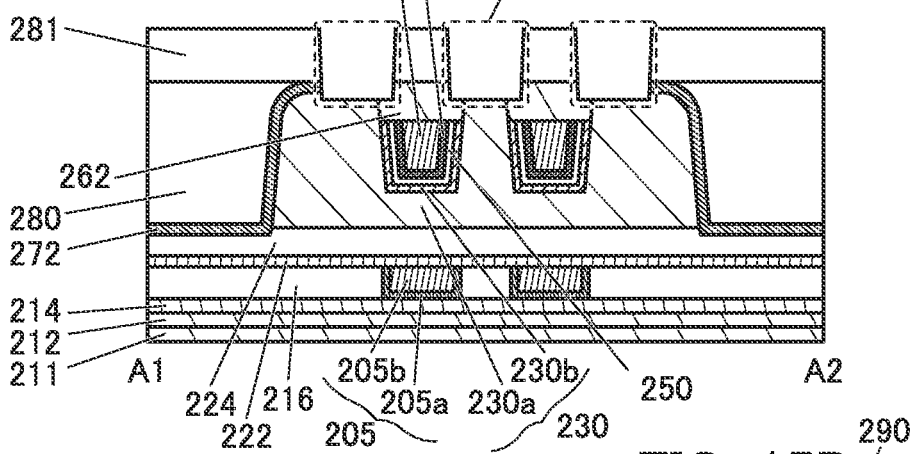
FIG. 15B to FIG. 15D are cross-sectional views showing a method for manufacturing the semiconductor device of one embodiment of the present invention.
Figure 15C:
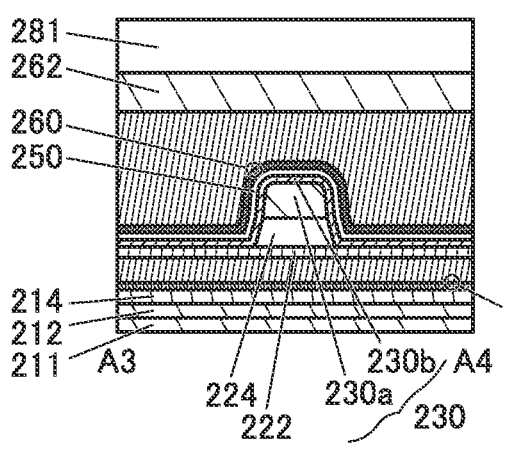
Figure 15D:
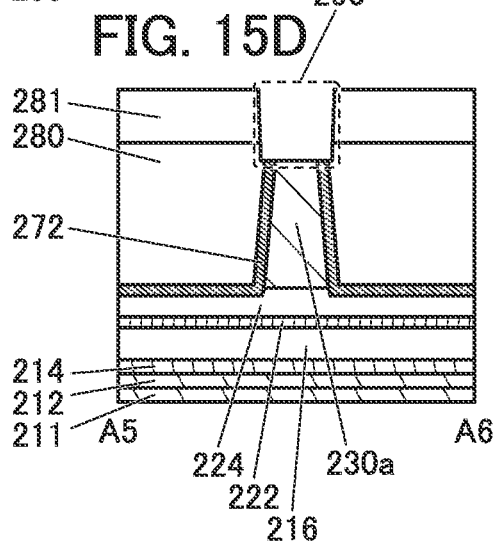
Figure 16A:
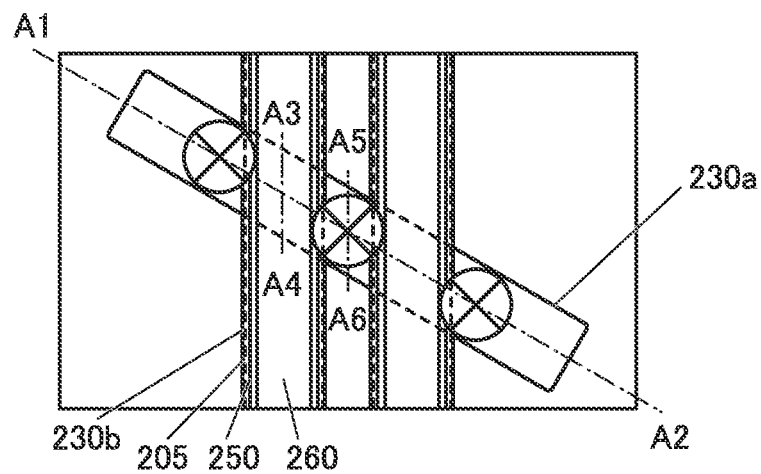
FIG. 16A is a top view showing a method for manufacturing a semiconductor device of one embodiment of the present invention.
Figure 16B:
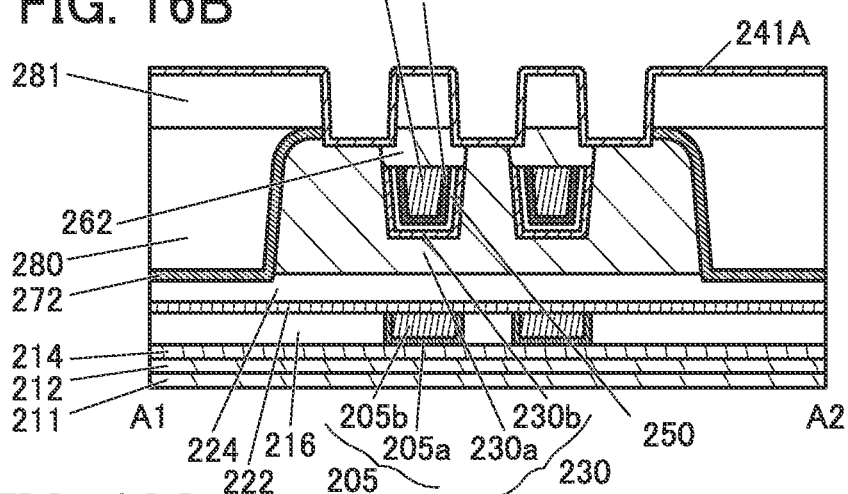
FIG. 16B to FIG. 16D are cross-sectional views showing a method for manufacturing the semiconductor device of one embodiment of the present invention.
Figure 16C:
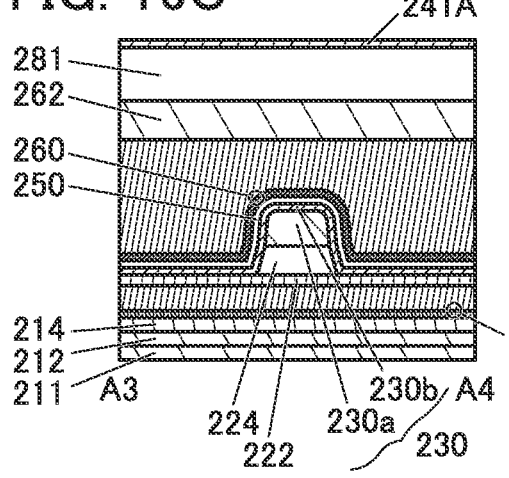
Figure 16D:
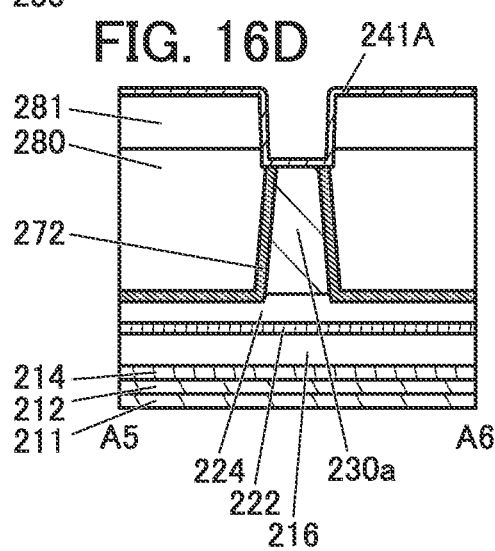
Figure 17A:
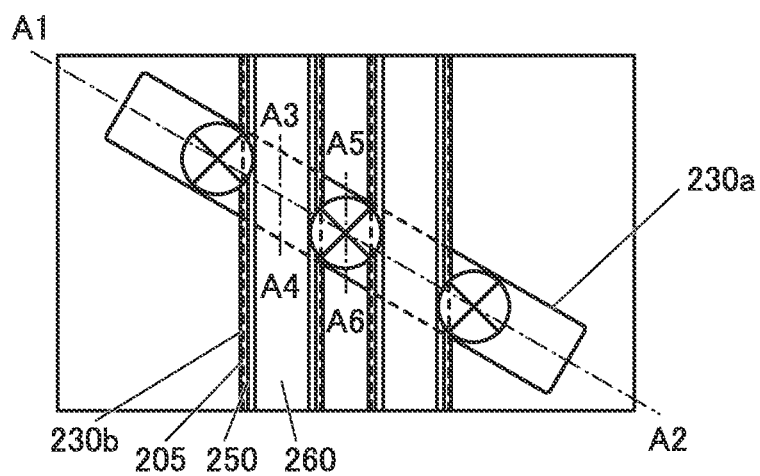
FIG. 17A is a top view showing a method for manufacturing a semiconductor device of one embodiment of the present invention.
Figure 17B:
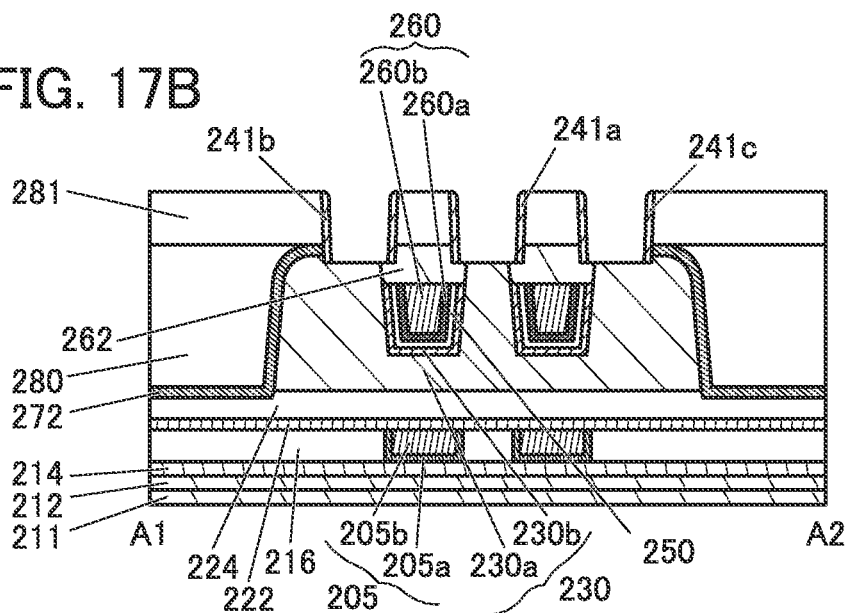
FIG. 17B to FIG. 17D are cross-sectional views showing a method for manufacturing the semiconductor device of one embodiment of the present invention.
Figure 17C:
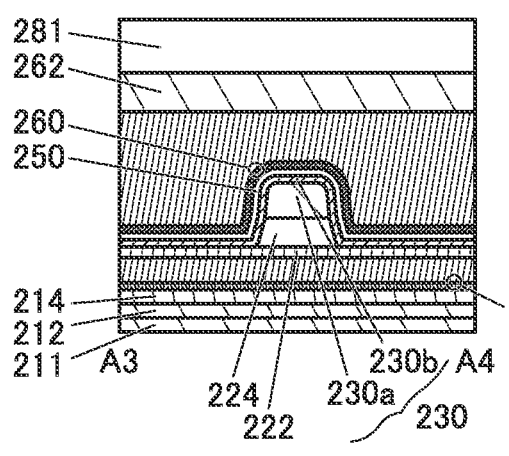
Figure 17D:
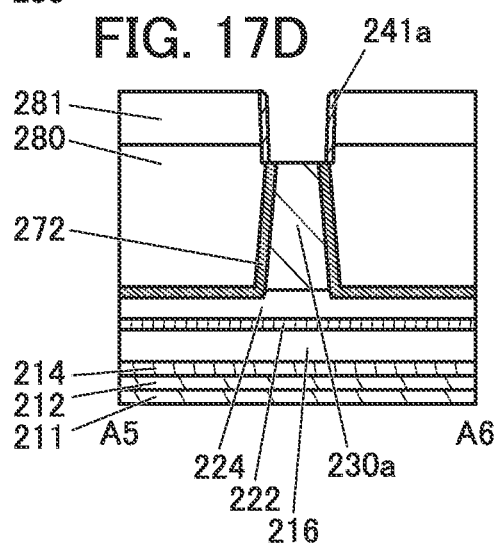
Figure 18A:
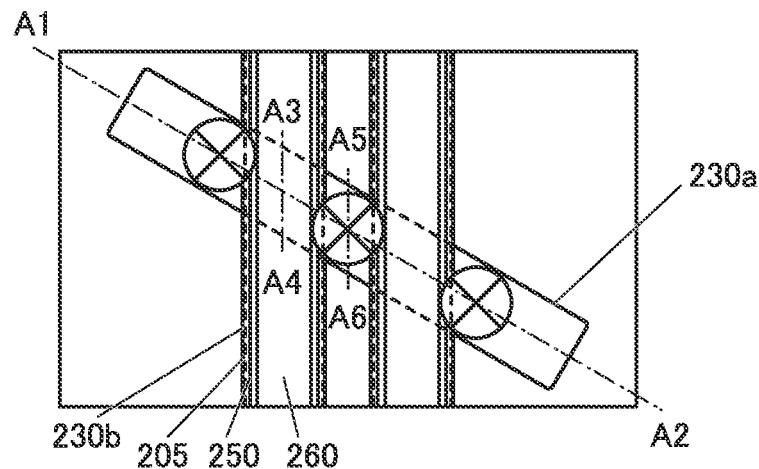
FIG. 18A is a top view showing a method for manufacturing a semiconductor device of one embodiment of the present invention.
Figure 18B:
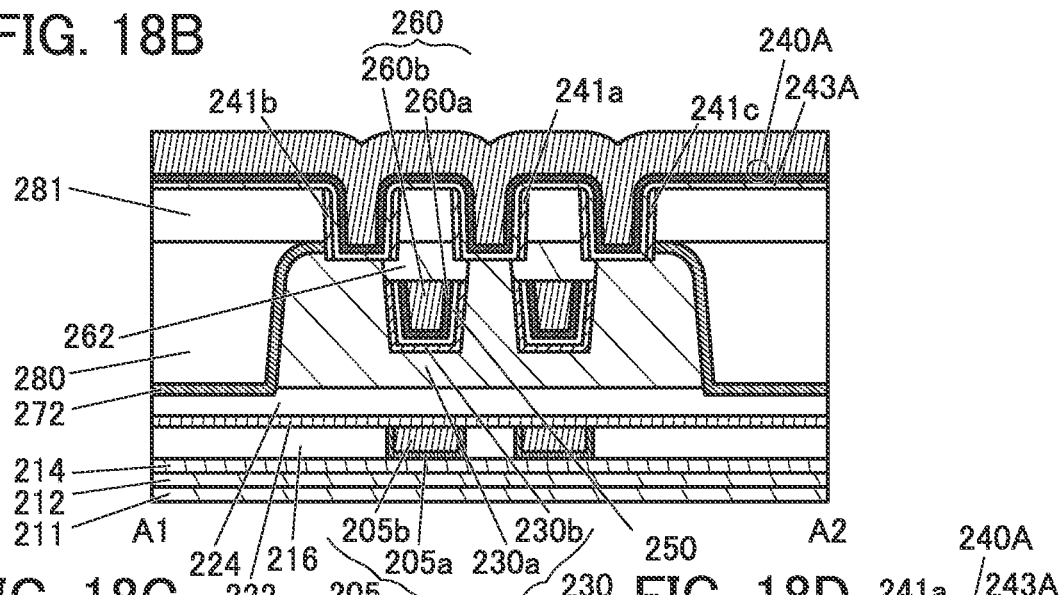
FIG. 18B to FIG. 18D are cross-sectional views showing a method for manufacturing the semiconductor device of one embodiment of the present invention.
Figure 18C:
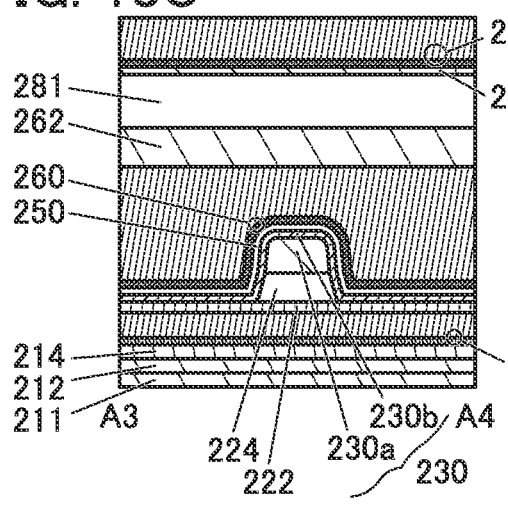
Figure 18D:
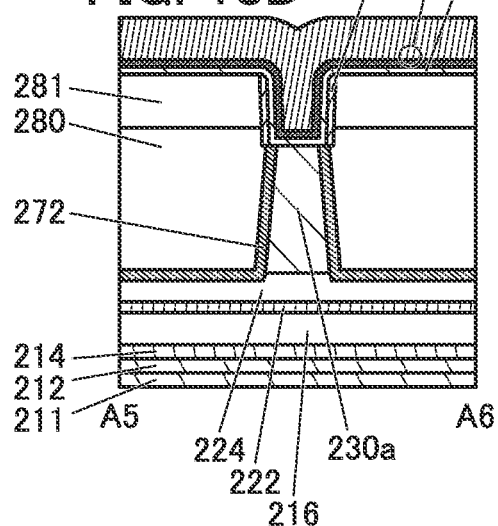
Figure 19A:
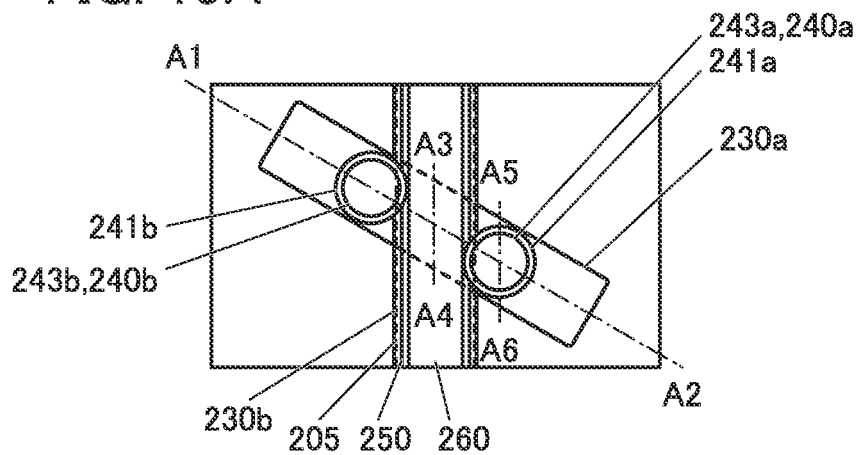
FIG. 19A is a top view of a semiconductor device of one embodiment of the present invention.
Figure 19B:
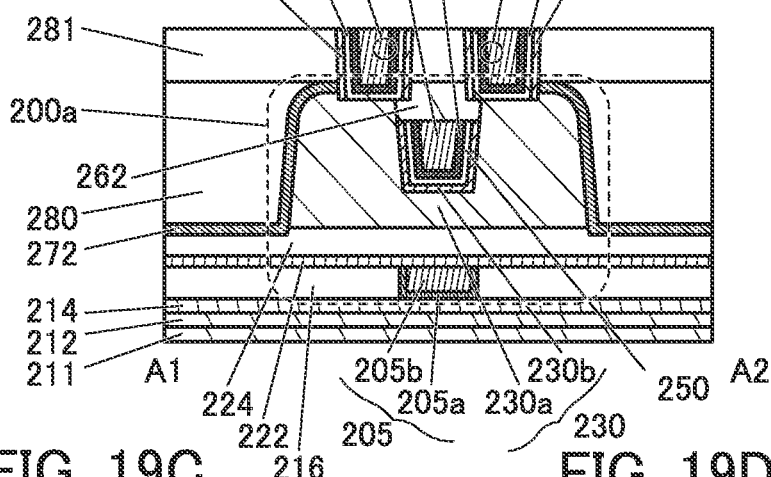
FIG. 19B to FIG. 19D are cross-sectional views of the semiconductor device of one embodiment of the present invention.
Figure 19C:
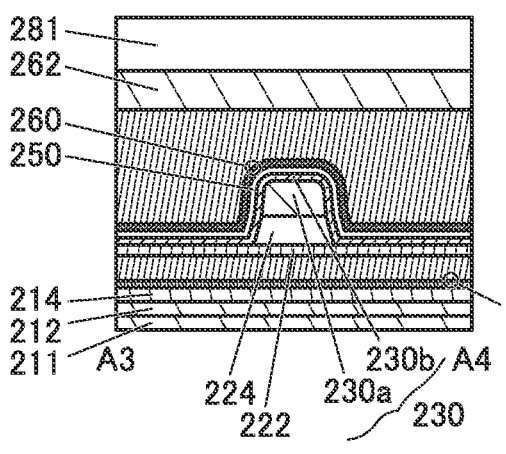
Figure 19D:
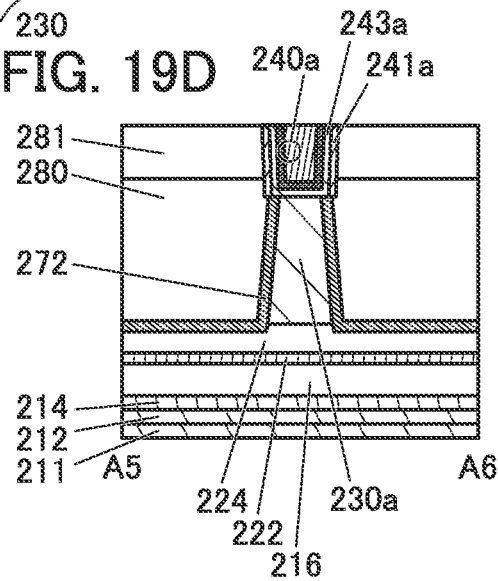

Next, an oxide film 230bA is formed over the insulator 280 in the opening 245 to include regions in contact with the side surface of the insulator 224, a surface of a bottom portion and the side surface of the oxide 230a, the side surface of the insulator 272, and the side surface of the insulator 280 (see FIG. 9A to FIG. 9D). Note that although FIG. 9C shows an example in which the oxide film 230bA is formed in contact with the insulator 222, this embodiment is not limited thereto. In the case where the insulator 224 is also left without being removed in a region not overlapping with the oxide 230a, the oxide film 230bA is also formed in contact with a surface of the insulator 224.

The oxide film 230bA can be formed by a sputtering method, a CVD method, an MBE method, a PLD method, an ALD method, or the like. The oxide film 230bA is deposited by a method similar to that for the oxide film 230A in accordance with characteristics required for the oxide 230b. In this embodiment, the oxide film 230bA can be deposited by a sputtering method using a target with In:Ga:Zn=4:2:4.1 or 1:3:4 [each of them shows the atomic ratio].

Note that the oxide film 230bA may have a stacked-layer structure. For example, an oxide film to be a lower layer of the oxide 230b may be deposited by a sputtering method using a target with In:Ga:Zn=4:2:4.1 [atomic ratio], and an oxide film to be an upper layer of the oxide 230b may be deposited successively using a target with In:Ga:Zn=1:3:4 [atomic ratio].

Then, an insulator 250A is deposited over the oxide film 230bA (see FIG. 9A to FIG. 9D).

The insulator 250A can be deposited by a sputtering method, a CVD method, an MBE method, a PLD method, an ALD method, or the like. Silicon oxynitride is preferably deposited by a CVD method as the insulator 250A. Note that the deposition temperature at the time of the deposition of the insulator 250A is preferably higher than or equal to 350° C. and lower than 450° C., particularly preferably approximately 400° C. When the insulator 250A is deposited at 400° C., an insulator having few impurities can be deposited.

Note that oxygen is excited by microwaves to generate high-density oxygen plasma, and the insulator 250A is exposed to the oxygen plasma, whereby oxygen can be introduced into the insulator 250A.

Furthermore, heat treatment may be performed. For the heat treatment, the above heat treatment conditions can be used. The heat treatment can reduce the moisture concentration and the hydrogen concentration in the insulator 250A.

Next, a conductive film 260aA and a conductive film 260bA are sequentially deposited (see FIG. 9A to FIG. 9D). The conductive film 260aA and the conductive film 260bA can be deposited by a sputtering method, a CVD method, an MBE method, a PLD method, an ALD method, or the like. Titanium nitride may be deposited for the conductive film 260aA, and tungsten may be deposited for the conductive film 260bA For the conductive film 260aA, a metal nitride is preferably formed by a CVD method or a sputtering method. With the use of a metal nitride for the conductive film 260aA, a reduction in conductivity of the conductive film 260bA due to oxidation caused by oxygen contained in the insulator 250A can be prevented.

Furthermore, when a low-resistance metal film is stacked as the conductive film 260bA, a transistor with a low driving voltage can be provided.

Subsequently, heat treatment can be performed. For the heat treatment, the above heat treatment conditions can be used. Note that the heat treatment is not necessarily performed in some cases.

Next, the conductive film 260bA, the conductive film 260aA, the insulator 250A, and the oxide film 230bA are polished until the insulator 280 is exposed, so that the conductor 260aB, the conductor 260bB, the insulator 250B, and the oxide 230bB are formed (see FIG. 10A to FIG. 10D). A CMP method can be used for the polishing. By the polishing, the top surfaces of the conductor 260aB, the conductor 260bB, the insulator 250B, and the oxide 230bB can be substantially level with the top surface of the insulator 280.

Next, the top surfaces of the conductor 260aB, the conductor 260bB, the insulator 250B, and the oxide 230bB are processed to be lower than a surface of an upper portion of the oxide 230a to form the conductor 260 including the conductor 260a and the conductor 260b, the insulator 250, and the oxide 230b (see FIG. 11A to FIG. 11D). In the processing, a wet etching method or a dry etching method can be used. Note that in the processing, anisotropic etching of the conductor 260aB, the conductor 260bB, the insulator 250B, and the oxide 230bB and the thickness control of the conductor 260, the insulator 250, and the oxide 230b after the processing are required, and thus, it is preferable to use a dry etching method which excels in controllability in processing. The thickness of the conductor 260 overlapping with the oxide 230a in the opening 245 is greater than or equal to 20 nm and less than or equal to 200 nm, preferably greater than or equal to 30 nm and less than or equal to 150 nm, further preferably greater than or equal to 40 nm and less than or equal to 80 nm.

At this time, the conductor 260 is formed to overlap with the conductor 205 and the oxide 230a at least partly. The width of the conductor 260 in the channel length direction (also referred to as a gate length) depends on the width of the opening 245 provided in the oxide 230a, the thickness of the oxide 230b, and the thickness of the insulator 250. The conductor 260 with a desired width can be formed by adjusting the above widths and thicknesses in accordance with the performance required for the transistor 200 or the semiconductor device.

In such a manner, the conductor 260 is formed to be embedded in the opening 245. The conductor 260 is formed in a self-aligned manner without employing a lithography method; thus, an alignment margin for the conductor 260 is unnecessary. Therefore, the area occupied by the transistor 200 can be reduced and the miniaturization and high integration of the semiconductor device can be achieved. Furthermore, since the lithography process is not necessary, an improvement in productivity due to simplification of the process is expected.

The gate length needs to be short for miniaturization of the semiconductor device, but it is necessary to prevent reduction in the conductivity of the conductor 260. When the conductor 260 is made thick to achieve this, the conductor 260 might have a shape with a high aspect ratio. In this embodiment, the conductor 260 is provided to be embedded in the opening 245; hence, even when the conductor 260 has a shape with a high aspect ratio, the conductor 260 can be formed without collapsing during the process.

Next, an insulating film 262A is formed to cover the conductor 260, the insulator 250, the oxide 230b, and the insulator 280 (see FIG. 12A to FIG. 12D). It is particularly preferable that the insulating film 262A be provided in contact with the top surfaces of the conductor 260, the insulator 250, and the oxide 230b in the opening 245. The insulating film 262A is preferably an insulating barrier film, and hafnium oxide, silicon nitride, or the like can be used for the insulating film 262A, for example. Aluminum oxide may be used for the insulating film 262A. The insulating film 262A can be deposited by a sputtering method, a CVD method, an MBE method, a PLD method, an ALD method, or the like.

Next, the insulating film 262A is polished until the insulator 272 is exposed, whereby the insulator 262 is formed (see FIG. 13A to FIG. 13D). A CMP method can be used for the polishing. It is preferable that a top surface of the insulator 262 be substantially level with a top surface of the insulator 272 and the top surface of the insulator 280 by the polishing. Furthermore, by the polishing, the opening 245 is filled with the conductor 260, the insulator 250, the oxide 230b, and the insulator 262 formed over the conductor 260, the insulator 250, and the oxide 230b. In the opening 245, the thickness of the insulator 262 overlapping with the conductor 260 is greater than or equal to 10 nm and less than or equal to 100 nm, preferably greater than or equal to 20 nm and less than or equal to 50 nm. Note that the thickness of the insulator 262 is not limited to the above as long as the insulator 262 functions as an etching stopper in etching in a later step.

Note that the above polishing is not necessarily performed until the insulator 272 is exposed. The polishing is performed at least until the insulating film 262A over the insulator 280 is eliminated and the insulator 280 is exposed. The polishing may be performed until the insulator 272 is eliminated and the oxide 230a is exposed.

Next, the insulator 281 is formed over the insulator 272 and the insulator 280 (see FIG. 14A to FIG. 14D). The insulator 281 can be formed using an apparatus and a material that are similar to those used for the insulator 280. For example, the insulator 281 containing silicon oxynitride is formed by a CVD method.

Next, the insulator 281, the insulator 272, and the insulator 280 are processed by a lithography method to form an opening 290 where the oxide 230a is exposed (see FIG. 15A to FIG. 15D).

Next, an insulating film 241A is deposited in the opening 290 and over the insulator 281 (see FIG. 16A to FIG. 16D). The insulating film 241A can be deposited by a sputtering method, a CVD method, an MBE method, a PLD method, an ALD method, or the like. As the insulating film 241A, an insulating film having a function of inhibiting passage of oxygen is preferably used. For example, aluminum oxide or silicon nitride is preferably deposited by an ALD method.

Next, the insulating film 241A is subjected to anisotropic etching to form the insulator 241 (the insulator 241a, the insulator 241b, and the insulator 241c) (see FIG. 17A to FIG. 17D). For the anisotropic etching, a dry etching method or the like is employed, for example. In this case, it is preferable to use conditions where the etching rate of the insulating film 262 is lower than the etching rate of the insulating film 241A. Moreover, it is preferable that the insulator 262 and the insulating film 241A be formed using different materials. Meanwhile, in the case where the thickness of the insulator 262 is sufficiently large and the conductor 260 is not exposed by the formation of the insulator 241, the insulator 262 and the insulating film 241A are not limited thereto. In that case, the insulator 262 and the insulating film 241A may be formed using as the same material. When the side wall portion of the opening 290 has such a structure, passage of oxygen from the outside can be inhibited and diffusion of oxygen into the oxide 243 and the conductor 240 to be formed next can be inhibited. Meanwhile, in the case where diffusion of oxygen into the oxide 243 and the conductor 240 in the opening 290 does not occur or in the case where the influence of diffusion of oxygen into the oxide 243 and the conductor 240 on characteristics of the semiconductor device is small or there is no influence, the insulator 241 is not necessarily provided.

Next, an oxide film 243A is deposited (see FIG. 18A to FIG. 18D). A material that can be used for the oxide film 230A can be used for the oxide film 243A. The oxide film 243A can be deposited by a sputtering method, a CVD method, an MBE method, a PLD method, an ALD method, or the like.

Next, the conductive film 240A is deposited (see FIG. 18A to FIG. 18D). The conductive film 240A can be deposited by a sputtering method, a CVD method, an MBE method, a PLD method, an ALD method, or the like. A conductive material containing tungsten, copper, or aluminum as its main component can be used for the conductive film 240A. The conductive film 240A may have a stacked-layer structure. The conductive film 240A may have a structure which includes a first conductive film containing tantalum, tantalum nitride, titanium, titanium nitride, ruthenium, or ruthenium oxide and a second conductive film containing a conductive material containing tungsten, copper, or aluminum as its main component over the first conductive film.

For the oxide film 243A, a low-resistance material or a material whose resistance is reduced by contact with the conductive film 240A is preferably used. The material whose resistance is reduced by contact with the conductive film 240A means one or both of a material whose resistance is reduced by absorption of impurities such as hydrogen contained in the conductive film 240A and a material whose resistance is reduced by extraction of oxygen contained in the material by the conductive film 240A. As such a material, a metal oxide deposited using a target with In:Ga:Zn=4:2:4.1, 5:1:6, 5:1:3, 10:1:3, or 1:1:1 [each of them shows the atomic ratio] or a metal oxide such as an In—Zn oxide, an indium oxide, or indium tin oxide can be used. Furthermore, the oxide film 243A is preferably formed using the same material as that for the oxide 230a because an increase in contact resistance can be inhibited.

Next, the layers above the insulator 281 are removed by CMP treatment, so that the oxide 243 and the conductor 240 are formed. Here, the insulator 281 preferably functions as a stopper for the CMP treatment on the conductive film 240A and the oxide film 243A. Note that the insulator 281 is partly removed by the CMP treatment in some cases.

Through the above process, the semiconductor device including the transistor 200 shown in FIG. 1A to FIG. 1D can be manufactured.

According to one embodiment of the present invention, a semiconductor device that can be miniaturized or highly integrated can be provided. According to one embodiment of the present invention, a semiconductor device having favorable electrical characteristics can be provided. According to one embodiment of the present invention, a semiconductor device having favorable frequency characteristics can be provided. According to one embodiment of the present invention, a semiconductor device having favorable reliability can be provided. According to one embodiment of the present invention, a semiconductor device with high productivity can be provided.

As described above, the components, structures, methods, and the like described in this embodiment can be combined with any of the components, structures, methods, and the like described in the other embodiments as appropriate.

Modification Example 1 of Semiconductor Device

An example of the semiconductor device including the transistor 200 of one embodiment of the present invention, which is different from the semiconductor device described in <Structure example of semiconductor device> above, is described below with reference to FIG. 19A to FIG. 19D.

Note that in the semiconductor device shown in FIG. 19A to FIG. 19D, components having the same functions as the components in the semiconductor device described in <Structure example of semiconductor device> (see FIG. 1A to FIG. 1D) are denoted by the same reference numerals.

A structure of the transistor 200 is described with reference to FIG. 19A to FIG. 19D below. Note that also in this section, the materials described in detail in <Structure example of semiconductor device> can be used as the materials for the transistor 200.

Although the transistor 200 includes two transistors (the transistor 200a and the transistor 200b) in one semiconductor layer in the example of the semiconductor device (see FIG. 1A to FIG. 1D) shown in <Structure example of semiconductor device> described above, the present invention is not limited thereto. As shown in FIG. 19A to FIG. 19D, the transistor 200 may include one transistor (the transistor 200a) in one semiconductor layer.

In this case, one of a source and a drain of the transistor 200a is electrically connected to the conductor 240a through the oxide 243a. The other of the source and the drain of the transistor 200a is electrically connected to the conductor 240b through the oxide 243b.

The one of the source and the drain of the transistor 200a is electrically connected to the conductor 240a through the oxide 243a provided on a bottom surface and a side surface of the conductor 240a, and thus favorable electrical connection with the conductor 240a can be achieved. The other of the source and the drain of the transistor 200b is electrically connected to the conductor 240b through the oxide 243b provided on a bottom surface and a side surface of the conductor 240b, and thus favorable electrical connection with the conductor 240b can be achieved.

For example, a conductor functioning as a bit line is provided to be electrically connected to the conductor 240a, and a capacitor is provided to be electrically connected to the conductor 240b, whereby the semiconductor device including the transistor 200a can function as a memory device.

<Memory Device>

The semiconductor device including the above transistor 200 and a capacitor 100 electrically connected to the transistor 200 is a memory cell 600, and a memory device can be formed. FIG. 20A, FIG. 20B, and FIG. 21A to FIG. 21C are atop view and cross-sectional views of a memory device of one embodiment of the present invention and the periphery of the memory device.

Figure 20A:
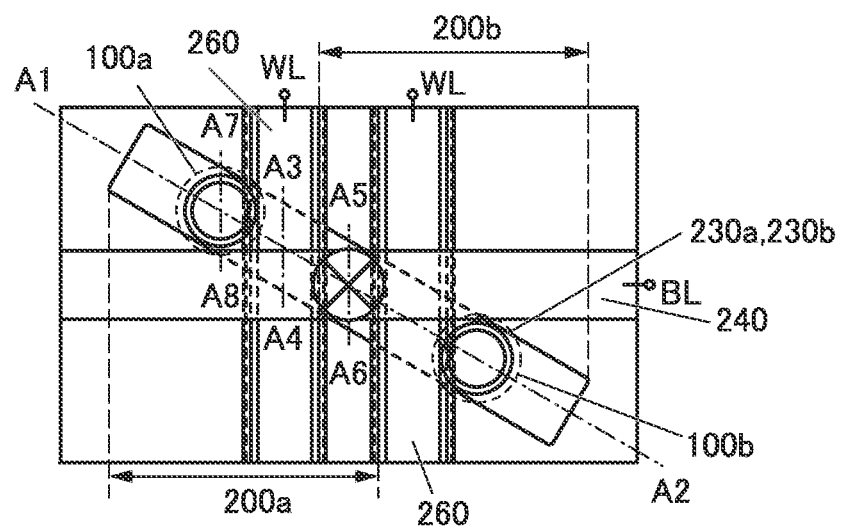
FIG. 20A is a top view of a semiconductor device of one embodiment of the present invention.
Figure 20B:
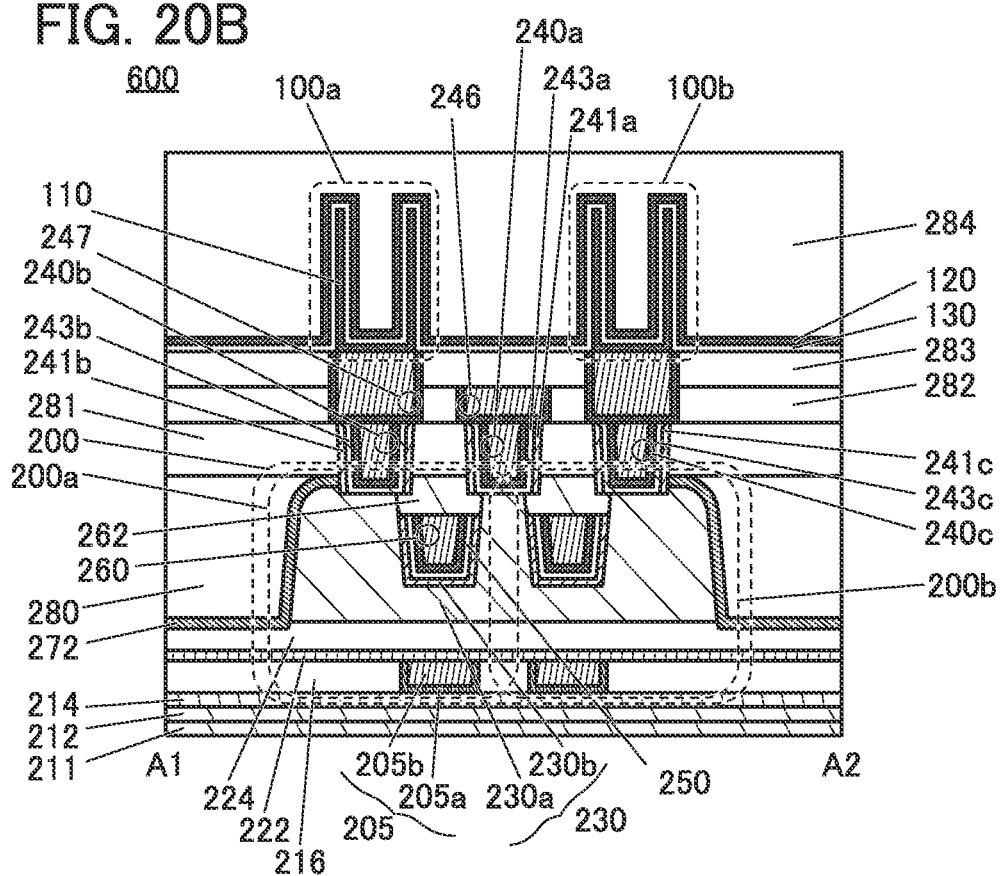
FIG. 20B is a cross-sectional view of the semiconductor device of one embodiment of the present invention.
Figure 21A:
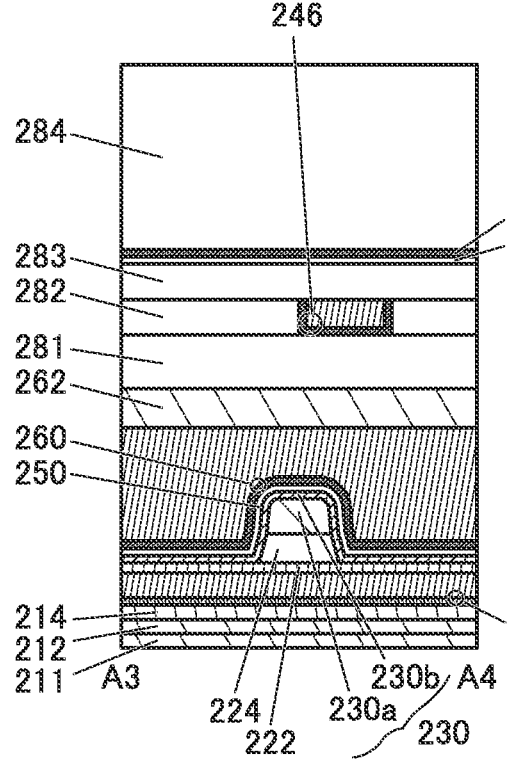
FIG. 21A to FIG. 21C are cross-sectional views of a semiconductor device of one embodiment of the present invention.
Figure 21B:
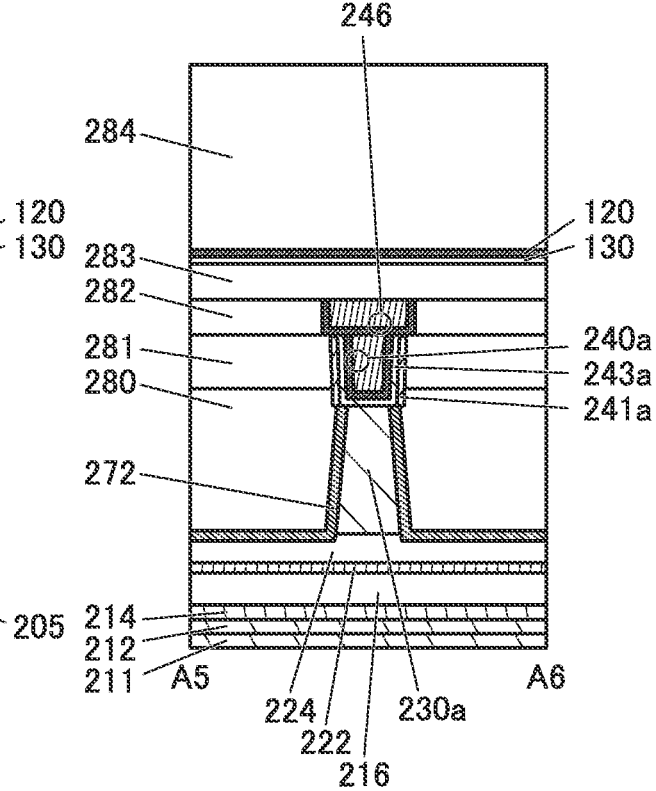
Figure 21C:
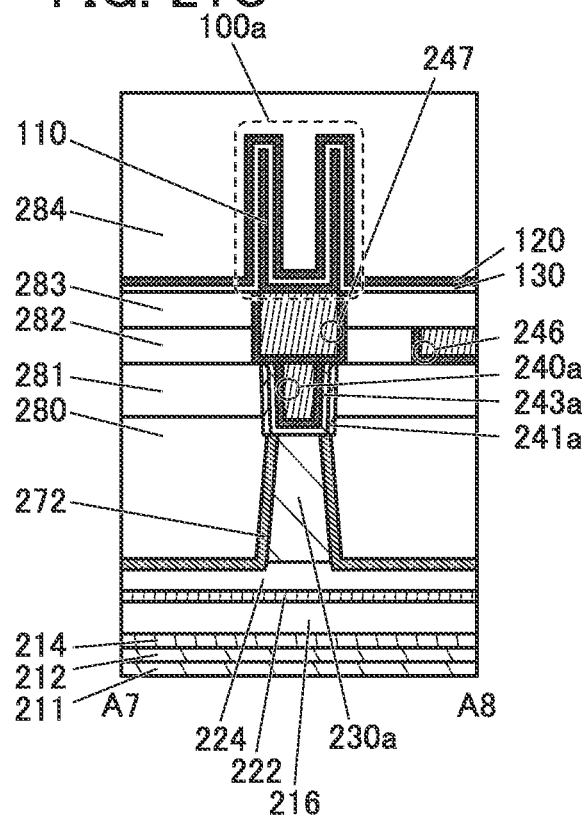

FIG. 20A is atop view of the memory device. FIG. 20B and FIG. 21A to FIG. 21C are cross-sectional views of the memory device. Here, FIG. 20B is a cross-sectional view of a portion indicated by the dashed-dotted line A1-A2 in FIG. 20A, and is a cross-sectional view of the transistor 200 in the channel length direction. Moreover, FIG. 21A is a cross-sectional view of a portion indicated by the dashed-dotted line A3-A4 in FIG. 20A, and is a cross-sectional view of a channel formation region in a direction in which the conductor 260 extends. Note that FIG. 21A illustrates a cross section in the channel width direction of the transistor 200. FIG. 21B is a cross-sectional view of a portion indicated by the dashed-dotted line A5-A6 in FIG. 20A. FIG. 21C is a cross-sectional view of a portion indicated by the dashed-dotted line A7-A8 in FIG. 20A. Note that for clarity of the drawing, some components are not illustrated in the top view in FIG. 20A.

As shown in FIG. 20B, an insulator 282 is provided over the conductor 240, the oxide 243, the insulator 241, and the insulator 281; and the conductor 246 is provided to be embedded in the insulator 282. The conductor 246 is electrically connected to the conductor 240a and can function as a wiring BL to be described later. An insulator 283 is provided over the insulator 282 and the conductor 246; and a conductor 247 is provided to be embedded in the insulator 282 and the insulator 283. In FIG. 20B, two conductors 247 are provided and electrically connected to the conductor 240b and the conductor 240c. A capacitor 100a and a capacitor 100b are provided over the conductor 247 and the insulator 283 and electrically connected to the conductor 240b and the conductor 240c, respectively, through the conductor 247. An insulator 284 is provided over the insulator 283 to cover the capacitor 100a and the capacitor 100b.

For the insulator 282, the insulator 283, and the insulator 284, a material that can be used for the insulator 216, the insulator 280, and the insulator 281 can be used. For the conductor 246 and the conductor 247, a conductor that can be used for the conductor 205, the conductor 260, the conductor 240, or the like can be used. The conductor 246 or the conductor 247 may have a stacked-layer structure. For example, the conductor 246 or the conductor 247 may have a stacked-layer structure of a conductive material containing titanium, titanium nitride, tantalum, or tantalum nitride as its main component and a conductive material containing tungsten, copper, or aluminum as its main component. Alternatively, the conductor 246 or the conductor 247 may have a single-layer structure or a stacked-layer structure of three or more layers.

[Capacitor 100]

As shown in FIG. 20B and FIG. 21C, the capacitor 100a is provided to include a region overlapping with the transistor 200a. Similarly, the capacitor 100b is provided to include a region overlapping with the transistor 200b. FIG. 21C is a cross-sectional view of a portion indicated by the dashed-dotted line A7-A8 in FIG. 20A, and is a cross-sectional view of a connection portion between the capacitor 100a and the conductor 240a. FIG. 21C shows an example in which the capacitor 100a is electrically connected to the conductor 240a through the conductor 247. Note that the capacitor 100b includes components that corresponds to the components included in the capacitor 100a. The structure of the capacitor 100 is described as the structures of the capacitor 100a and the capacitor 100b in detail below. Thus, unless otherwise specified, the description for the capacitor 100 can be referred to for the capacitor 100a and the capacitor 100b below.

The capacitor 100 includes a conductor 110, an insulator 130, and a conductor 120 over the insulator 130.

The capacitor 100 has a structure in which the conductor 110 functioning as a lower electrode (also referred to as a first terminal in some cases) faces the conductor 120 functioning as an upper electrode (also referred to as a second terminal in some cases) with the insulator 130 functioning as a dielectric therebetween.

The capacitor 100 is provided above the transistor 200, and the conductor 110 is provided to be electrically connected to the conductor 240 included in the transistor 200. An insulator 282 is provided over the conductor 240, the oxide 243, the insulator 241, and the insulator 281; an insulator 283 is provided over the insulator 282; and the conductor 247 is provided to be embedded in the insulator 282 and the insulator 283. The conductor 110 is provided over the conductor 247 and the insulator 283 so as to be electrically connected to the conductor 247.

The insulator 130 is provided over the insulator 283 to cover the conductor 110.

The conductor 120 is provided over the insulator 130 and is provided to cover at least a top surface and a side surface of the conductor 110 with the insulator 130 therebetween. As shown in FIG. 20B and FIG. 21C, the conductor 110 includes a bottom surface directly in contact with the conductor 247 and a side surface formed in a cylindrical shape. The conductor 120 is provided to cover the inside and the outside of the cylindrical conductor 110 with the insulator 130 therebetween, whereby the capacitor 100 is formed. When the conductor 120 is provided on the inside and the outside of the conductor 110 as the capacitor 100, the inside and the outside of the conductor 110 can be used as a capacitor.

The capacitor 100 has a structure in which the upper electrode and the lower electrode face each other with the dielectric therebetween on a side surface as well as a bottom surface of the conductor 110; thus, the capacitance per unit area can be increased. Thus, as the height of the conductor 110 is larger, the capacitance of the capacitor 100 can be larger. In addition, side surfaces of the inside and the outside of the conductor 110 formed in a cylindrical shape are used as a capacitor, and thus the height of the conductor 110 can be smaller than that in the case where a capacitor is formed using only the inside or only the outside of the conductor 110, and the conductor 110 and the capacitor 100 can be formed easily. Increasing the capacitance per unit area of the capacitor 100 in this manner can promote miniaturization or higher integration of the semiconductor device.

A conductor that can be used as the conductor 205, the conductor 260, the conductor 240, or the like can be used as the conductor 110 and the conductor 120. For each of the conductor 110 and the conductor 120, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum; an alloy containing the above metal element; an alloy containing a combination of the above metal elements; or the like. For example, it is preferable to use tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like. In addition, tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that retain their conductivity even after absorbing oxygen. A semiconductor having high electrical conductivity, typified by polycrystalline silicon containing an impurity element such as phosphorus, or silicide such as nickel silicide may be used.

The conductor 110 or the conductor 120 may have a stacked-layer structure. For example, the conductor 110 or the conductor 120 may have a stacked-layer structure of a conductive material containing titanium, titanium nitride, tantalum, or tantalum nitride as its main component and a conductive material containing tungsten, copper, or aluminum as its main component. Alternatively, the conductor 110 or the conductor 120 may have a single-layer structure or a stacked-layer structure of three or more layers. The conductor 120 can be used as a common upper electrode of the adjacent capacitor 100. The conductor 120 can also function as a wiring CAL to be described later.

An insulator having a high permittivity is preferably used for the insulator 130. For example, an insulator containing an oxide of one or both of aluminum and hafnium can be used. Aluminum oxide, hafnium oxide, an oxide containing aluminum and hafnium (hafnium aluminate), or the like is preferably used as the insulator containing an oxide of one or both of aluminum and hafnium.

The insulator 130 may have a stacked-layer structure; for example, two or more layers selected from silicon oxide, silicon oxynitride, silicon nitride oxide, silicon nitride, aluminum oxide, hafnium oxide, an oxide containing aluminum and hafnium (hafnium aluminate), and the like may be used for the stacked-layer structure. For example, it is preferable that hafnium oxide, aluminum oxide, and hafnium oxide be deposited in this order by an ALD method to form a stacked-layer structure. Hafnium oxide and aluminum oxide each have a thickness of greater than or equal to 0.5 nm and less than or equal to 5 nm. With such a stacked-layer structure, the capacitor 100 can have a large capacitance value and a low leakage current.

<Structure Example of Memory Cell 600>

The structure examples of the memory cell 600 are described with reference to FIG. 22 to FIG. 24.

Figure 22:
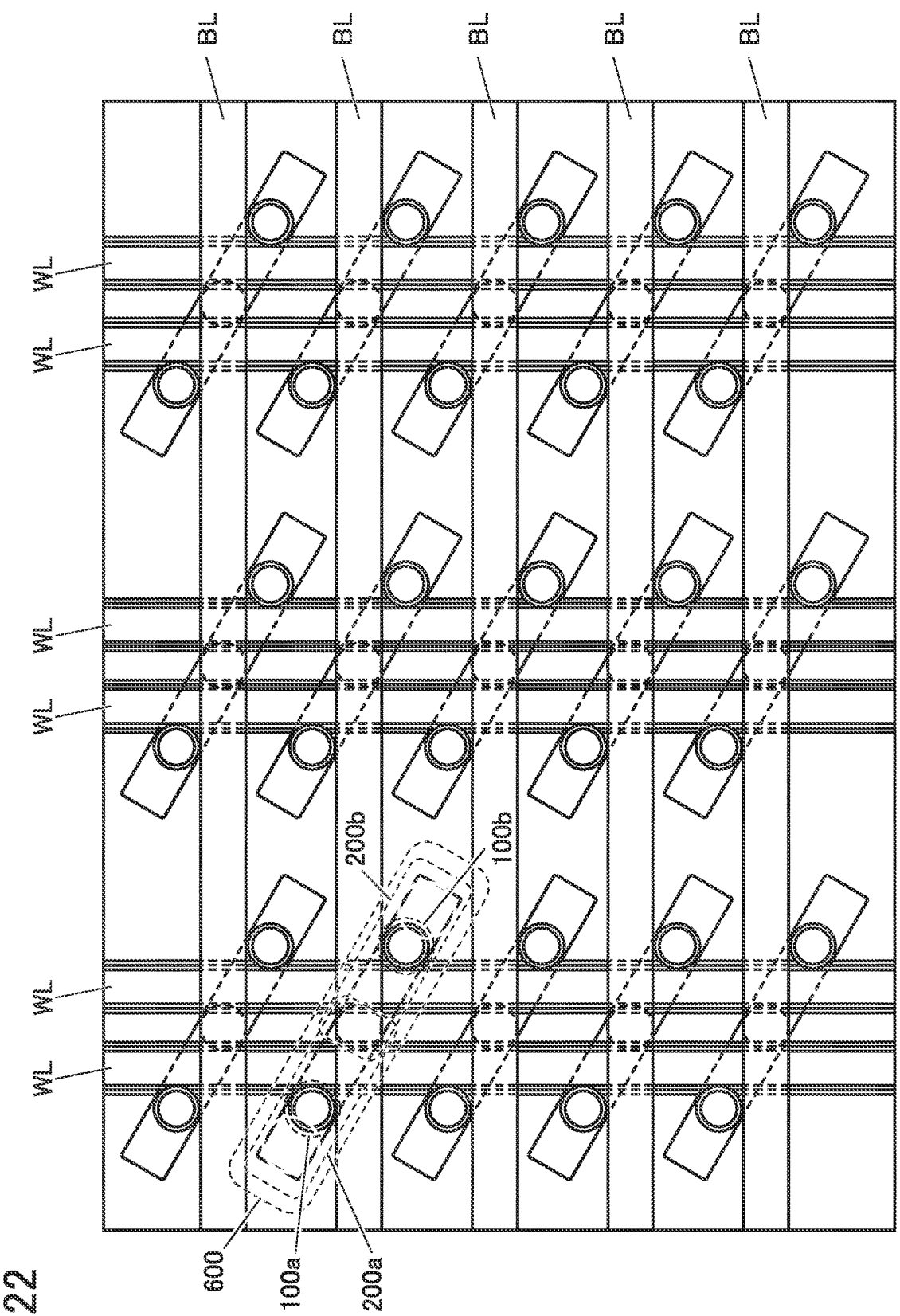
FIG. 22 is a top view of a semiconductor device of one embodiment of the present invention.
Figure 23:
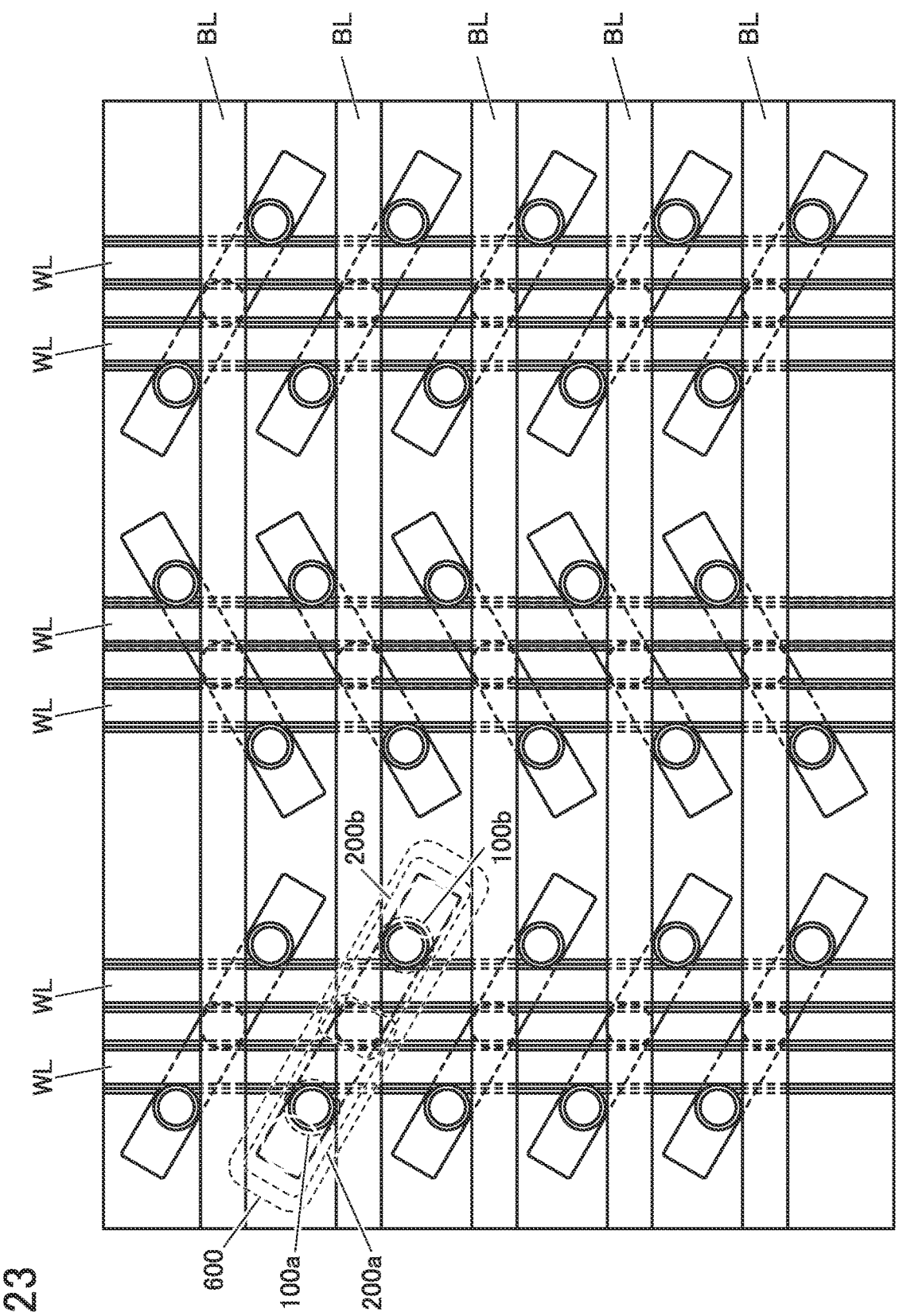
FIG. 23 is a top view of a semiconductor device of one embodiment of the present invention.
Figure 24:
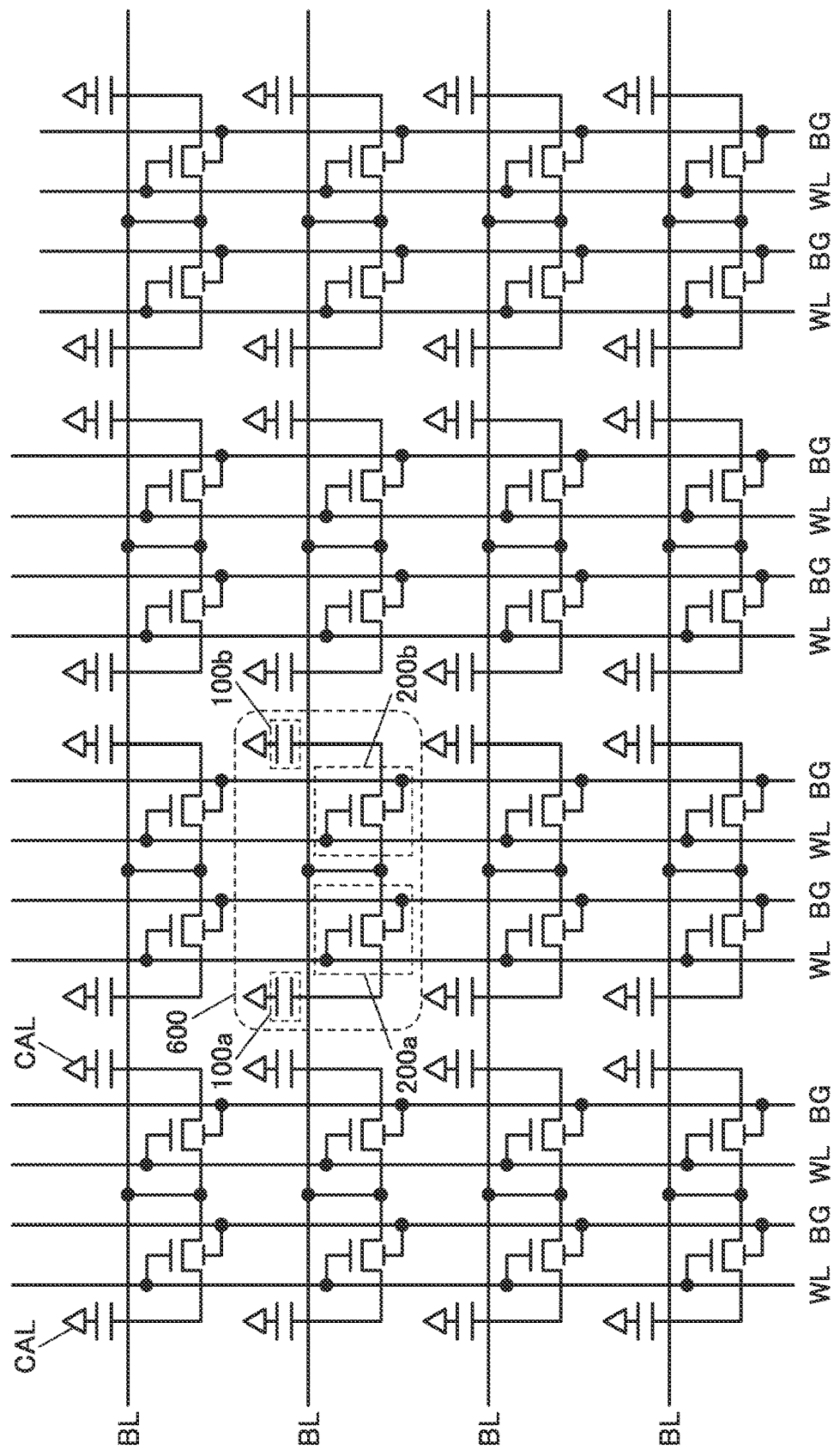
FIG. 24 is a circuit diagram of a semiconductor device of one embodiment of the present invention.

FIG. 22 and FIG. 23 illustrate top views of the layout examples of the memory cell 600, and FIG. 24 shows a circuit structure example of a memory cell of a DRAM. In this specification and the like, a DRAM using a memory cell including one OS transistor and one capacitor is referred to as DOSRAM (Dynamic Oxide Semiconductor Random Access Memory) in some cases. The memory cell 600 shown in FIG. 22 to FIG. 24 includes two memory cells; one includes the transistor 200a and the capacitor 100a, and the other includes the transistor 200b and the capacitor 100b. Note that the transistor 200a and the transistor 200b each include a gate (also referred to as a front gate in some cases) and a back gate. The memory cells 600 arranged in a matrix form a memory cell array.

In an example of each of the memory cell arrays shown in FIG. 22 and FIG. 23, an angle between the channel length directions of the transistor 200a and the transistor 200b included in the memory cell 600 (also referred to as a long axis direction of the oxide 230a or a direction in which the conductor 240a, the conductor 240b, and the conductor 240c are connected) and a direction in which the wiring BL extends is greater than 0 and smaller than 90°. At this time, the angle between the channel length directions of the transistor 200a and the transistor 200b and the direction in which a wiring WL extends is greater than 0 and smaller than 90°. In other words, the channel length directions of the transistor 200a and the transistor 200b are not parallel or orthogonal to any directions in which the wiring BL and the wiring WL extend.

FIG. 22 shows an example in which the channel length directions of the transistors 200a and the transistors 200b in all of the memory cells 600 in the memory cell array are parallel to one another; however, this embodiment is not limited thereto. As shown in FIG. 23, in the memory cell array, the channel length directions of the transistor 200a and the transistor 200b included in at least one memory cell 600 may be different from the channel length directions of the transistors 200a and the transistors 200b included in other memory cells 600. FIG. 23 shows an example in which the channel length directions of the transistors 200a and the transistors 200b included in the memory cells 600 are different column by column. In particular, the memory cells 600 adjacent to each other in the row direction are arranged axisymmetrically with respect to the column direction, that is, the direction in which the wiring WL extends.

A first terminal of the transistor 200a is connected to a first terminal of the capacitor 100a, a first terminal of the transistor 200b is connected to a first terminal of the capacitor 100b, a second terminal of the transistor 200a and a second terminal of the transistor 200b are connected to the wiring BL, the gate of the transistor 200a and the gate of the transistor 200b are connected to different wirings WL, and the back gate of the transistor 200a and the back gate of the transistor 200b are connected to different wirings BG. Each of a second terminal of the capacitor 100a and a second terminal of the capacitor 100b is connected to the wiring CAL. Note that the first terminal of the transistor 200 functions as one of the source and the drain, and the second terminal functions as the other of the source and the drain.

Here, the second terminal of the capacitor 100a and the second terminal of the capacitor 100b may be electrically connected to a common wiring CAL or may be electrically connected to different wirings CAL. In the case where the second terminal of the capacitor 100a and the second terminal of the capacitor 100b are electrically connected to the different wirings CAL, potentials equal to each other or different potentials may be supplied to the wirings CAL.

The wiring BL functions as a bit line, and the wiring WL functions as a word line. The wiring CAL functions as a wiring for applying a predetermined potential to the second terminal of the capacitor 100a and the second terminal of the capacitor 100b. In the time of data writing and data reading, a low-level potential is preferably applied to the wiring CAL. The wiring BG functions as a wiring for applying a potential to the back gate of the transistor 200a or the transistor 200b. By applying a given potential to the wiring BG, the threshold voltage of the transistor 200a or the transistor 200b can be increased or decreased.

Note that the memory cell 600 is not limited to that illustrated in FIG. 24 and can have a different circuit structure. For example, the memory cell 600 may be a memory cell in which the transistor 200a and the transistor 200b are transistors that do not include back gates. At this time, the wirings BG can be omitted. The circuit structure can be selected as appropriate in accordance with the characteristics required for the memory cell or the memory cell array.

When OS transistors are used as the transistor 200a and the transistor 200b included in the memory cell 600, the leakage current of the transistor 200a and the transistor 200b can be very low. That is, with the use of the transistor 200a and the transistor 200b, written data can be retained for a long time; thus, the frequency of refresh operations of the memory cell can be reduced. In addition, refresh operation for the memory cell can be omitted. In addition, extremely low leakage current allows multi-level data or analog data to be retained in the memory cell 600.

<Modification Example of Memory Cell 600>

Although an example in which the memory cell 600 includes two transistors and two capacitors is described above, this embodiment is not limited thereto. The memory cell 600 may include one transistor and one capacitor. The memory cell 600 may include three or more transistors and three or more capacitors.

In the case where the memory cell 600 includes one transistor and one capacitor, the transistor 200 shown in FIG. 19A to FIG. 19D can be used as the memory cell 600. The conductor 246 functioning as a bit line is electrically connected to the conductor 240a of the transistor 200 shown in FIG. 19A to FIG. 19D, and the capacitor 100 is electrically connected to the conductor 240b through the conductor 247, whereby the memory cell can be formed.

Figure 25:
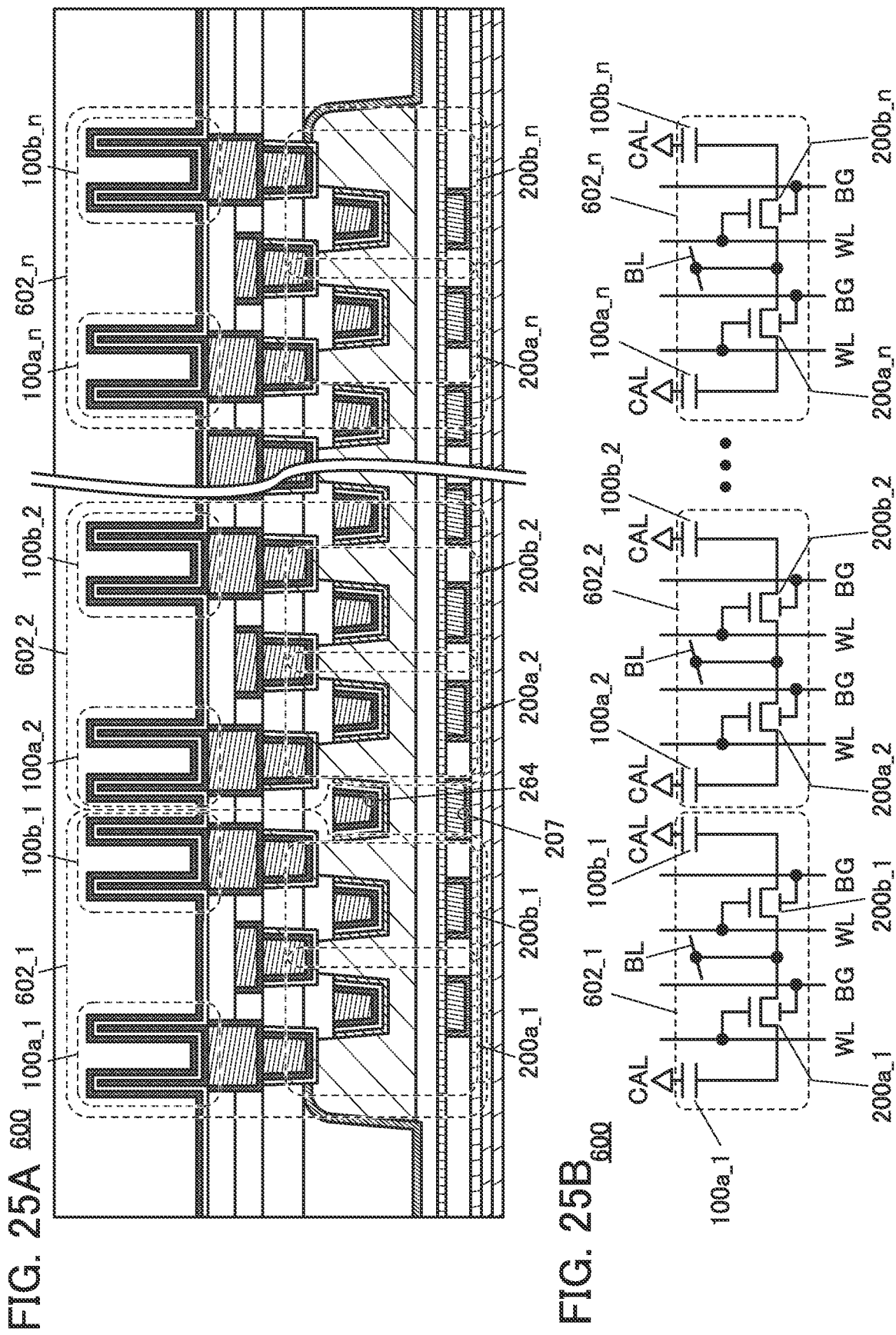
FIG. 25A is a cross-sectional view of a semiconductor device of one embodiment of the present invention.
FIG. 25B is a circuit diagram of the semiconductor device of one embodiment of the present invention.

FIG. 25A and FIG. 25B show an example in which the memory cell 600 includes three or more transistors and three or more capacitors. The memory cell 600 shown in FIG. 25A and FIG. 25B includes the transistors 200a, the transistors 200b, the capacitors 100a, and the capacitors 100b. The pair of the transistor 200a and the transistor 200b between which the wiring BL is interposed and the capacitor 100a and the capacitor 100b electrically connected to the transistor 200a and the transistor 200b, respectively, are collectively referred to as a memory unit 602. The memory cell 600 shown in FIG. 25A and FIG. 25B includes n memory units (a memory unit 6021 to a memory unit 602_n) (n is an integer of 2 or more). The memory unit 602_1 to the memory unit 602_n each include the transistor 200a, the transistor 200b, the capacitor 100a, and the capacitor 100b (the transistor 200a_1 to the transistor 200a_n, the transistor 200b_1 to the transistor 200b_n, the capacitor 100a_1 to the capacitor 100a_n, and the capacitor 100b_1 to the capacitor 100b_n). That is, the memory cell 600 shown in FIG. 25A and FIG. 25B includes 2n transistors 200 and 2n capacitors 100.

The transistor 200a and the transistor 200b included in each of the memory units 602 are electrically connected to the common wiring BL. The memory units 602 may be electrically connected to the common wiring BL or may be electrically connected to the wirings BL electrically independent from each other.

A conductor 207 and a conductor 264 are preferably provided between the memory units 602. By controlling a voltage applied to the conductor 207 and the conductor 264, a current flowing between the adjacent memory units 602 in the memory cell 600 (also referred to as a leakage current) can be inhibited. The conductor 207 and the conductor 264 can be formed in steps of manufacturing the conductor 205 and the conductor 260.

<Structure Example of Memory Device>

Figure 26:
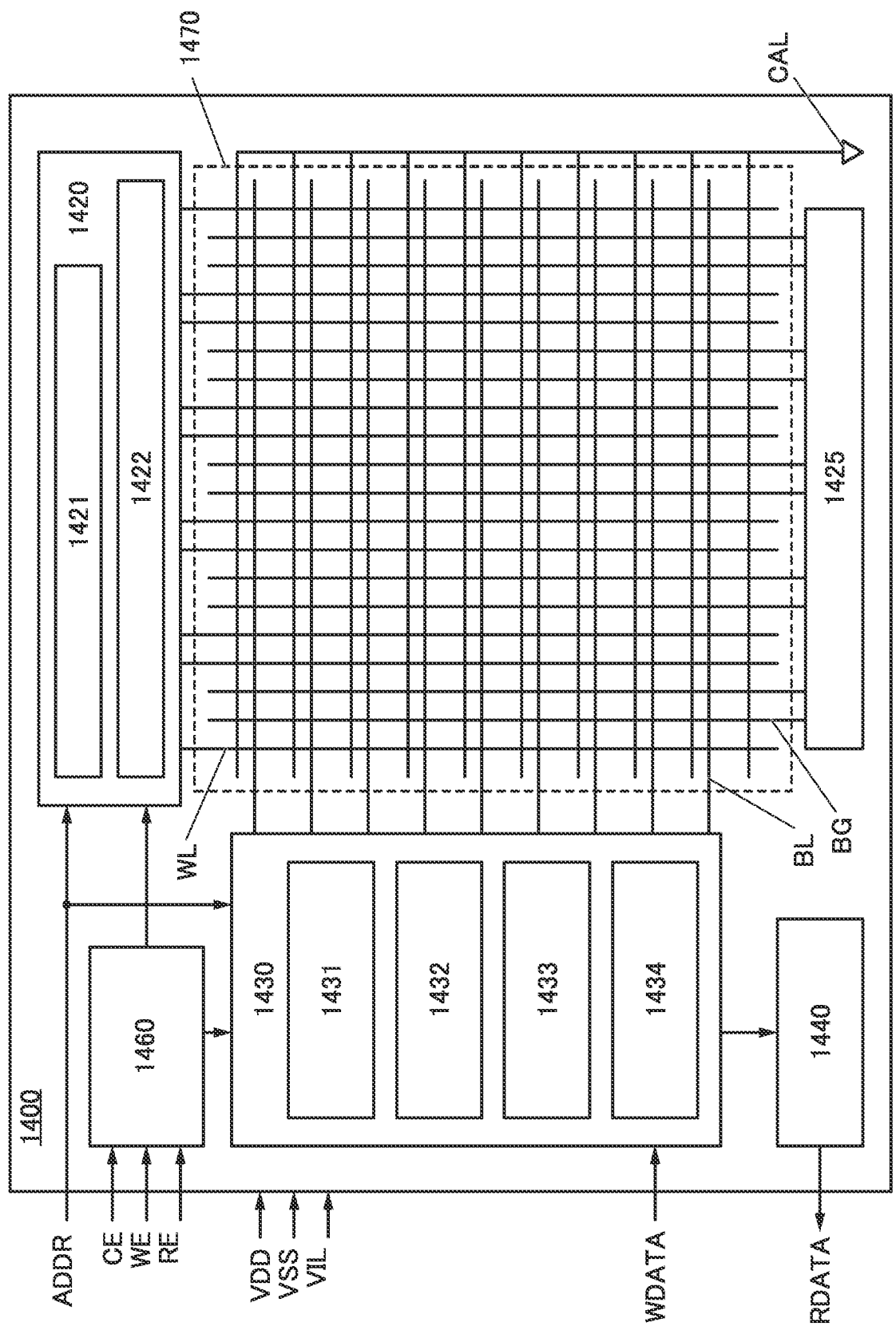
FIG. 26 is a block diagram showing a structure example of a semiconductor device of one embodiment of the present invention.

FIG. 26 shows an example of the structure of an OS memory device. A memory device 1400 includes a memory cell array 1470 and a peripheral circuit. The peripheral circuit includes a row circuit 1420, a column circuit 1430, an output circuit 1440, and a control logic circuit 1460. Furthermore, a back gate control circuit 1425 that controls a potential applied to the back gate of the transistor 200 may be provided in the peripheral circuit. The back gate control circuit 1425 can be regarded as part of the row circuit 1420.

The column circuit 1430 includes, for example, a column decoder 1431, a precharge circuit 1432, a sense amplifier 1433, a write circuit 1434, and the like. The precharge circuit 1432 has a function of precharging a wiring. The sense amplifier 1433 has a function of amplifying a data signal read from a memory cell. Note that the wirings are connected to the memory cell included in the memory cell array 1470. The amplified data signal is output as a data signal RDATA to the outside of the memory device 1400 through the output circuit 1440. The row circuit 1420 includes, for example, a row decoder 1421 and a word line driver circuit 1422, and can select a row to be accessed.

As power supply voltages from the outside, a low power supply voltage (VSS), a high power supply voltage (VDD) for the peripheral circuit, and a high power supply voltage (VIL) for the memory cell array 1470 are supplied to the memory device 1400. Control signals (CE, WE, and RE), an address signal ADDR, and a data signal WDATA are also input to the memory device 1400 from the outside. The address signal ADDR is input to the row decoder 1421 and the column decoder 1431, and WDATA is input to the writing circuit 1434.

The control logic circuit 1460 processes the signals (CE, WE, and RE) input from the outside, and generates control signals for the row decoder and the column decoder. CE is a chip enable signal, WE is a write enable signal, and RE is a read enable signal. Signals processed by the control logic circuit 1460 are not limited thereto, and other control signals are input as necessary.

The memory cell array 1470 includes a plurality of memory cells 600 arranged in a matrix and a plurality of wirings. Note that the number of the wirings that connect the memory cell array 1470 to the row circuit 1420 depends on the structure of the memory cell 600, the number of the memory cells 600 in a column, and the like. The number of the wirings that connect the memory cell array 1470 to the column circuit 1430 depends on the structure of the memory cell 600, the number of the memory cells 600 in a row, and the like.

Note that FIG. 26 shows an example in which the memory cell array 1470 and the peripheral circuit are formed on the same plane; however, this embodiment is not limited thereto. For example, the memory cell array 1470 may be provided over the peripheral circuit or at least part thereof to overlap with the peripheral circuit or at least part thereof. At this time, the peripheral circuit or at least part thereof preferably includes an OS transistor including an oxide semiconductor or a silicon transistor. That is, a structure in which an OS transistor is stacked over an OS transistor or a structure in which an OS transistor is stacked over a silicon transistor is preferable. For example, a structure may be employed in which the memory cell array 1470 including an OS transistor is stacked over a sense amplifier including a silicon transistor so that the sense amplifier and the memory cell array 1470 overlap with each other.

Figure 27:
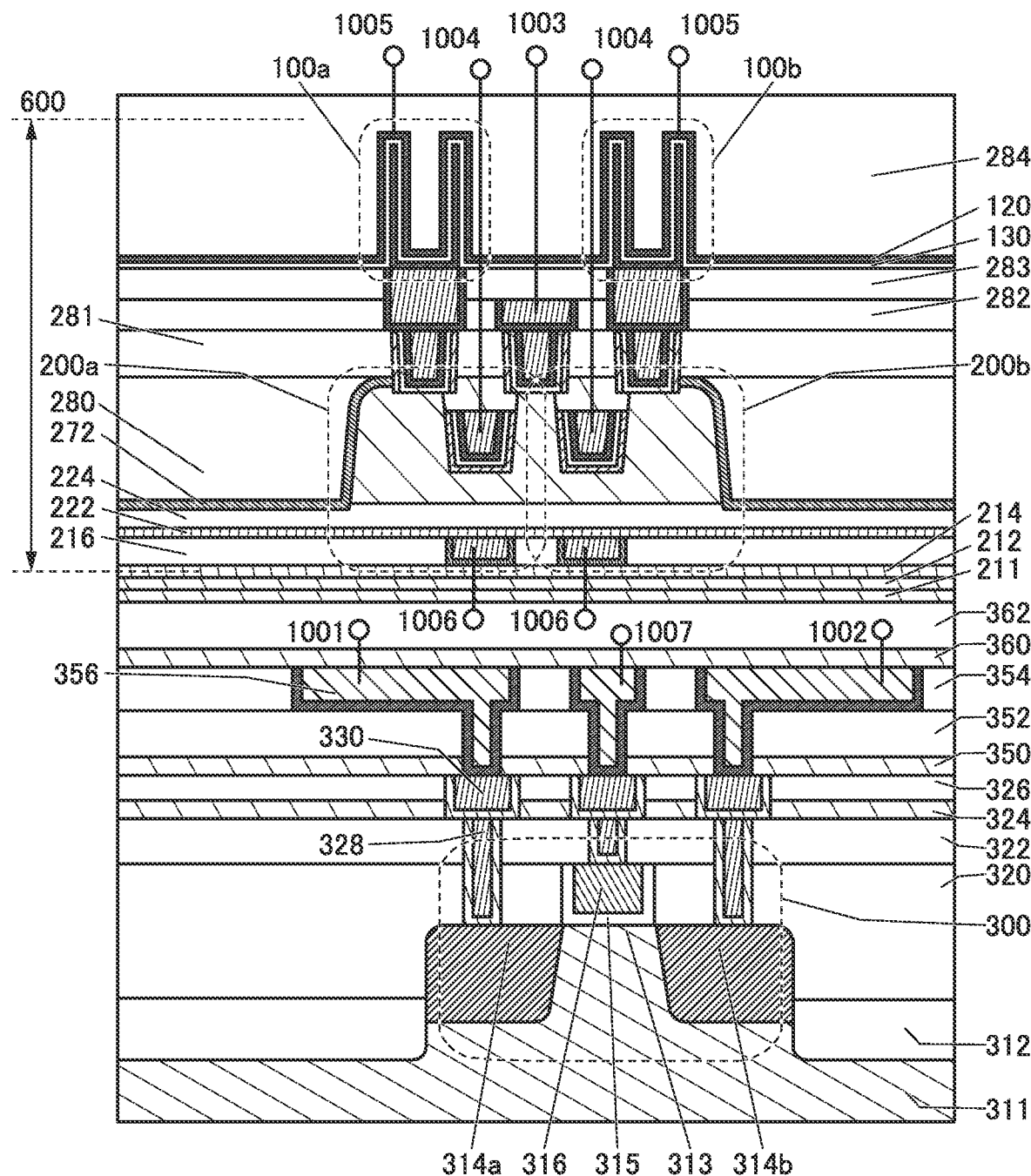
FIG. 27 is a cross-sectional view of a semiconductor device of one embodiment of the present invention.

FIG. 27 shows an example in which the memory cell 600 including the transistor 200 and the capacitor 100 is provided over a transistor 300. The memory cell 600 can be regarded as part of the memory cell array 1470, and the transistor 300 can be regarded as part of the peripheral circuit, for example, part of the sense amplifier.

In the semiconductor device shown in FIG. 27, a wiring 1001 is electrically connected to a source of the transistor 300, a wiring 1002 is electrically connected to a drain of the transistor 300, and a wiring 1007 is electrically connected to a gate of the transistor 300. In addition, a wiring 1003 is electrically connected to one of the source and the drain of the transistor 200, a wiring 1004 is electrically connected to the first gate of the transistor 200, and a wiring 1006 is electrically connected to the second gate of the transistor 200. The other of the source and the drain of the transistor 200 is electrically connected to one electrode of the capacitor 100, and a wiring 1005 is electrically connected to the other electrode of the capacitor 100. The wiring 1003 may be electrically connected to the wiring 1001, the wiring 1002, or the wiring 1007.

[Transistor 300]

The transistor 300 is provided over a substrate 311 and includes a conductor 316 functioning as the gate electrode, an insulator 315 functioning as a gate insulator, a semiconductor region 313 that is part of the substrate 311, and a low-resistance region 314a and a low-resistance region 314b functioning as a source region and a drain region.

Here, the insulator 315 is positioned over the semiconductor region 313, and the conductor 316 is positioned over the insulator 315. The transistors 300 formed in the same layer are electrically isolated from one another by an insulator 312 functioning as an element isolation insulating layer. The insulator 312 can be formed using an insulator similar to an insulator 326 or the like described later. The transistor 300 may be a p-channel transistor or an n-channel transistor.

In the substrate 311, a region of the semiconductor region 313 where a channel is formed, a region in the vicinity thereof, the low-resistance region 314a and the low-resistance region 314b functioning as the source region and the drain region, and the like preferably contain a semiconductor such as a silicon-based semiconductor, further preferably single crystal silicon. Alternatively, the regions may be formed using a material containing Ge (germanium), SiGe (silicon germanium), GaAs (gallium arsenide), GaAlAs (gallium aluminum arsenide), or the like. A structure may be employed in which silicon whose effective mass is controlled by applying stress to the crystal lattice and changing the lattice spacing is used. Alternatively, the transistor 300 may be an HEMT (High Electron Mobility Transistor) with the use of GaAs and GaAlAs, or the like.

The low-resistance region 314a and the low-resistance region 314b contain an element which imparts n-type conductivity, such as arsenic or phosphorus, or an element which imparts p-type conductivity, such as boron, in addition to the semiconductor material used for the semiconductor region 313.

For the conductor 316 functioning as a gate electrode, a semiconductor material such as silicon containing the element which imparts n-type conductivity, such as arsenic or phosphorus, or the element which imparts p-type conductivity, such as boron, or a conductive material such as a metal material, an alloy material, or a metal oxide material can be used.

Note that the work function depends on a material of the conductor; thus, the threshold voltage can be adjusted by changing the material of the conductor. Specifically, it is preferable to use a material such as titanium nitride or tantalum nitride for the conductor. Moreover, in order to ensure both conductivity and embeddability, it is preferable to use stacked layers of metal materials such as tungsten and aluminum for the conductor, and it is particularly preferable to use tungsten in terms of heat resistance.

Here, in the transistor 300 shown in FIG. 27, the semiconductor region 313 (part of the substrate 311) in which the channel is formed has a convex shape. In addition, the conductor 316 is provided to cover a side surface and a top surface of the semiconductor region 313 with the insulator 315 therebetween. Such a transistor 300 is also referred to as a FIN-type transistor because it utilizes a convex portion of a semiconductor substrate. Note that an insulator functioning as a mask for forming the convex portion may be included in contact with an upper portion of the convex portion. Furthermore, although the case where the convex portion is formed by processing part of the semiconductor substrate is described here, a semiconductor film having a convex shape may be formed by processing an SOI substrate.

Note that the transistor 300 shown in FIG. 27 is just an example and is not limited to having the structure shown therein; an appropriate transistor can be used in accordance with the circuit structure or the driving method.

As shown in FIG. 27, the semiconductor device includes a stack of the transistor 300 and the transistor 200. For example, the transistor 300 can be formed using a silicon-based semiconductor material, and the transistor 200 can be formed using an oxide semiconductor. Thus, in the semiconductor device shown in FIG. 27, a silicon-based semiconductor material and an oxide semiconductor can be used in different layers. The semiconductor device shown in FIG. 27 can be manufactured in a process similar to that employing a manufacturing apparatus that is used in the case of a silicon-based semiconductor material, and can be highly integrated.

[Wiring Layer]

Wiring layers provided with an interlayer film, a wiring, a plug, and the like may be provided between the components. In addition, a plurality of wiring layers can be provided in accordance with design. Here, a plurality of conductors functioning as plugs or wirings are collectively denoted by the same reference numeral in some cases. Furthermore, in this specification and the like, a wiring and a plug electrically connected to the wiring may be a single component. That is, there are cases where part of a conductor functions as a wiring and part of a conductor functions as a plug.

For example, an insulator 320, an insulator 322, an insulator 324, and the insulator 326 are sequentially stacked over the transistor 300 as interlayer films. In addition, a conductor 328, a conductor 330, and the like that are electrically connected to the wiring 1001, the wiring 1002, the wiring 1007, and the like are embedded in the insulator 320, the insulator 322, the insulator 324, and the insulator 326. Note that the conductor 328 and the conductor 330 function as a plug or a wiring.

The insulators functioning as interlayer films may also function as planarization films that cover uneven shapes therebelow. For example, the top surface of the insulator 322 may be planarized by planarization treatment using a CMP method or the like to increase the level of planarity.

A wiring layer may be provided over the insulator 326 and the conductor 330. For example, in FIG. 27, an insulator 350, an insulator 352, and an insulator 354 are stacked in this order. Furthermore, a conductor 356 is formed in the insulator 350, the insulator 352, and the insulator 354. The conductor 356 functions as a plug or a wiring. For example, as shown in FIG. 27, the conductor 356 can function as at least one of a wiring for connecting the wiring 1001 and the source of the transistor 300, a wiring for connecting the wiring 1002 and the drain of the transistor 300, and a wiring for connecting the wiring 1007 and the gate of the transistor 300.

An insulator 360 is positioned over the insulator 354, an insulator 362 is positioned over the insulator 360, the insulator 211 is positioned over the insulator 362, and the memory cell 600 is positioned.

In the case where the transistor 300 is used as part of the sense amplifier, a structure in which the wiring 1003 is connected to at least one or more of the wiring 1001, the wiring 1002, and the wiring 1007 may be employed. With such a structure, the length of a wiring connecting the transistor 200 and the transistor 300 can be shortened as compared with the case where the wiring is led over the transistor 200.

A wiring layer may be provided over the memory cell 600.

Examples of an insulator that can be used for an interlayer film include an insulating oxide, an insulating nitride, an insulating oxynitride, an insulating nitride oxide, an insulating metal oxide, an insulating metal oxynitride, and an insulating metal nitride oxide. For example, when a material with a low relative permittivity is used for the insulator functioning as an interlayer film, parasitic capacitance generated between wirings can be reduced. Thus, a material is preferably selected depending on the function of an insulator.

For example, for the insulator 320, the insulator 322, the insulator 326, the insulator 352, the insulator 354, the insulator 362, and the like, an insulator with low relative permittivity is preferably used. For example, the insulator preferably includes silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, a resin, or the like. Alternatively, the insulators preferably have a stacked-layer structure of a resin and silicon oxide, silicon oxynitride, silicon nitride oxide, silicon nitride, silicon oxide to which fluorine is added, silicon oxide to which carbon is added, silicon oxide to which carbon and nitrogen are added, or porous silicon oxide. When silicon oxide or silicon oxynitride, which is thermally stable, is combined with a resin, the stacked-layer structure can have thermal stability and a low relative permittivity. Examples of the resin include polyester, polyolefin, polyamide (e.g., nylon and aramid), polyimide, polycarbonate, and acrylic.

For the conductor that can be used as a wiring or a plug, a material containing one or more kinds of metal elements selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, and the like can be used. A semiconductor having high electrical conductivity, typified by polycrystalline silicon containing an impurity element such as phosphorus, or silicide such as nickel silicide may be used.

For example, for the conductor 328, the conductor 330, the conductor 356, or the like, a single layer or stacked layers of a conductive material such as a metal material, an alloy material, a metal nitride material, or a metal oxide material that is formed using the above material can be used. It is preferable to use a high-melting-point material that has both heat resistance and conductivity, such as tungsten or molybdenum, and it is preferable to use tungsten. Alternatively, a low-resistance conductive material such as aluminum or copper is preferably used. The use of a low-resistance conductive material can reduce wiring resistance.

The above is the description of the structure example. With the use of this structure, a semiconductor device using a transistor including an oxide semiconductor can be miniaturized or highly integrated. A change in electrical characteristics can be inhibited and reliability can be improved in a semiconductor device using a transistor including an oxide semiconductor. A transistor including an oxide semiconductor and having a high on-state current can be provided. A transistor including an oxide semiconductor and having a low off-state current can be provided. A semiconductor device with low power consumption can be provided.

Figure 28:
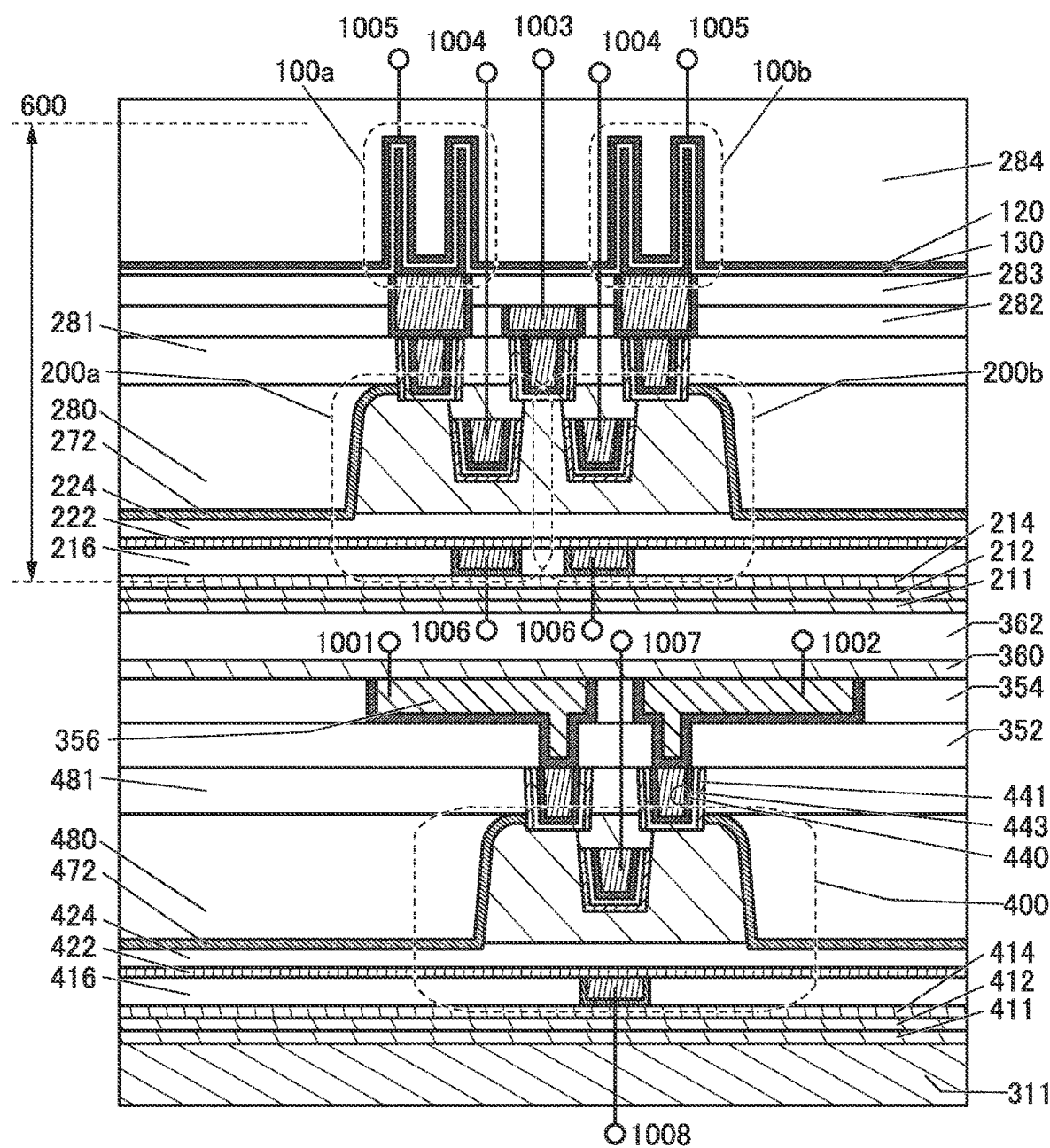
FIG. 28 is a cross-sectional view of a semiconductor device of one embodiment of the present invention.

Note that FIG. 27 shows an example in which the transistor 300 whose channel formation region is formed in the substrate 311 is provided; however, the semiconductor device described in this embodiment is not limited thereto. For example, as shown in FIG. 28, a transistor 400 including an oxide semiconductor may be provided under the transistor 200. The semiconductor device shown in FIG. 28 has a structure similar to that of the semiconductor device shown in FIG. 27 except that the transistor 400 is provided instead of the transistor 300.

Unlike the semiconductor device shown in FIG. 27, the semiconductor device shown in FIG. 28 includes, between the substrate 311 and the insulator 352, an insulator 411; an insulator 412; an insulator 414; an insulator 480; an insulator 481; the transistor 400 formed in these layers; an oxide 443 and a conductor 440 which are electrically connected to the transistor 400 and function as a plug; and an insulator 441 provided on a side surface of the oxide 443. The transistor 400 includes an insulator 416, an insulator 422, an insulator 424, and an insulator 472 as some of the components. Here, the insulator 411 corresponds to the insulator 211, the insulator 412 corresponds to the insulator 212, the insulator 414 corresponds to the insulator 214, the insulator 416 corresponds to the insulator 216, the insulator 422 corresponds to the insulator 222, the insulator 480 corresponds to the insulator 280, the insulator 481 corresponds to the insulator 281, the transistor 400 corresponds to the transistor 200, the oxide 443 corresponds to the oxide 243, the conductor 440 corresponds to the conductor 240, and the insulator 441 corresponds to the insulator 241. The insulator 416, the insulator 422, the insulator 424, and the insulator 472 correspond to the insulator 216, the insulator 222, the insulator 224, and the insulator 272, respectively.

That is, the transistor 400 and the layers including the transistor 400 have structures similar to those of the transistor 200 and the layers including the transistor 200. Therefore, for the details of the transistor 400 and the layers including the transistor 400, the above description can be referred to.

Note that the oxide 443, the conductor 440, and the insulator 441 are provided to be embedded in an opening formed in the insulator 481, the insulator 472, and the insulator 480. The oxide 443 and the conductor 440 function as a plug that connects the wiring 1001 and a source of the transistor 400 or a plug that connects the wiring 1002 and a drain of the transistor 400. The oxide 443 and the conductor 440 may be provided as a plug that connects the wiring 1007 and a gate of the transistor 400.

Furthermore, in the case where the memory cell array 1470 is provided to overlap with a sense amplifier, a bit line can be shortened. This reduces bit line capacity, which reduces the storage capacity of the memory cell.

Note that the structures of the peripheral circuit, the memory cell array 1470, and the like described in this embodiment are not limited to the above. The arrangement and functions of these circuits and the wirings, circuit components, and the like connected to the circuits can be changed, removed, or added as needed.

For example, in FIG. 24, the second terminal of the capacitor 100a and the second terminal of the capacitor 100b which are electrically connected to the wiring CAL may be connected to different wirings CAL or may be electrically connected to a common wiring CAL. For example, the second terminal of the capacitor 100a and the second terminal of the capacitor 100b may be formed of one conductor. The second terminals of the capacitors 100 included in the adjacent memory cells 600 may be connected to the different wirings CAL or may be electrically connected to a common wiring CAL.

According to one embodiment of the present invention, a semiconductor device that can be miniaturized or highly integrated can be provided. According to one embodiment of the present invention, a semiconductor device having favorable electrical characteristics can be provided. According to one embodiment of the present invention, a semiconductor device having favorable frequency characteristics can be provided. According to one embodiment of the present invention, a semiconductor device having favorable reliability can be provided. According to one embodiment of the present invention, a semiconductor device with high productivity can be provided.

A semiconductor device capable of retaining data for a long time can be provided. A semiconductor device capable of high-speed data writing can be provided. A semiconductor device having high design flexibility can be provided. A semiconductor device in which power consumption can be reduced can be provided. A novel semiconductor device can be provided.

As described above, the components, structures, methods, and the like described in this embodiment can be combined with any of the components, structures, methods, and the like described in the other embodiments as appropriate.

Embodiment 2

In this embodiment, an example of a chip 1200 on which the semiconductor device of the present invention is mounted is described with reference to FIG. 29A and FIG. 29B. A plurality of circuits (systems) are mounted on the chip 1200. The technique for integrating a plurality of circuits (systems) on one chip as described above is referred to as system on chip (SoC) in some cases.

Figure 29A:
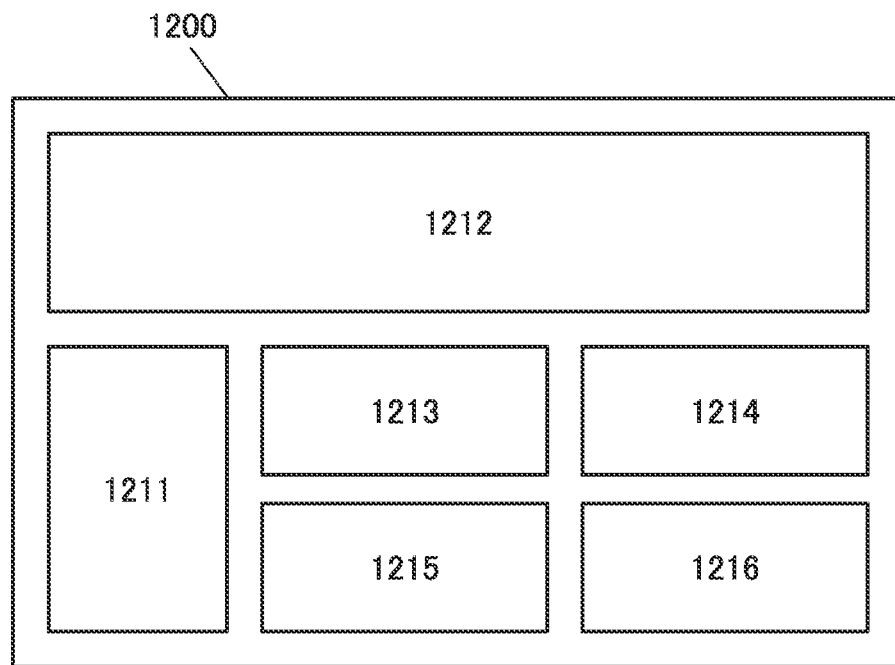
FIG. 29A is a block diagram showing a structure example of a semiconductor device of one embodiment of the present invention.

As shown in FIG. 29A, the chip 1200 includes a CPU 1211, a GPU 1212, one or more of analog arithmetic units 1213, one or more of memory controllers 1214, one or more of interfaces 1215, one or more of network circuits 1216, and the like.

Figure 29B:
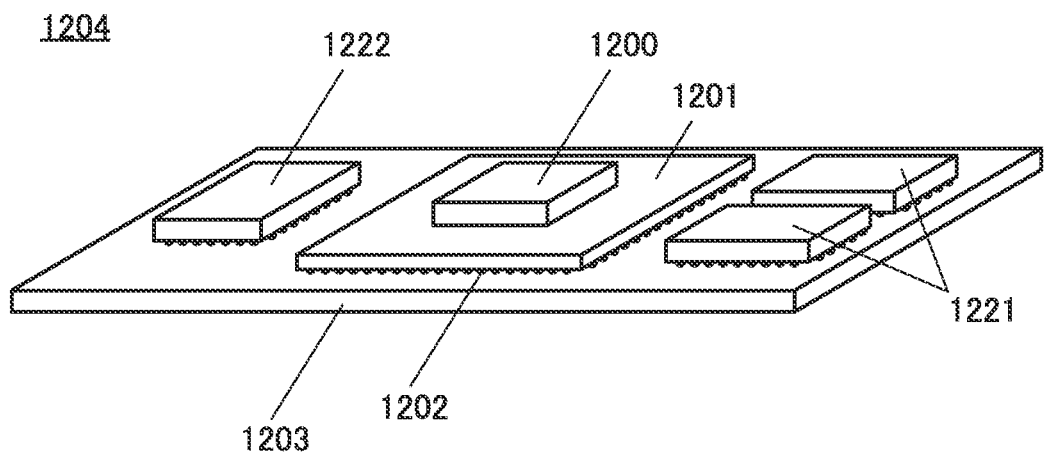
FIG. 29B is a perspective view of a semiconductor device of one embodiment of the present invention.

A bump (not illustrated) is provided on the chip 1200 and is connected to a first surface of a printed circuit board (PCB) 1201 as shown in FIG. 29B. A plurality of bumps 1202 are provided on the rear side of the first surface of the PCB 1201, and the PCB 1201 is connected to a motherboard 1203.

A memory device such as a DRAM 1221 or a flash memory 1222 may be provided over the motherboard 1203. For example, the DOSRAM described in the above embodiment can be used as the DRAM 1221. As described above, when a memory device including the memory cell 600 which is one embodiment of the present invention is used as a memory device, a semiconductor device capable of retaining data for along time can be provided. A semiconductor device capable of high-speed data writing can be provided. A semiconductor device having high design flexibility can be provided. A semiconductor device in which power consumption can be reduced can be provided.

The CPU 1211 preferably includes a plurality of CPU cores. Furthermore, the GPU 1212 preferably includes a plurality of GPU cores. The CPU 1211 and the GPU 1212 may each include a memory for storing data temporarily. Alternatively, a common memory for the CPU 1211 and the GPU 1212 may be provided in the chip 1200. The DOSRAM described above can be used as the memory. The GPU 1212 is suitable for parallel computation of a number of data and thus can be used for image processing or product-sum operation. When an image processing circuit or a product-sum operation circuit including an oxide semiconductor of the present invention is provided in the GPU 1212, image processing and product-sum operation can be performed with low power consumption.

Since the CPU 1211 and the GPU 1212 are provided in the same chip, a wiring between the CPU 1211 and the GPU 1212 can be shortened; accordingly, the data transfer from the CPU 1211 to the GPU 1212, the data transfer between the memories included in the CPU 1211 and the GPU 1212, and the transfer of arithmetic operation results from the GPU 1212 to the CPU 1211 after the arithmetic operation in the GPU 1212 can be performed at high speed.

The analog arithmetic unit 1213 includes one or both of an A/D (analog/digital) converter circuit and a D/A (digital/analog) converter circuit. The analog arithmetic unit 1213 may include the above-described product-sum operation circuit.

The memory controller 1214 includes a circuit functioning as a controller of the DRAM 1221 and a circuit functioning as the interface of the flash memory 1222.

The interface 1215 includes an interface circuit for an external connection device such as a display device, a speaker, a microphone, a camera, or a controller. Examples of the controller include a mouse, a keyboard, and a game controller. As such an interface, USB (Universal Serial Bus), HDMI (registered trademark) (High-Definition Multimedia Interface), or the like can be used.

The network circuit 1216 includes a network circuit such as a LAN (Local Area Network). The network circuit 1216 may include a circuit for network security.

The circuits (systems) can be formed in the chip 1200 in the same manufacturing process. Thus, even when the number of circuits needed for the chip 1200 is increased, there is no need to increase the number of steps in the manufacturing process; thus, the chip 1200 can be manufactured at low cost.

The motherboard 1203 provided with the PCB 1201 on which the chip 1200 including the GPU 1212 is mounted, the DRAM 1221, and the flash memory 1222 can be referred to as a GPU module 1204.

The GPU module 1204 includes the chip 1200 formed using the SoC technology, and thus can have a small size. Furthermore, the GPU module 1204 is excellent in image processing, and thus is suitably used in a portable electronic device such as a smartphone, a tablet terminal, a laptop PC, or a portable (mobile) game console. Furthermore, the product-sum operation circuit using the GPU 1212 can perform a method such as a deep neural network (DNN), a convolutional neural network (CNN), a recurrent neural network (RNN), an autoencoder, a deep Boltzmann machine (DBM), or a deep belief network (DBN); hence, the chip 1200 can be used as an AI chip or the GPU module 1204 can be used as an AI system module.

The structure described in this embodiment can be used in an appropriate combination with the structures described in the other embodiments and the like.

Embodiment 3

In this embodiment, examples of electronic components and electronic devices in which the memory device or the like described in the above embodiment is incorporated are described.

<Electronic Components>

First, examples of electronic components in which the memory device 720 is incorporated are described with reference to FIGS. 30A and 30B.

Figure 30A:
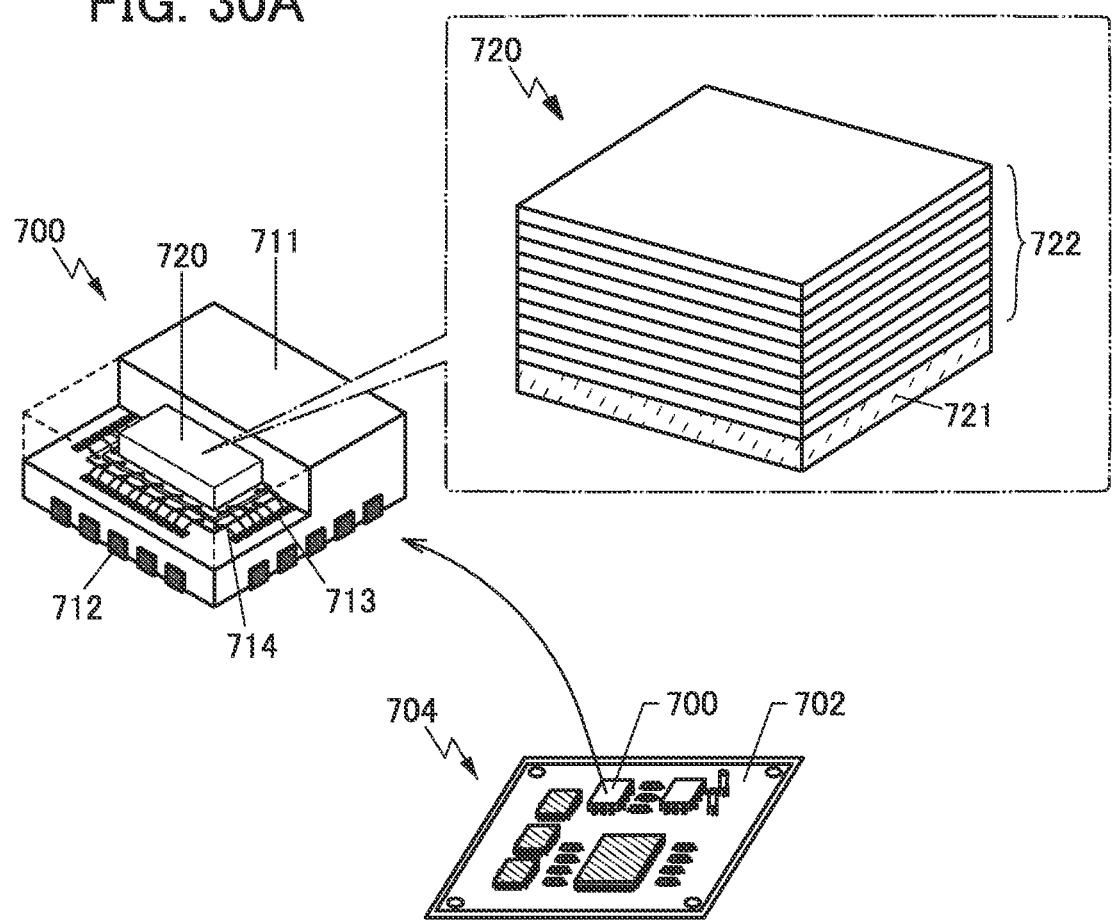
FIG. 30A and FIG. 30B are diagrams illustrating examples of electronic components.

FIG. 30A is a perspective view of an electronic component 700 and a substrate on which the electronic component 700 is mounted (a mounting board 704). The memory component 700 shown in FIG. 30A includes the memory device 720 in a mold 711. FIG. 30A omits part of the electronic component to show the inside of the electronic component 700. The electronic component 700 includes a land 712 outside the mold 711. The land 712 is electrically connected to an electrode pad 713, and the electrode pad 713 is electrically connected to the memory device 720 via a wire 714. The electronic component 700 is mounted on a printed circuit board 702, for example. A plurality of such an electronic component are combined and electrically connected to each other on the printed circuit board 702, whereby the mounting board 704 is completed.

The memory device 720 includes a driver circuit layer 721 and a memory circuit layer 722.

Figure 30B:
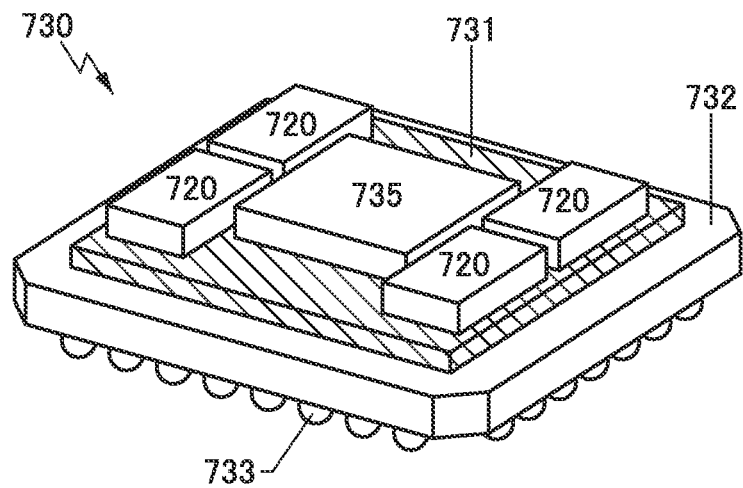

FIG. 30B is a perspective view of an electronic component 730. The electronic component 730 is an example of a SiP (System in package) or an MCM (Multi Chip Module). In the electronic component 730, an interposer 731 is provided on a package substrate 732 (a printed circuit board), and a semiconductor device 735 and a plurality of memory devices 720 are provided on the interposer 731.

The electronic component 730 using the memory devices 720 as high bandwidth memory (HBM) is shown as an example. An integrated circuit (a semiconductor device) such as a CPU, a GPU, or an FPGA can be used as the semiconductor device 735.

As the package substrate 732, a ceramic substrate, a plastic substrate, a glass epoxy substrate, or the like can be used. As the interposer 731, a silicon interposer, a resin interposer, or the like can be used.

The interposer 731 includes a plurality of wirings and has a function of electrically connecting a plurality of integrated circuits with different terminal pitches. The plurality of wirings are provided in a single layer or multiple layers. Moreover, the interposer 731 has a function of electrically connecting an integrated circuit provided on the interposer 731 to an electrode provided on the package substrate 732. Accordingly, the interposer is referred to as a "redistribution substrate" or an "intermediate substrate" in some cases. A through electrode may be provided in the interposer 731 and used for electrically connecting an integrated circuit and the package substrate 732. For a silicon interposer, a TSV (Through Silicon Via) can also be used as the through electrode.

A silicon interposer is preferably used as the interposer 731. A silicon interposer can be manufactured at lower cost than an integrated circuit because it is not necessary to provide an active element. Meanwhile, since wirings of a silicon interposer can be formed through a semiconductor process, formation of minute wirings, which is difficult for a resin interposer, is easy.

In order to achieve a wide memory bandwidth, many wirings need to be connected to HBM. Therefore, formation of minute and high-density wirings is required for an interposer on which HBM is mounted. For this reason, a silicon interposer is preferably used as the interposer on which HBM is mounted.

In a SiP, an MCM, or the like using a silicon interposer, the decrease in reliability due to a difference in expansion coefficient between an integrated circuit and the interposer does not easily occur. Furthermore, the surface of a silicon interposer has high planarity, so that a poor connection between the silicon interposer and an integrated circuit provided on the silicon interposer does not easily occur. It is particularly preferable to use a silicon interposer for a 2.5D package (2.5-dimensional mounting) in which a plurality of integrated circuits are arranged side by side on an interposer.

A heat sink (a radiator plate) may be provided to overlap the electronic component 730. In the case of providing a heat sink, the heights of integrated circuits provided on the interposer 731 are preferably equal to each other. For example, in the electronic component 730 described in this embodiment, the heights of the memory devices 720 and the semiconductor device 735 are preferably equal to each other.

To mount the electronic component 730 on another substrate, an electrode 733 may be provided on the bottom portion of the package substrate 732. FIG. 30B shows an example in which the electrode 733 is formed of a solder ball. Solder balls are provided in a matrix on the bottom portion of the package substrate 732, whereby BGA (Ball Grid Array) mounting can be achieved. Alternatively, the electrode 733 may be formed of a conductive pin. When conductive pins are provided in a matrix on the bottom portion of the package substrate 732, PGA (Pin Grid Array) mounting can be achieved.

The electronic component 730 can be mounted on another substrate by various mounting methods not limited to BGA and PGA. For example, a mounting method such as SPGA (Staggered Pin Grid Array), LGA (Land Grid Array), QFP (Quad Flat Package), QFJ (Quad Flat J-leaded package), or QFN (Quad Flat Non-leaded package) can be employed.

As described above, when the memory device including the memory cell 600 which is one embodiment of the present invention as the memory device 720 is used, a semiconductor device capable of retaining data for a long period can be provided. A semiconductor device capable of high-speed data writing can be provided. A semiconductor device having high design flexibility can be provided. A semiconductor device in which power consumption can be reduced can be provided.

This embodiment can be implemented in an appropriate combination with the structures described in the other embodiments and the like.

Embodiment 4

In this embodiment, application examples of the memory device using the semiconductor device described in the above embodiment are described. The semiconductor device described in the above embodiment can be applied to, for example, memory devices of a variety of electronic devices (e.g., information terminals, computers, smartphones, e-book readers, digital cameras (including video cameras), video recording/reproducing devices, and navigation systems). Here, the computers refer not only to tablet computers, notebook computers, and desktop computers, but also to large computers such as server systems. Alternatively, the semiconductor device described in the above embodiment is applied to removable memory devices such as memory cards (e.g., SD cards), USB memories, and SSDs (solid state drives). FIG. 31A to FIG. 31E schematically show some structure examples of removable memory devices. The semiconductor device described in the above embodiment is processed into a packaged memory chip and used in a variety of memory devices and removable memories, for example.

When the memory device including the memory cell 600 which is one embodiment of the present invention as a memory device is used, a semiconductor device capable of retaining data for a long period can be provided. A semiconductor device capable of high-speed data writing can be provided. A semiconductor device having high design flexibility can be provided. A semiconductor device in which power consumption can be reduced can be provided.

Figure 31A:
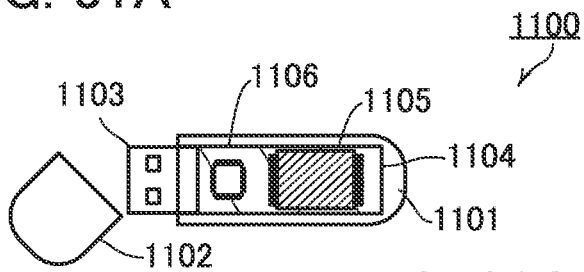
FIG. 31A to FIG. 31E are schematic views of memory devices of one embodiment of the present invention.

FIG. 31A is a schematic view of a USB memory. A USB memory 1100 includes a housing 1101, a cap 1102, a USB connector 1103, and a substrate 1104. The substrate 1104 is held in the housing 1101. For example, a memory chip 1105 and a controller chip 1106 are attached to the substrate 1104. The semiconductor device described in the above embodiment can be incorporated in the memory chip 1105 over the substrate 1104, or the like.

Figures 31B, 31C:
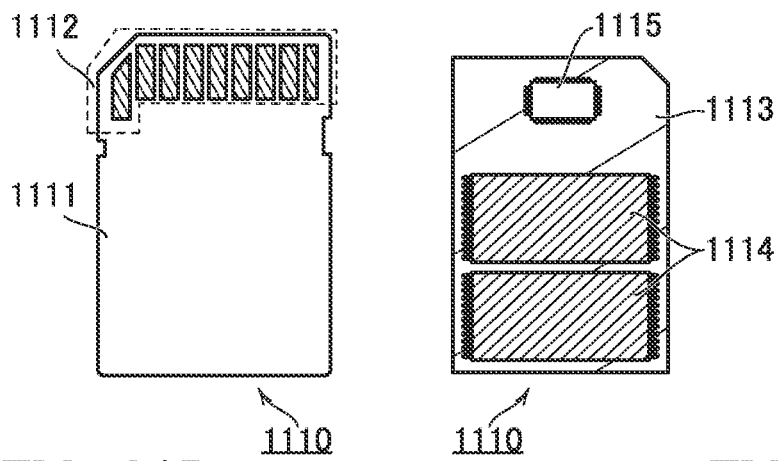

FIG. 31B is a schematic external view of an SD card, and FIG. 31C is a schematic view of the internal structure of the SD card. An SD card 1110 includes a housing 1111, a connector 1112, and a substrate 1113. The substrate 1113 is held in the housing 1111. For example, a memory chip 1114 and a controller chip 1115 are attached to the substrate 1113. When the memory chip 1114 is also provided on the rear surface side of the substrate 1113, the capacity of the SD card 1110 can be increased. In addition, a wireless chip with a radio communication function may be provided on the substrate 1113. With this, data can be read from and written in the memory chip 1114 by radio communication between a host device and the SD card 1110. The semiconductor device described in the above embodiment can be incorporated in the memory chip 1114 over the substrate 1113, or the like.

Figures 31D, 31E:
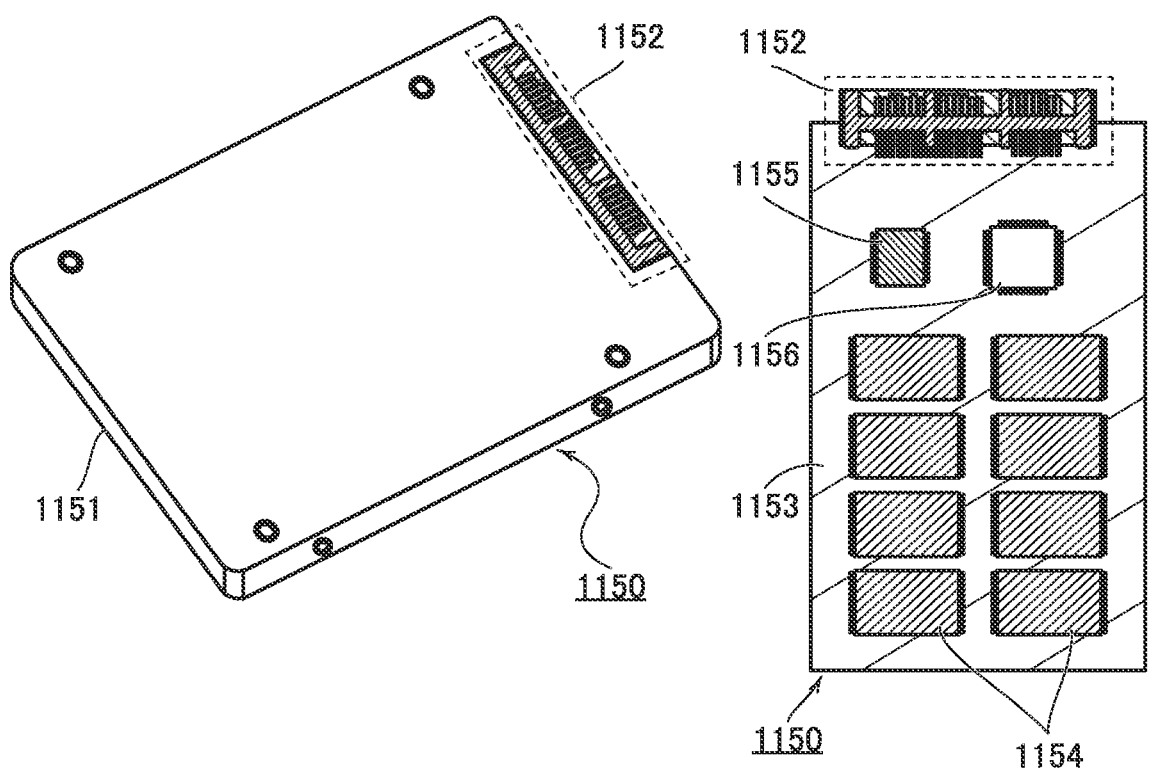

FIG. 31D is a schematic external view of an SSD, and FIG. 31E is a schematic view of the internal structure of the SSD. An SSD 1150 includes a housing 1151, a connector 1152, and a substrate 1153. The substrate 1153 is held in the housing 1151. For example, a memory chip 1154, a memory chip 1155, and a controller chip 1156 are attached to the substrate 1153. The memory chip 1155 is a work memory for the controller chip 1156, and a DOSRAM chip may be used, for example. When the memory chip 1154 is also provided on the rear surface side of the substrate 1153, the capacity of the SSD 1150 can be increased. The semiconductor device described in the above embodiment can be incorporated in the memory chip 1154 over the substrate 1153, or the like.

This embodiment can be implemented in an appropriate combination with the structures described in the other embodiments and the like.

Embodiment 5

The semiconductor device of one embodiment of the present invention can be used for a memory device, a processor such as a CPU or a GPU, or a chip. FIG. 32A to FIG. 32H show specific examples of electronic devices each including a memory device, a processor such as a CPU or a GPU, or a chip of one embodiment of the present invention <Electronic Devices and Systems>

The memory device, the processor, or the chip of one embodiment of the present invention can be mounted on a variety of electronic devices. Examples of electronic devices include a digital camera, a digital video camera, a digital photo frame, an e-book reader, a mobile phone, a portable game machine, a portable information terminal, and an audio reproducing device in addition to electronic devices provided with a relatively large screen, such as a television device, a monitor for a desktop or notebook information terminal or the like, digital signage, and a large game machine like a pachinko machine. In addition, when the memory device, the processor, or the chip of one embodiment of the present invention is provided in an electronic device, the electronic device can include artificial intelligence.

The electronic device of one embodiment of the present invention may include an antenna. When a signal is received by the antenna, a video, data, or the like can be displayed on the display portion. When the electronic device includes the antenna and a secondary battery, the antenna may be used for contactless power transmission.

The electronic device of one embodiment of the present invention may include a sensor (a sensor having a function of measuring force, displacement, position, speed, acceleration, angular velocity, rotational frequency, distance, light, liquid, magnetism, temperature, a chemical substance, sound, time, hardness, an electric field, current, voltage, power, radioactive rays, flow rate, humidity, a gradient, oscillation, odor, or infrared rays).

When the memory device including the memory cell 600 which is one embodiment of the present invention is used as a memory device, a semiconductor device capable of retaining data for along time can be provided. A semiconductor device capable of high-speed data writing can be provided. A semiconductor device having high design flexibility can be provided. A semiconductor device in which power consumption can be reduced can be provided.

The electronic device of one embodiment of the present invention can have a variety of functions. For example, the electronic device can have a function of displaying a variety of data (a still image, a moving image, a text image, and the like) on the display portion, a touch panel function, a function of displaying a calendar, date, time, and the like, a function of executing a variety of software (programs), a wireless communication function, and a function of reading out a program or data stored in a recording medium. FIG. 32A to FIG. 32H show examples of electronic devices.

[Information Terminal]

Figure 32A:
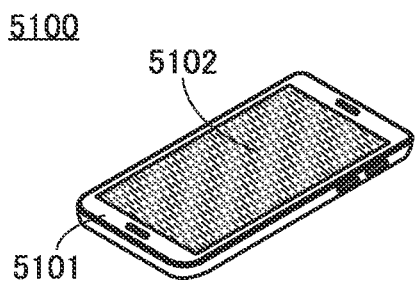
FIG. 32A to FIG. 32H are diagrams showing electronic devices of one embodiment of the present invention.

FIG. 32A illustrates a mobile phone (smartphone), which is a type of information terminal. An information terminal 5100 includes a housing 5101 and a display portion 5102. As input interfaces, a touch panel is provided in the display portion 5102 and a button is provided in the housing 5101.

When the memory device, the processor, or the chip of one embodiment of the present invention is applied to the information terminal 5100, the information terminal 5100 can execute an application utilizing artificial intelligence. Examples of the application utilizing artificial intelligence include an application for recognizing a conversation and displaying the content of the conversation on the display portion 5102; an application for recognizing letters, figures, and the like input to the touch panel of the display portion 5102 by a user and displaying them on the display portion 5102; and an application for performing biometric authentication using fingerprints, voice prints, or the like.

Figure 32B:
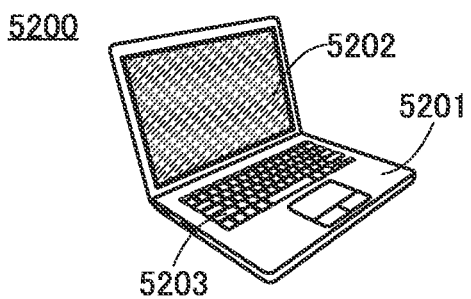

FIG. 32B illustrates a notebook information terminal 5200. The notebook information terminal 5200 includes a main body 5201 of the information terminal, a display portion 5202, and a keyboard 5203.

Like the information terminal 5100 described above, when the memory device, the processor, or the chip of one embodiment of the present invention is applied to the notebook information terminal 5200, the notebook information terminal 5200 can execute an application utilizing artificial intelligence. Examples of the application utilizing artificial intelligence include design-support software, text correction software, and software for automatic menu generation. Furthermore, with use of the notebook information terminal 5200, novel artificial intelligence can be developed.

Note that although FIG. 32A and FIG. 32B illustrate a smartphone and a notebook information terminal, respectively, as examples of the electronic device in the above description, an information terminal other than a smartphone and a notebook information terminal can be used. Examples of information terminals other than a smartphone and a notebook information terminal include a PDA (Personal Digital Assistant), a desktop information terminal, and a workstation.

[Game Machines]

Figure 32C:
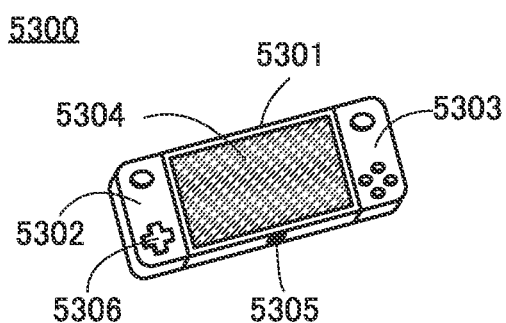

FIG. 32C shows a portable game machine 5300 as an example of a game machine. The portable game machine 5300 includes a housing 5301, a housing 5302, a housing 5303, a display portion 5304, a connection portion 5305, an operation key 5306, and the like. The housing 5302 and the housing 5303 can be detached from the housing 5301. When the connection portion 5305 provided in the housing 5301 is attached to another housing (not shown), an image to be output to the display portion 5304 can be output to another video device (not shown). In that case, the housing 5302 and the housing 5303 can each function as an operating unit. Thus, a plurality of players can perform a game at the same time. The memory device, the processor, or the chip described in the above embodiment can be incorporated into the memory device, the processor, the chip, or the like provided on a substrate in the housing 5301, the housing 5302 and the housing 5303.

Figure 32D:
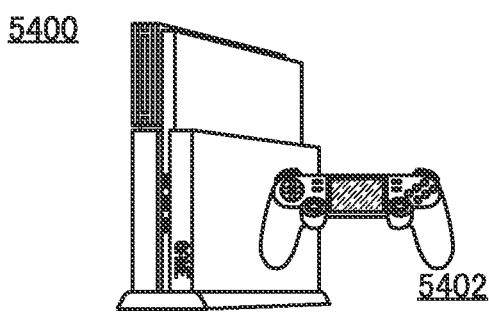

FIG. 32D shows a stationary game machine 5400 as an example of a game machine. A controller 5402 is wired or connected wirelessly to the stationary game machine 5400.

Using the memory device, the processor, or the chip of one embodiment of the present invention in a game machine such as the portable game machine 5300 and the stationary game machine 5400 achieves a low-power-consumption game machine. Moreover, heat generation from a circuit can be reduced owing to low power consumption; thus, the influence of heat generation on the circuit, a peripheral circuit, and a module can be reduced.

Furthermore, when the memory device, the processor, or the chip of one embodiment of the present invention is applied to the portable game machine 5300, the portable game machine 5300 including artificial intelligence can be achieved.

In general, the progress of a game, the actions and words of game characters, and expressions of an event and the like occurring in the game are determined by the program in the game; however, the use of artificial intelligence in the portable game machine 5300 enables expressions not limited by the game program. For example, questions posed by the player, the progress of the game, time, and actions and words of game characters can be changed for various expressions.

In addition, when a game requiring a plurality of players is played on the portable game machine 5300, the artificial intelligence can create a virtual game player; thus, the game can be played alone with the game player created by the artificial intelligence as an opponent.

Although the portable game machine and the stationary game machine are shown as examples of game machines in FIG. 32C and FIG. 32D, the game machine using the memory device, the processor, or the chip of one embodiment of the present invention is not limited thereto. Examples of the game machine to which the GPU or the chip of one embodiment of the present invention is applied include an arcade game machine installed in entertainment facilities (a game center, an amusement park, and the like), and a throwing machine for batting practice installed in sports facilities.

[Large Computer]

The memory device, the processor, or the chip of one embodiment of the present invention can be used in a large computer.

Figure 32E:
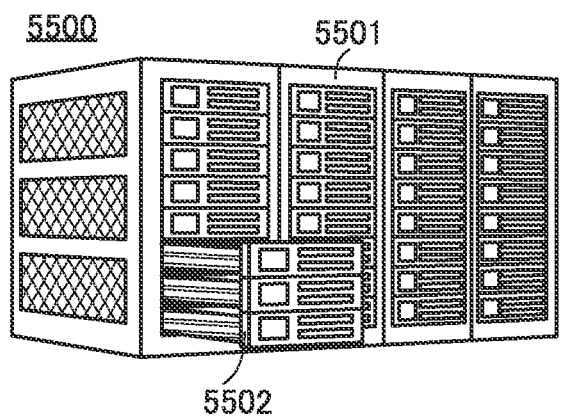
Figure 32F:
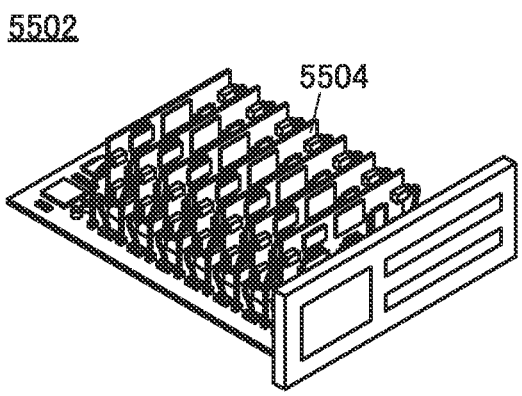

FIG. 32E shows a supercomputer 5500 as an example of a large computer. FIG. 32F shows a rack-mount computer 5502 included in the supercomputer 5500.

The supercomputer 5500 includes a rack 5501 and a plurality of rack-mount computers 5502. The plurality of computers 5502 are stored in the rack 5501. The computer 5502 includes a plurality of substrates 5504 on which the memory device, the processor, or the chip shown in the above embodiment can be mounted.

The supercomputer 5500 is a large computer mainly used for scientific computation. In scientific computation, an enormous amount of arithmetic operation needs to be processed at a high speed; hence, power consumption is large and chips generate a large amount of heat. Using the memory device, the processor, or the chip of one embodiment of the present invention in the supercomputer 5500 achieves a low-power-consumption supercomputer. Moreover, heat generation from a circuit can be reduced owing to low power consumption; thus, the influence of heat generation on the circuit, a peripheral circuit, and a module can be reduced.

Although a supercomputer is shown as an example of a large computer in FIG. 32E and FIG. 32F, a large computer using the memory device, the processor, or the chip of one embodiment of the present invention is not limited thereto. Other examples of large computers in which the memory device, the processor, or the chip of one embodiment of the present invention is usable include a computer that provides service (a server) and a large general-purpose computer (a mainframe).

[Moving Vehicle]

The memory device, the processor, or the chip of one embodiment of the present invention can be applied to an automobile, which is a moving vehicle, and the periphery of a driver's seat in the automobile.

Figure 32G:
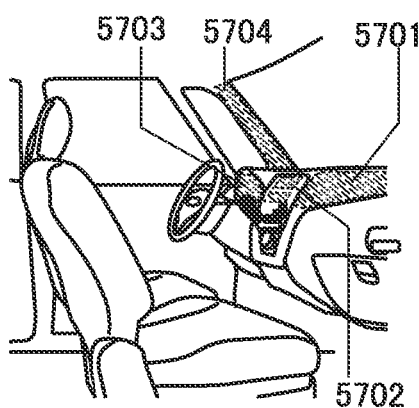

FIG. 32G shows an area around a windshield inside an automobile, which is an example of a moving vehicle. FIG. 32G illustrates a display panel 5701, a display panel 5702, and a display panel 5703 that are attached to a dashboard and a display panel 5704 that is attached to a pillar.

The display panel 5701 to the display panel 5703 can provide a variety of kinds of information by displaying a speedometer, a tachometer, mileage, a fuel gauge, a gear state, air-condition setting, and the like. The content, layout, or the like of the display on the display panels can be changed appropriately to suit the user's preferences, so that the design can be improved. The display panel 5701 to the display panel 5703 can also be used as lighting devices.

The display panel 5704 can compensate for view obstructed by the pillar (a blind spot) by showing an image taken by an imaging device (not shown) provided for the automobile. That is, displaying an image taken by the imaging device provided outside the automobile leads to compensation for the blind spot and an increase in safety. In addition, display of an image that complements the area that cannot be seen makes it possible to confirm safety more naturally and comfortably. The display panel 5704 can also be used as a lighting device.

Since the memory device, the processor, or the chip of one embodiment of the present invention can be applied to a component of artificial intelligence, the chip can be used for an automatic driving system of the automobile, for example. The chip can also be used for a system for navigation, risk prediction, or the like. The display panel 5701 to the display panel 5704 may display information regarding navigation, risk prediction, and the like.

Although an automobile is described above as an example of a moving vehicle, moving vehicles are not limited to an automobile. Examples of a moving vehicle include a train, a monorail train, a ship, and a flying object (a helicopter, an unmanned aircraft (a drone), an airplane, and a rocket), and these moving vehicles can include a system utilizing artificial intelligence when equipped with the memory device, the processor, or the chip of one embodiment of the present invention.

[Household Appliance]

Figure 32H:
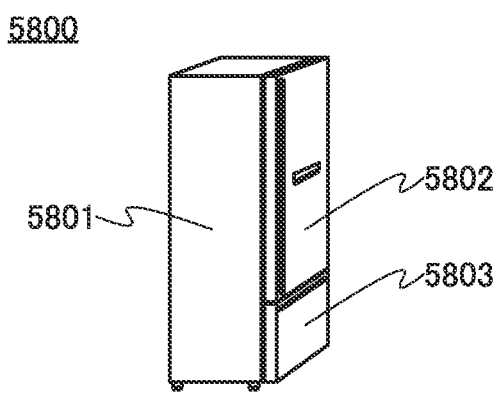

FIG. 32H shows an electric refrigerator-freezer 5800 as an example of a household appliance. The electric refrigerator-freezer 5800 includes a housing 5801, a refrigerator door 5802, a freezer door 5803, and the like.

When the memory device, the processor, or the chip of one embodiment of the present invention is applied to the electric refrigerator-freezer 5800, the electric refrigerator-freezer 5800 including artificial intelligence can be obtained. Utilizing the artificial intelligence enables the electric refrigerator-freezer 5800 to have a function of automatically making a menu based on foods stored in the electric refrigerator-freezer 5800 and the food expiration dates, for example, a function of automatically adjusting the temperature to be appropriate for the foods stored in the electric refrigerator-freezer 5800, and the like.

Although the electric refrigerator-freezer is described in this example as a household appliance, examples of other household appliances include a vacuum cleaner, a microwave oven, an electric oven, a rice cooker, a water heater, an IH cooker, a water server, a heating-cooling combination appliance such as an air conditioner, a washing machine, a drying machine, and an audio visual appliance.

The electronic device and the functions of the electronic device, the application example of the artificial intelligence and its effects, and the like described in this embodiment can be combined as appropriate with the description of another electronic device.

This embodiment can be implemented in an appropriate combination with the structures described in the other embodiments and the like.

REFERENCE NUMERALS

100: capacitor, 110: conductor, 120: conductor, 130: insulator, 200: transistor, 205: conductor, 207: conductor, 211: insulator, 212: insulator, 214: insulator, 216: insulator, 222: insulator, 224: insulator, 230: oxide, 232: mask, 240: conductor, 241: insulator, 243: oxide, 245: opening, 246: conductor, 247: conductor, 250: insulator, 260: conductor, 262: insulator, 264: conductor, 272: insulator, 280: insulator, 281: insulator, 282: insulator, 283: insulator, 284: insulator, 290: opening, 600: memory cell, 602: memory unit

The invention claimed is:

1. A semiconductor device comprising:
   a first oxide;
   an interlayer film over the first oxide;
   an insulator over the first oxide;
   a first conductor over the insulator;
   a second conductor electrically connected to the first oxide; and
   a second oxide provided between the first oxide and the second conductor,
   wherein the interlayer film comprises an opening,
   wherein the second oxide and the second conductor are provided in the opening, and
   wherein a contact area between the second oxide and the second conductor is larger than an area of a bottom surface of the opening.

2. The semiconductor device according to claim 1, wherein the first oxide comprises indium, an element M, and zinc, M being aluminum, gallium, yttrium, or tin.

3. The semiconductor device according to claim 1, wherein the second oxide comprises indium, an element M, and zinc, M being aluminum, gallium, yttrium, or tin.

4. The semiconductor device according to claim 1, wherein the second oxide comprises the same material as the first oxide.

5. The semiconductor device according to claim 1, wherein the second conductor is provided above the first conductor.

6. The semiconductor device according to claim 1, further comprising a capacitor,
   wherein the capacitor is electrically connected to the second conductor.

7. A semiconductor device comprising:
- a first oxide comprising an opening;
- a first insulator over the first oxide;
- a first conductor over the first insulator;
- a second insulator over the first insulator and the first conductor;
- a second conductor electrically connected to the first oxide; and
- a second oxide provided between the first oxide and the second conductor,
- wherein the first insulator, the first conductor, and the second insulator are provided in the opening, and
- wherein the second oxide comprises a region overlapping with the second insulator, and
- wherein the second oxide is in direct contact with a bottom surface and a side surface of the second conductor.

8. The semiconductor device according to claim 7, wherein the second oxide comprises indium, an element M, and zinc, M being aluminum, gallium, yttrium, or tin.

9. The semiconductor device according to claim 7, wherein the second oxide comprises the same material as the first oxide.

10. The semiconductor device according to claim 7, wherein the second conductor is provided above the first conductor.

11. The semiconductor device according to claim 7, further comprising an interlayer film over the first oxide,
- wherein the interlayer film comprises an opening,
- wherein the second oxide and the second conductor are provided in the opening, and
- wherein a contact area between the second oxide and the second conductor is larger than an area of a bottom surface of the opening.

12. The semiconductor device according to claim 7, further comprising a capacitor,
- wherein the capacitor is electrically connected to the second conductor.

* * * * *